US008436454B2

(12) United States Patent
Norman

(10) Patent No.: US 8,436,454 B2
(45) Date of Patent: May 7, 2013

(54) REPROGRAMMABLE CIRCUIT BOARD WITH ALIGNMENT-INSENSITIVE SUPPORT FOR MULTIPLE COMPONENT CONTACT TYPES

(76) Inventor: Richard Norman, Sutton (CA)

( * ) Notice: Subject to any disclaimer, the term of this patent is extended or adjusted under 35 U.S.C. 154(b) by 0 days.

(21) Appl. No.: 13/403,208

(22) Filed: Feb. 23, 2012

(65) Prior Publication Data
US 2012/0206889 A1 Aug. 16, 2012

Related U.S. Application Data

(62) Division of application No. 11/611,263, filed on Dec. 15, 2006, now Pat. No. 8,124,429.

(51) Int. Cl.
*H01L 25/00* (2006.01)

(52) U.S. Cl.
USPC .... 257/685; 257/415; 257/686; 257/E21.521; 257/E21.579; 257/E23.179

(58) Field of Classification Search .......... 257/415–418, 257/491, 685, 686, 797, E21.521, 579, 23.179
See application file for complete search history.

(56) References Cited

U.S. PATENT DOCUMENTS

| | | | |
|---|---|---|---|
| 3,486,160 A | 12/1969 | Wallace, Jr. | |
| 4,805,091 A | 2/1989 | Thiel et al. | |
| 5,264,664 A | 11/1993 | McAllister et al. | |
| 5,264,729 A | 11/1993 | Rostoker et al. | |
| 5,360,948 A | 11/1994 | Thornberg | |
| 5,368,217 A | 11/1994 | Simmons et al. | |
| 5,377,124 A | 12/1994 | Mohsen | |
| 5,426,738 A | 6/1995 | Hsieh et al. | |
| 5,428,750 A | 6/1995 | Hsieh et al. | |
| 5,490,042 A | 2/1996 | Perkins | |
| 5,544,069 A | 8/1996 | Mohsen | |
| 5,642,262 A | 6/1997 | Terrill et al. | |
| 5,661,409 A | 8/1997 | Mohsen | |
| 5,717,699 A | 2/1998 | Haag et al. | |
| 5,748,872 A | 5/1998 | Norman | |
| 5,801,715 A | 9/1998 | Norman | |
| 5,814,847 A | 9/1998 | Shihadeh et al. | |

(Continued)

FOREIGN PATENT DOCUMENTS

| | | |
|---|---|---|
| DE | 10130864 A1 | 1/2003 |
| EP | 0419232 | 3/1991 |

(Continued)

OTHER PUBLICATIONS

Banker, Jeffery. "Designing—ASICs for Use with Multichip Modules",ERIM (1992).

(Continued)

*Primary Examiner* — Michael Lebentritt
(74) *Attorney, Agent, or Firm* — Anglehart et al.

(57) ABSTRACT

The present invention is directed to a system that programmably interconnects integrated circuit chips and other components at near-intra-chip density. The system's contact structure allows it to adapt to components with a wide variety of contact spacings and interconnection requirements, the use of releasable attachment means allows component placement to be modified as needed, the system identifies the contacts and the components to facilitate specifying the inter-component connections, and the system provides signal conditioning and retiming to minimize issues with signal integrity and signal skew.

19 Claims, 26 Drawing Sheets

U.S. PATENT DOCUMENTS

| | | | |
|---|---|---|---|
| 5,815,275 | A | 9/1998 | Svetkoff et al. |
| 5,838,060 | A | 11/1998 | Comer |
| 5,843,799 | A | 12/1998 | Hsu et al. |
| 5,892,684 | A | 4/1999 | Chua |
| 5,917,229 | A | 6/1999 | Nathan et al. |
| 5,937,515 | A | 8/1999 | Johnson |
| 6,064,219 | A | 5/2000 | Aigner |
| 6,157,213 | A | 12/2000 | Voogel |
| 6,160,276 | A | 12/2000 | Mohsen |
| 6,242,923 | B1 | 6/2001 | Scaman et al. |
| 6,289,494 | B1 | 9/2001 | Sample et al. |
| 6,351,144 | B1 | 2/2002 | Shumarayev et al. |
| 6,502,221 | B1 | 12/2002 | Vogel et al. |
| 6,528,735 | B1 | 3/2003 | Bhatia et al. |
| 6,570,404 | B1 | 5/2003 | Norman et al. |
| 6,574,087 | B1 | 6/2003 | Honda et al. |
| 6,597,362 | B1 | 7/2003 | Norman |
| 6,642,064 | B1 | 11/2003 | Terrill et al. |
| 6,699,627 | B2 | 3/2004 | Smith et al. |
| 6,853,206 | B2 | 2/2005 | Hubner et al. |
| 6,879,170 | B2 | 4/2005 | Norman et al. |
| 6,906,303 | B1 | 6/2005 | Smith |
| 6,911,730 | B1 | 6/2005 | New |
| 6,914,275 | B2 | 7/2005 | Schoenfeld et al. |
| 6,928,606 | B2 | 8/2005 | Savaria et al. |
| 6,940,308 | B2 | 9/2005 | Wong |
| 7,055,123 | B1 | 5/2006 | Norman |
| 7,122,912 | B2 | 10/2006 | Matsui |
| 7,279,787 | B1 | 10/2007 | Norman et al. |
| 7,282,377 | B2 | 10/2007 | Muranaka |
| 7,665,049 | B2 | 2/2010 | Muranaka |
| 7,673,273 | B2 | 3/2010 | Madurawe et al. |
| 7,839,167 | B2 * | 11/2010 | Ngai et al. ............... 326/41 |
| 7,883,985 | B2 | 2/2011 | Matsui |
| 2002/0175398 | A1 | 11/2002 | Lan et al. |
| 2003/0122206 | A1 | 7/2003 | Bhattarai et al. |
| 2004/0053429 | A1 | 3/2004 | Muranaka |
| 2004/0104741 | A1 | 6/2004 | Cobbley et al. |
| 2004/0255096 | A1 | 12/2004 | Norman |
| 2005/0046002 | A1 | 3/2005 | Lee et al. |
| 2005/0237073 | A1 | 10/2005 | Miller et al. |
| 2006/0185429 | A1 | 8/2006 | Liu et al. |
| 2006/0187971 | A1 | 8/2006 | Lum et al. |
| 2008/0028349 | A1 | 1/2008 | Muranaka |

FOREIGN PATENT DOCUMENTS

| | | |
|---|---|---|
| EP | 0822740 | 2/1998 |
| JP | 2001217387 A | 8/2001 |
| JP | 2002076247 | 3/2002 |
| WO | WO03001597 | 1/2003 |

OTHER PUBLICATIONS

Dobbelaere I et al. "Field Programmable MCM Systems—Design of an Interconnection Frame" Proceedings of the International Symposiuim on Circuits and Systems, San Diego, May 10-13, 1992 vol. Conf 14,May 3, 1992, pp. 461-464 XPOO0340846.

Gruber, P.A. et al. "Low Cost Wafer Bumping", IBM J. Res. & Dev., vol. 49, No. 4/5 (2005).

ISR and Written Opinion of corresponding PCT patent application No. PCT/IB2007/054291.

Koh, G.H. et al. "PRAM Process Technology", ICICDT (1994).

Krusius, J. Peter et Che Yu U. "A Review of Electronic Packaging Research", Semiconductor International (Jul. 1995).

Kumagai, Kouichi et ~II. "Systems-in-Silicon Architecture and its Applications to H.264 Motion Estimation for 1 080/H DTV", ISSCC (Feb. 2006).

Lemme H. "Leiterplattenbestuckung Noch Praziser. OOptische Positionskorrektur Verringert Toleranzen" vol. 38, No. 23,Nov. 10, 1989, pp. 100-103 XPOOO073025.

Mirabedini, M.R. et al. "65 nm Transistors for a 90 nm CMOS SOC Platform", ESSDERC (Sep. 2002).

Miura, Noriyuki et al. "A 1 Tb/s 3W Inductive-Coupling Transreceiver for Inter-Chip Clock and Data Link", ISSCC (Feb. 2006).

Office action in corresponding CN patent application No. 200780046029.1.

Office action in corresponding UK patent application No. GB0911224.4.

Second Official Action of corresponding UK Patent application No. GB0911224.

* cited by examiner 712  722

REPROGRAMMABLE CIRCUIT BOARD WITH ALIGNMENT-INSENSITIVE SUPPORT FOR MULTIPLE COMPONENT CONTACT TYPES

CROSS-REFERENCE TO RELATED APPLICATIONS

This application is a divisional of U.S. application Ser. No. 11/611,263, filed Dec. 15, 2006, which is incorporated herein by reference in its entirety.

FIELD OF THE INVENTION

The present invention relates to connecting components, such as bare die and/or packaged integrated circuit chips. The invention also relates to tools and methods for prototyping multi-chip systems.

SUMMARY OF THE PRIOR ART

Integrated circuit chips are made through a complex lithographic process that builds up patterned layer upon patterned layer. Because circuits with finer lithographic features are denser and run faster than those with coarser features, feature size is pushed into the realm where defects are inevitable. To reduce the number of defects per square centimeter, only a small area of a wafer is exposed to the patterning at any given time so that the whole exposed area fits in the most accurately focused region near the center of focus. After exposure, this area contains the image of a mask that is held in what is called a reticle; therefore this area of the wafer is referred to as a reticle image (sometimes shortened to just a "reticle").

Even within the area of a reticle image, a leading edge lithography process will average several defects by the time all of the layers are completed. Since chips the size of a reticle image would thus be very likely to contain at least one defect, the yield of chips this size would be very low. Most chips are thus significantly smaller than a reticle so that the chip surrounding each defect can be thrown away at an acceptable cost in lost lithographed area. For example, if after the hundreds of steps required to lay down the dozens of lithographed layers required for a chip, a reticle-image-sized area averaged six defects, a reticle-sized chip would have a yield of roughly 2.5% (slightly higher than $\frac{1}{2}^6$ due to the clustering of defects), while a chip one-tenth the size of a reticle would have a yield of over 50%.

For chips containing large numbers of identical units, defect tolerance can be built in. Memory chips are the most repetitive common chips, and they also have vast arrays of very fine features which make them quite vulnerable to defects; therefore most commercial memory chips contain enough defect tolerance to get acceptable yields at areas of one to two square centimeters, which is still significantly less than the size of a reticle.

Logic chips are harder to apply defect tolerance to because they are typically much less repetitive than memory chips. However in cases where the logic is sufficiently repetitive, defect tolerance can be applied. Extremely efficient defect tolerance is described by the present applicant in U.S. Pat. No. 5,748,872 and U.S. Pat. No. 5,801,715, which are hereby incorporated in their entirety by reference.

However even though the defect tolerance described in these patents is sufficient to make reticle-size areas and even larger circuit areas with high yield, and even though the present applicant discloses, in U.S. Pat. No. 6,597,362 which is also hereby incorporated in its entirety by reference, a way of linking together circuitry lithographed in separate reticle images to allow circuits up to the size of a wafer, there are still a number of advantages in many cases to manufacturing parts of a system on separate chips.

First, as discussed above, some systems contain too much non-repetitive logic to make defect tolerance practical.

Second, most systems contain numerous commercially available chips as well as custom circuitry. Even if one were to accept the technical challenge of replicating those commercial chips in a wafer-scale system, one would still face intellectual property issues in manufacturing them. And commercial chips such as memory are often used in a huge variety of products and are thus made in massive volumes, achieving far higher economies of scale than any given product made with them.

Third, different types of chips are usually made on separate processes tuned for those types of chips. For example, memory chips typically contain more polysilicon layers and logic chips contain more metal layers, memory chips need high capacitance and low leakage while logic chips need high switching speed, analog chips are often not even made with CMOS (the mainstay of digital logic and memory) and radio frequency chips are often not even made on silicon.

But while there are thus good reasons for using separate chips in most products, this does not come without cost. While connections between circuits within a chip are on a micron scale, interconnecting circuits on separate chips typically uses a circuit board with millimeter-scale connections, requiring a bulky chip package to connect the chip to the circuit board. Driving these millimeter or larger scale connections also requires more power, and thus larger drive circuitry, especially since the long interconnections are driven in one shot and can suffer from interference caused by other signals.

Thus while a chip one centimeter square can easily have many tens of thousands of connections from one half to its other half, it will typically be limited to a few hundred or at most a thousand connections to other chips. Chip packaging is also an appreciable portion of the cost of a chip, and while circuit boards are generally less expensive in volume than the chips and other components that go on them, the cost of designing, prototyping and debugging a high-end circuit board can run into the hundreds of thousands of dollars.

Several attempts to overcome these issues have been made. Multi-chip Modules, or 'MCMs,' are basically circuit boards made out of ceramic or even silicon; these can have much finer wires than a fiber-glass circuit board (although still much coarser than on a chip), which allows increased density and power. MCMs also allow 'bare dies' (unpackaged chips) to be used, raising the total connectivity to up to 5000 connections per chip. However high-end MCMs cost even more to design and prototype than high-end circuit boards do.

Attempts to overcome the design, prototyping and debug costs of high-end circuit boards are also known in the art. The earliest circuit boards were generic in that the circuit components mounted on them had contact pins that extended through holes in the circuit board, and the interconnections were made by using a 'wire-wrap' gun to attach one end of a wire to a pin on one component and the other end to a pin on another component, thus making the connections by hand, as shown in U.S. Pat. No. 3,486,160. Although the per-circuit-board cost of making the manual interconnections was relatively high, the circuit board itself did not need to be custom fabricated.

To eliminate the cost of making the interconnections individually, the 'printed circuit board', or 'PCB', was invented. A PCB had one or more patterned layers of metal that predefined interconnections between the holes for component pins, so that if the components were merely mounted correctly the interconnections would be thereby established. Typically solder was then applied to affix the components and to ensure low-resistance connections. While some printed circuit boards were indeed made by printing the conductive layers using something resembling a traditional printing process, most were made by depositing layers of copper on an insulating sheet and then selectively etching the copper to leave behind the desired pattern. None-the-less the name printed circuit board, or PCB, came to refer to both types, and indeed to circuit boards in general.

However each PCB was now designed and fabricated for a specific task, and while this was simple for simple PCBs, high-performance systems pushed the speed and density of interconnections to the limit, raising the cost of designing each layer and the number of conductive layers needed. This required a "stack-up" of many carefully aligned layers of insulator and copper, greatly increasing the time and cost required to produce the PCB.

The convenience of being able to make and modify interconnections on the fly led to a number of styles of circuit boards that could be tailored to the needs of a system, as long as the chips to be interconnected met some predetermined physical contact pattern. Patterns range from circuit boards that ran selected connections to the edge of the board where connections could be made by plugging 'jumpers' into the appropriate pairs of holes (U.S. Pat. No. 3,486,160 and U.S. Pat. No. 5,426,738), to circuit boards that were customizable with a single masked metal layer (U.S. Pat. No. 5,264,664), to circuit boards containing 'anti-fuses' where interconnections could be electronically programmed by using a high programming voltage to fire the appropriate set of anti-fuses to create conductive paths (U.S. Pat. No. 5,490,042).

Even 'reprogrammable' circuit boards were produced where 'signal connections' from the chip sites were run to 'FPICs' (field-programmable interconnect circuits), specialized chips whose sole purpose is to reprogrammably establish interconnections between their contacts (U.S. Pat. No. 6,642,064, U.S. Pat. No. 5,428,750, U.S. Pat. No. 5,426,738). However the limited capacity of FPICs required multiple stages of these chips for high-end circuit boards, and for full interconnectivity, each stage of FPIC requires as many FPIC contacts as the original system chip contacts that they are interconnecting. To achieve a high degree of connectivity thus requires several times more area in FPICs than in the chips of the target system, greatly limiting the density of the system chips.

Also the world is not as simple as it was in wire-wrap days; a typical circuit board contains a wide variety of chips with different contact spacings and even different contact types, so a PCB that forces a system to use only components with a predefined 'contact type' and 'contact spacing' is sub-optimal. To overcome this, a one-time-programmable MOM has been made that combines the higher density of an MOM with anti-fuse programmability to prevent having to fabricate a unique MOM for each system (see article Designing ASICs for Use with Multichip Modules). The chips are mounted active-side up, and, in an echo of the wire-wrap days of yore, the chip contacts are 'wire-bonded' to pads on the MOM. This lets different chip contact spacings be adapted to by programming the wire-bonder appropriately.

While wire-bonded antifuse-programmable MCMs allow dense connectivity, one-time programmability, and mechanical adaptation to different contact spacings, they do not support releasable attachment of the chips, reusability of the substrate, internal re-driving for signal integrity or retiming for jitter elimination. The adaptation to different contact spacings also requires mechanical wire-bonding or conductive tape bonding with a bonding program specific to the system being constructed.

All of the above-cited prior art requires precision placement of the components during assembly. While this in not particularly difficult for automated pick-and-place machines during a batch of thousands of identical boards, it is inefficient for one or a few prototypes because it requires the development of a 'pick-and-place' program for typically a dozen or more chips and up to several hundred tiny discrete components (with most of these discrete components required for signal integrity). The assembled board must also then be run through a soldering oven without disturbing the components.

Test points for measuring signals between components are especially useful for prototype systems, as they are a tremendous aid in system debugging. But the signals from the test points must typically be brought to a logic-analyzer connector to aid in debugging; for non-reprogrammable circuit boards this requires knowing in advance which set of signals one will want to bring to a connector, and requires a separate connector for each set of such signals.

FPIC-based reprogrammable circuit boards have some flexibility, but full debugability requires a least as many pins to logic analyzer connectors on each FPIC as the maximum number of signals through that FPIC that one would want to analyze at any given time. Since FPIC-based boards are already the most limited in connectivity of the modern prototyping boards, this is a high cost.

For a signal near its maximum noise threshold or near its minimum voltage swing as it leaves a chip, the distance to the test connector or to the FPIC on the way to the test connector may contribute enough extra noise or enough extra attenuation that the signal at the logic analyzer is unreliable. Since prototype circuit boards often contain prototype chips where such fragile signals are more common, the detection of a signal immediately as it leaves a chip gains extra importance for prototyping systems.

Because of the possibility of defects within a component and the cost of detecting and locating a defect once a component is installed in a system, and the further cost of replacing defective components if they are non-releasably attached in a system, components are generally tested before they are used. While testing packaged components is relatively simple, early testing and discarding of defective components saves packaging costs and opens up the possibility of bulk testing.

Thus when components are made on a wafer, they are typically made with test circuitry that allows testing for common speed-independent defects, such as when a shorted contact or missing metalization creates a logic gate or a memory cell that is 'stuck' on or stuck off. This information is usually gathered by a 'scan chain' and exported to the external tester through a few pins, typically via a 'JTAG' (Joint Test Action Group) port. This allows initial testing to be performed before dicing a wafer, so that packaging of components with easily detectable defects can be avoided.

However additional less-obvious defects may still exist in any component and these typically manifest themselves only after a prolonged 'burn-in' period where the features of the component are thoroughly exercised. These defects include thin spots in wiring that get hotter and thinner over time until they blow like a fuse, and the opposite, where current leaking through an insulator breaks down that insulator, allowing more and more current to flow.

In addition, at the leading edge where the packing of internal features pushes the limits, subtle interactions between signals can produce signal integrity problems that only manifest themselves under extremely specific sets of circumstances, typically including running the circuit at its maximum speed. Such burn-in testing is usually conducted on individual components after they are diced from their wafer and packaged, using a custom socket as an adapter between the specific contact pattern of a given component and the contacts of the expensive tester itself.

Full-wafer at-speed burn-in testing is also known in the art, but it requires a far more complex adapter for each type of component to be tested. This is because while a typical small chip like a memory chip might have on the order of 100 contacts and a typical large chip like a microprocessor might on the order of 1000 contacts, a 200 mm wafer might contain several hundred small chips or one hundred large chips. Thus a whole 200 mm wafer of chips typically has several tens of thousands of contacts or even one hundred thousand contacts. With the semiconductor industry periodically progressing to larger wafer sizes and finer contact spacings, the number of contacts per wafer increase over time; for example, a 300 mm wafer, with over twice the area of a 200 mm wafer, may have several hundred thousand contacts. Thus an extremely complex test fixture is necessary merely to make to connections to a wafer full of contacts, and a customized fixture is required for each component's contact pattern.

Driving all of the power and ground contacts and the inputs to all of the components on the wafer being tested is difficult enough, but at least the inputs to each component can be identical. Carrying all of the outputs from the components through the test jig and back to the tester is far more difficult, as the outputs cannot be assumed to be identical (or there would be no point in testing each component). Simple tests such as power integrity and reading scan chains require few enough contacts that a set of contacts can be provided for each device being tested, and this can be provided through circuitry attached to the 'probe card' (U.S. Patent Application Document Number 20050237073). However for more complex at-speed testing, to connect the wide address, data and other signal busses of all the chips on a wafer would exceed the capacity of the circuitry attached to a probe card, even with arranging such circuitry out of the plane of the card as taught in U.S. Pat. No. 6,853,206. Thus such tests are typically run on one chip at a time, and at most a few chips at a time, per tester channel. Furthermore, adding numerous extra chips to a probe card drives up the cost of the card.

In both full-wafer test cards and programmable circuit boards, any high-speed integrated circuits that are needed are made as ordinary chips that are then attached to the substrate. This allows coarser non-reticle lithography to be used for the substrate, which can make conductors up to tens of centimeters long and has a defect rate low enough to make large areas practical, In most cases this eliminates the need for active components such as transistors in the substrate altogether, and when active components in the substrate are desired, they can be coarse, slow circuits. For example, U.S. Pat. No. 6,160,276 discloses an embodiment of a programmable circuit board where the circuitry to program the antifuses to create conductive paths is embedded in the substrate; these circuits are then not used once the programming is complete and the circuit is operational.

SUMMARY OF THE INVENTION

It is therefore one object of the present invention to provide a programmable circuit board larger than a chip package that lets signals from components affixed to it be reprogrammably routed to other components affixed to it without having to route those signals through external programmable interconnect chips affixed to the circuit board.

It is a further object of the present invention to have a reprogrammable circuit board where substantially all the surface area of and substantially all of the contacts for affixed components are usable for the components of the target system rather than for components to support the reprogrammability, allowing the reprogrammable circuit board to support a system component density comparable to that of a non-programmable printed circuit board.

It is a yet further object of the present invention to have such a reprogrammable circuit board wherein even if substantially all of the surface is used for target system components, any set of the contacts of such components can be reprogrammably routed to a debug connector anywhere on the surface.

It is also an object of the invention to provide an efficient internal network for interconnecting the contacts of components affixed to a programmable circuit board that scale from tens of thousands to tens of millions of contacts.

It is a further object of the present invention to provide a programmable circuit board larger than a chip package that lets signals from components affixed to it be reprogrammably routed to other components affixed to it through reprogrammable conductive paths through the programmable circuit board.

It is a yet further object of the present invention to provide such a programmable circuit board where the conductive paths through the programmable circuit board are programmed through a material that can be reversibly changed from a high-resistance to a low-resistance phase.

It is a yet further object of the present invention to provide such a programmable circuit board where the conductive paths through the programmable circuit board are programmed through the reversible movement of a conductive member to make or unmake a low-resistance contact.

It is also an object of the present invention to provide a programmable circuit board that lets signals from components affixed to it be programmably routed to other components affixed to it through paths that contain repeaters or amplifiers to improve signal integrity versus signal power consumption, without said repeaters or amplifiers being also affixed to the programmable circuit board.

It is a further object of the present invention to provide a programmable circuit board that has a repeater or amplifier within one centimeter of each contact of an affixed component, and a yet further objective to provide a repeater or amplifier within one millimeter of each signal contact of an affixed component.

It is also an object of the present invention to provide a programmable circuit board that lets signals from components affixed to it be programmably routed to other components affixed to it through paths that contain retiming circuitry to reduce signal jitter and/or signal skew between signals.

It is a further object of the present invention to provide such a programmable circuit board where the last retiming circuitry is within one centimeter of the contact of the component that the signals are being routed to.

It is a yet further object of the present invention to provide such a programmable circuit board where the last retiming circuitry is within one millimeter of the contact of the component that the signals are being routed to.

It is also a further object of the present invention to provide such a programmable circuit board where the retiming circuitry can compensate for known skew within the receiving component package.

It is also an object of the present invention to provide electronically reprogrammable means for selectively connecting contacts of affixed components to power and ground planes, without having predetermined power and ground contact sites that a component must match.

It is a further object of the present invention to provide such electronically reprogrammable means for selectively connecting contacts of affixed components to power and ground planes that minimize leakage in contact sites that are not occupied by component contacts.

It is also an object of the present invention to provide an electronically reprogrammable circuit board that can use a generic adaptor to adapt a wide variety of components with a given contact spacing to the contact spacing of the programmable circuit board substrate.

It is also an object of the present invention to provide an electronically reprogrammable circuit board that supports having substantially all of its surface covered with bare-die components, while being able to interconnect any set of contacts of those components.

It is also an object of the present invention to provide a programmable circuit board with alignment-insensitive substrate contact means for contacting contacts of components affixed to the substrate.

It is also an object of the present invention to provide a programmable circuit board that can establish working connections directly to a variety of contact types and spacings without having pre-determined locations for components with those contact types or spacings.

It is a further object of the present invention to provide a programmable circuit board with alignment-insensitive substrate contact means for contacting contacts of components affixed to the substrate that can contact different types of and different spacings of component contacts.

It is a further object of the present invention to provide a programmable circuit board with an array of small contacts that can individually serve as independent contacts for connecting to small component contacts, and can collectively form alignment-insensitive contact means for larger component contacts, for components affixed to the array.

It is a further object of the present invention to provide such a contact-variety-tolerant programmable circuit board that can use a contact-control element that is not the nearest element of its type to a given contact to control that given contact, so that an array of contact control elements can control contacts more closely spaced in one direction than the contact control elements are spaced in that direction.

It is also a further object of the present invention to provide such an array of small contacts where small contacts that can connect to power or ground planes are interspersed with small contacts that can be internally interconnected to other small contacts that connect to other component contacts.

It is also a further object of the present invention to provide such an array of small substrate contacts where multiple small contacts can cooperatively drive a larger component contact.

It is also an object of the present invention to provide a programmable circuit board that detects the contacts of components affixed to it.

It is a further object of the present invention to provide a contact-detecting programmable circuit board in conjunction with a routing program that lets a component placement specification be nudged until it matches a detected contact pattern, and a yet further objective to have this process be automated, and an even further objective to provide automatic adjustment of previously specified interconnections for minor movement of affixed components when the programmable circuit board uses releasable attachment means.

It is a further object of the present invention to provide a programmable circuit board that detects the contacts of components affixed to it; that also is contact type and spacing insensitive and that can electronically selectively connect affixed component contacts to power and ground.

It is a yet further object of the present invention to provide such a contact detecting programmable circuit board in a prototyping system that uses the pattern of detected contacts to identify the package types and sizes of components affixed to it.

It is an even further object of the present invention to provide such a contact-pattern-detecting programmable circuit-board system that uses the detected contact patterns to identify potentially matching components from a list of possible components, and to allow the system user to identify the matching chips from the list of potential matches.

It is a yet further object of the present invention to provide such a contact-pattern-detecting programmable circuit-board that can electronically reprogrammably connect component contacts to power and to ground; that can map out the power and ground planes of affixed components and that can supply those plane maps to associated system software for use in identifying components and for specifying contact descriptions for new components.

It is also an object of the invention to provide for a mechanical housing that provides even pressure to releasably affixed components of different heights while minimizing and/or accommodating the difference in thermal expansion between the programmable circuit board and the mechanical housing.

It is also an object of the invention to provide for a programmable circuit board in a form factor that mates to a standard card slot in a standard chassis while also being capable of mating to other programmable circuit boards of the same form factor to form a programmable circuit board array of at least two dimensions.

It is also an object of the invention to provide a wafer probe card that can accommodate a variety of contact spacings for components on wafers to be tested.

It is a further object of the invention to provide a wafer probe card with repeater or amplification circuitry within one centimeter of each test component contact.

It is a further object of the invention to provide a wafer probe card that can replicate test signals to multiple test components without using affixed replication elements.

It is a further object of the invention to provide a wafer probe card that can compare results signals between multiple test components or from multiple test components to expected values, also without using affixed comparison elements.

DEFINITIONS

By the expression "Alignment-insensitive" as used herein is meant not rendered inoperable by small changes in placement or angle of something affixed relative to what it is affixed to.

By the expression "Alignment-insensitive contacts" is meant an array of substrate contacts of a size and spacing such that components can be placed in registration anywhere within the array of substrate contacts such that at least one of the substrate contacts will be in contact with each one of the component contacts and none of the substrate contacts will be in contact with more than one of the component contacts. Switch circuitry can be used for selecting substrate contacts in contact with component contacts for providing an interconnecting path for the component contacts to other devices.

By the expression "Analog" as used herein is meant a class of signals where the magnitude of the signal is important, rather than just whether a signal is on or off.

By the expression "AND" as used herein is meant the AND function which checks two bits and results in a one only when both bits are one.

By the expression "Anti-fuse" as used herein is meant an insulating link that breaks down to become permanently conductive if a high voltage is applied across it.

By the expression "Areal density" as used herein is meant density per unit area.

By the expression "Array contact" as used herein is meant one of a set of contacts roughly equally spaced across a whole surface of a component.

By the expression "ASIC" as used herein is meant an application-specific Integrated Circuit, or an integrated circuit designed and manufactured for a specific application.

By the expression "Bare die" as used herein is meant a section of a wafer that has been diced (singulated) from the wafer but has not been packaged.

By the expression "Beneš" as used herein is meant a subfamily of Clos networks where each cross bar has the same number of inputs as outputs. While any set of inputs can be connected to any set of outputs, changing one set of such connections may force the internal rearrangement of other interconnections.

By the expression "BGA" (Ball Grid Array) as used herein is meant an array of small balls, usually of solder, allowing a component to be affixed to a circuit board.

By the expression "Bump" as used herein is meant a very small ball, usually of solder or of gold, affixed to a contact pad.

By the expression "Bumped" as used herein is meant having bumps affixed to contact pads.

By the expression "Burn-in" as used herein is meant a process for increasing the reliability of chips by exercising them for extended periods at full speed, often at elevated voltage or temperature. Chips that survive burn-in testing are unlikely to fail afterward for many years.

By the expression "Center stage" (also "center-stage") as used herein is meant an interconnect network stage that is at or near the middle of the stages of a multi-stage network.

By the expression "CGA" (Column Grid Array) as used herein is meant an array of small columns usually of solder to allow a component to be affixed to a circuit board.

By the expression "Chalcogenide" as used herein is meant a material containing significant amounts of sulfur, selenium or tellurium, which can change from a resistive amorphous phase to a relatively conductive crystalline phase and back through controlled heating and cooling.

By the expression "Clos" as used herein is meant a family of interconnection network arrangements, using crossbars, popular in network equipment switch fabrics. In most Clos networks the first stage has twice as many outputs as inputs, and the last stage has twice as many inputs as outputs, which always allows a connection to be established between any input and any output without rearranging any other interconnections.

By the expression "CMP" as used herein is meant Chemical/Mechanical Planarization, which is a process for planarizing a wafer that basically sands it smooth with a corrosive slurry containing extremely fine abrasive particles.

By the expression "CMOS" as used herein is meant Complementary Metal-Oxide Semiconductor, an energy-efficient type of circuitry that currently dominates the logic chip industry.

By the expression "CNT" as used herein is meant a Carbon NanoTube, which is a small, hollow cylindrical carbon fiber a few nanometers in diameter.

By the expression "Contact pitch" (also "Contact spacing"), as used herein is meant the center-to-center distance from one contact to its nearest neighbor contact in a given direction.

By the expression "Contact type" as used herein is meant the type of contact on a component; see for example BGA, CGA, QFP, Pad and TSOP.

By the expression "Continuous mesh" as used herein is meant a set of links from neighbor-to-neighbor that extends in a given direction for as long as there are neighbors in the given direction to link to.

By the expression "Critical area" as used herein is meant the area of a circuit where small lithographic defects will produce a circuit component that does not function correctly.

By the expression "Dendritic" as used herein is meant having a branched structure.

By the expression "DRAM" as used herein is meant Dynamic Random Access Memory, which is a dense, low-power semiconductor memory that must be rewritten after every time it is read. DRAM is also capacitor-based, and charge gradually leaks from the capacitor; DRAM must therefore also periodically be refreshed.

By the expression "Fan-out" as used herein is meant the number of other entities that a given entity can send to. When used regarding an interconnect network, it refers to the number of entities at the next stage that a given entity at a given stage can send to.

By the expression "Flexible PCB", or "Flex PCB" as used herein is meant a printed circuit board where the conductive layers are separated by layers of a flexible plastic.

By the expression "Flip-chip" as used herein is meant a chip that is designed to be affixed circuit-side-down onto a circuit board using solder or conductive adhesive bumps that are typically smaller than 100 micron in diameter on a few-hundred-micron pitch.

By the expression "FPIC" (Field-Programmable Interconnect Chip), also "FPID" (Field-Programmable Interconnect Device), as used herein is meant a chip that reprogrammably establishes interconnections between any sets of its contacts.

By the expression "FPGA" (Field-Programmable Gate Array) as used herein is meant a chip that has contacts, programmable logic cells, and a programmable mesh that interconnects logic cells to contacts and to other logic cells. FPGAs are often used for prototyping, and are increasingly being used for production systems.

By the expression "Higher-dimensional mesh" as used herein is meant a mesh that has more logical dimensions than physical dimensions; when used in the context of a planar substrate, it therefore refers to a mesh of at least three dimensions projected onto the two-dimensional substrate.

By the expression "H-tree" as used herein is meant a branched structure resembling an H, where each arm and leg of the H has a smaller H on its end, and each of those has a still smaller H on each appendage, etc. An H-tree has the same path length to every appendage of the smallest H units, and hence is often used to distribute a signal, such as a clock signal, that is used for synchronization.

By the expression "Hypercube" as used herein is meant a multi-dimensional network of at least four logical dimensions, wherein each node has exactly one connection to another node in each logical dimension.

By the expression "Hypercube connectivity" as used herein is meant a multi-dimensional network of at least four logical dimensions, wherein each node has one or more connections to exactly one other node in each logical dimension.

By the expression "Interconnect network" as used herein is meant a network that can be configured to establish signal conducting interconnections between sets of elements.

By the expression "I/O" as used herein is meant something pertaining to Input of a signal or Output of a signal.

By the expression "JTAG" (Joint Test Access Group), also "JTAG port", as used herein is meant a narrow port standardized by the Joint Test Access Group for performing basic tests on a chip, such as checking its scan chain.

By the expression "Jumper" as used herein is meant a two-pronged connector that is manually inserted into a socket to establish a connection.

By the expression "LAIC" (Large-Area Integrated Circuit) as used herein is meant a circuit larger than a reticle image, produced on a monolithic substrate.

By the expression "Leaf stage" (also "leaf-stage") as used herein is meant an interconnect network stage that is connected directly to an entity outside the network as well as to other nodes within the network.

By the expression "MCM" (Multi-Chip Module) as used herein is meant circuit boards made out of layers of ceramic or silicon; MCMs can have much finer wires than a fiberglass circuit board (although still much coarser than on a chip).

By the expression "MEMS" (Micro-Electrical-Mechanical-Systems) as used herein is meant components, usually made through a lithographic process, that contain small moving parts between one micron and one millimeter on a side.

By the expression "Mesh" as used herein is meant a set of links from neighbor-to-neighbor that extends for at least several links in a given direction.

By the expression "Multi-dimensional network" as used herein is meant a network where each element has at least one link to at least one neighbor in each of at least two physical or logical dimensions.

By the expression "Multi-stage network" as used herein is meant a network of at least three stages where an element at any given stage connects to multiple elements at other stages, but does not connect directly to other elements in its own stage.

By the expression "Nanopad" as used herein is meant a small pad of an array of pads on a very tight pitch, so named because at a 30-micron pitch, one billion nanopads fit per square meter.

By the expression "NEMS" (Nano-Electrical-Mechanical-Systems) as used herein is meant components, usually made through a lithographic process, that contain small moving parts between one nanometer and one micron on a side.

By the expression "Nudge" as used herein is meant to move something very slightly, often the smallest amount one can move it.

By the expression "One-time programmable" as used herein is meant programmable through non-reversible programming, such as using fuse or anti-fuses.

By the expression "OR" as used herein is meant the OR function which checks two bits and results in a one if either bit is one.

By the expression "Pad" as used herein is meant a flat conductive contact on the surface of a component that connects to circuitry inside the component.

By the expression "PCB" (Printed Circuit Board) as used herein is meant both printed circuit boards made by printing the conductive layers in something resembling a traditional printing process, and circuit boards made by depositing layers of copper on insulating sheets and then selectively etching the copper to leave behind the desired patterns.

By the expression "PCI-express" as used herein is meant the SerDes based version of the Peripheral Component Interconnect bus. PCI-express is used in most computers and workstations for high-performance peripheral cards like network adaptor cards.

By the expression "Peripheral contact" as used herein is meant one of a set of contacts located around the periphery of a component, usually in a ring of pads for a bare die or in a row of wire legs for a packaged component.

By the expression "Pick-and-place" as used herein is meant a machine, or a program for such a machine, that picks components from a dispenser and precisely places them on a substrate such as a circuit board or an MCM.

By the expression "Probe card" as used herein is meant a circuit board or complex of circuit boards that can make contact with one or more unpackaged components to be tested.

By the expression "Programmable circuit board" as used herein is meant a circuit board that can be electronically programmed to establish interconnections between components.

By the expression "QFP" (Quad Flat Pack) as used herein is meant a flat, rectangular, integrated circuit with its leads projecting from all four sides of the package.

By the expression "Reprogrammable" as used herein is meant programmable through means that allow repeated modifications to the programming.

By the expression "Reticle" as used herein is meant a holder for a mask containing a pattern used in creating a lithographed layer.

By the expression "Reticle image" as used herein is meant the image created on a wafer during lithography by exposing the wafer through a mask in a reticle. "Reticle image" also means the area of the wafer exposed through each reticle, especially when applied to multiple lithographed layers.

By the expression "RF" (Radio Frequency) as used herein is meant circuits or signals that oscillate at speeds comparable to radio signals, with those that oscillate at rates achievable by standard CMOS generally being excluded from the usage. RF is currently considered to start at ten GigaHertz.

By the expression "Scan chain" as used herein is meant a circuit within a chip that tests the chip for defects by sending known values through various functions (typically linking all flip-flops into a long shift-register chain) and reporting the results, usually through a JTAG port.

By the expression "SerDes" as used herein is meant a Serializer/Deserializer circuit that transforms signals from multiple moderate-speed connections into a signal for a single high-speed serial connection, and vice versa.

By the expression "Signal Contact", also "signal contact", as used herein is meant a contact that can be used for input or output of a signal, or both.

By the expression "SRAM" as used herein is meant Static Random Access Memory, which is a moderate-density, moderate-power memory that can be continuously read and does not need to be refreshed.

By the expression "Substrate" as used herein is meant the wafer on which circuits are built through lithography, or the bare circuit board on which a system is built by affixing components. In the present application 'substrate' generally refers to the wafer in a wafer-based programmable circuit board.

By the expression "Sparse" as used herein is meant that a set of sites for a type of entity is far from fully populated with that type of entity.

By the expression "System chips" as used herein is meant system components that are integrated circuit chips.

By the expression "System components" as used herein is meant components of a system prototype on a programmable circuit board that would be present if the system being prototyped were to be built on a fixed-function circuit board.

By the expression "Stuck" as used herein is meant an output from a transistor or from a connection or from a pixel that remains the same regardless of the inputs to the transistor or connection or pixel.

By the expression "TCE" (Thermal Coefficient of Expansion) as used herein is meant the rate at which a material expands as the temperature is raised, usually measured in parts per million per degree Celsius.

By the expression "TCM" as used herein is meant a Thermal Conduction Module such as that used by IBM in mainframes in the 1980s. A TCM cooled an array of chips by pressing a heat-conductive plunger against each one.

By the expression "Toroidal mesh" as used herein is meant a set of links from neighbor-to-neighbor that extends until there are no more neighbors in a given direction, at which point the next link wraps around to the furthest neighbor in the opposite direction.

By the expression "Trace" as used herein is meant a horizontal signal conductive path parallel to the surface of the substrate (as opposed to a vertical 'via').

By the expression "TSOP" (Thin Small Outline Package) as used herein is meant a thin, rectangular package with leads sticking out the sides of the package. The leads are formed in a J-bend profile, bending underneath and towards the bottom of the package, with gullwing-shaped leads.

By the expression "Via" as used herein is meant a short vertical conductive path between substrate layers.

By the expression "Wafer" as used herein is meant a thin layer, usually disk shaped and usually sliced from a single crystal of high-purity semiconductor material (chip-grade or circuit-grade). A mechanical-grade 'handle wafer' can be made from the same basic material, but costs less because the material is not as pure and may not be cut from a single nearly-perfect crystal.

By the expression "Wafer Probe card" as used herein is meant a probe card that tests (probes) multiple components on a wafer before the wafer is diced into individual components.

By the expression "Wire-bond" as used herein is meant a connection between two contacts made by affixing one end of a tiny bonding wire to each contact, typically through heat or pressure.

By the expression "Wire-wrap" as used herein is meant a technique for establishing connections between pairs of pin-type contacts by wrapping a stripped end of a wire around each pin of the pair, typically by using a 'wire-wrap gun' to perform the actual wrapping.

By the expression "XAUI" as used herein is meant the Ten-Gigabit Attachment Unit Interface, a SerDes-based interconnect for transferring ten gigabits per second to an external device.

By the expression "XOR", also "exclusive OR", as used herein is meant a function that compares two bits and results in a one whenever the two bits differ and a zero wherever the two bits are the same.

BRIEF DESCRIPTION OF THE DRAWINGS

These and other objects, features and advantages of the invention will be more readily apparent from the following detailed description of the preferred embodiments, in which.

DESCRIPTION OF THE PREFERRED EMBODIMENTS

First Family of Preferred Embodiments

Reprogrammable Circuit Board with Embedded FPICs

Figure 1:
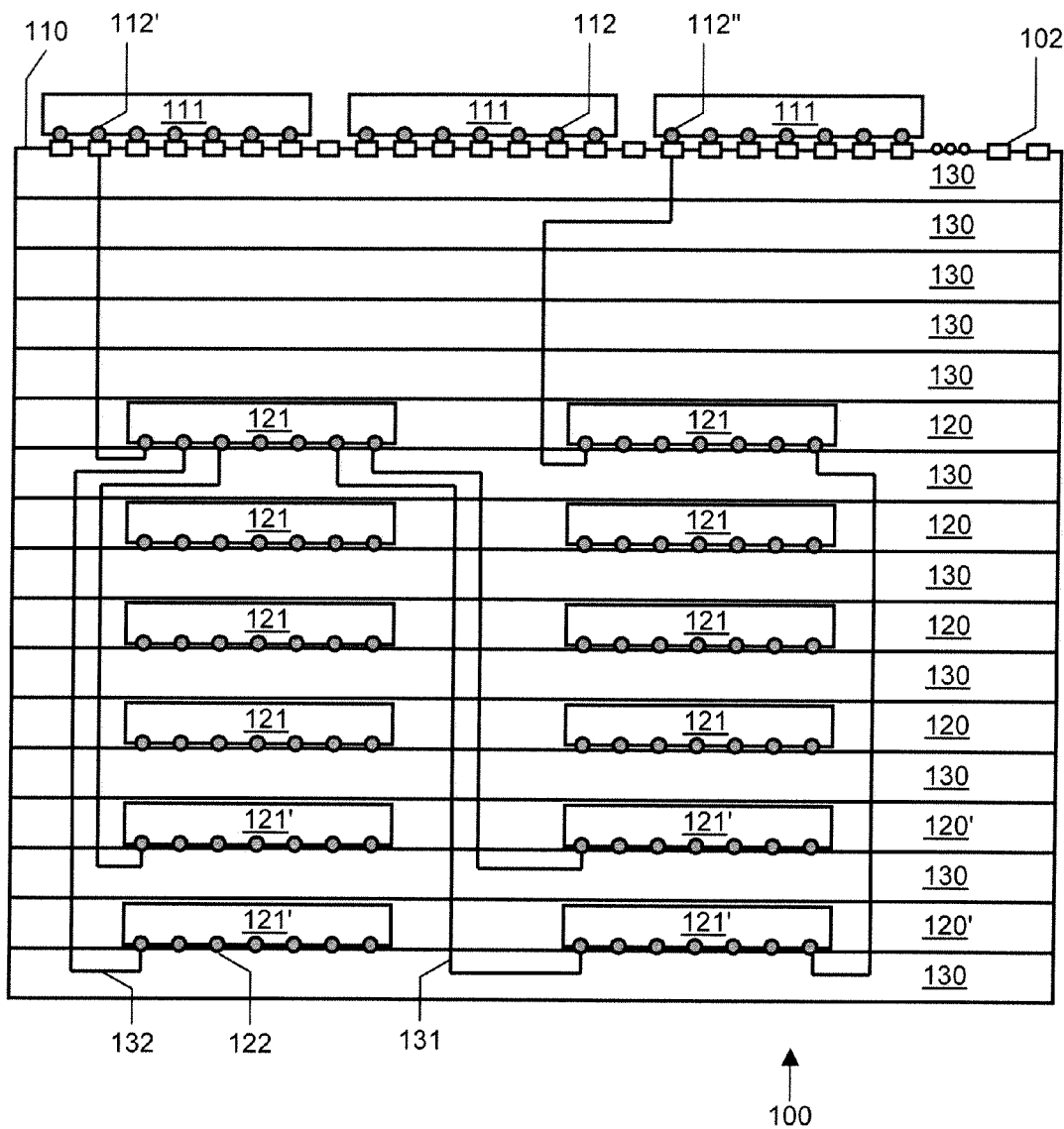
FIG. 1 is a depiction of a reprogrammable circuit board in which multiple embedded FPIC layers allow substantially all of the surface to be used for components of a system being prototyped.

Printed Circuit Boards, or PCBs, interconnect circuits built on separate chips. However each traditional PCB is designed and fabricated for a specific task, and with high-performance systems pushing the speed and the density of interconnections to the limit, this requires a 'stack-up' of many carefully aligned layers, each of which is costly to design.

The prior art contains numerous examples of attempts to overcome this with multi-purpose circuit boards that can be permanently tailored or programmed for a specific interconnectivity pattern. Programming techniques used range from single masked metal layers (U.S. Pat. No. 5,264,664), to anti-fuses (U.S. Pat. No. 5,490,042). However these techniques are not reversible, so a given PCB cannot be repeatedly tested and modified during the system development cycle.

To overcome this one-time programmability, reprogrammable circuit boards have been made where signal connections are run to field-programmable interconnect circuits, or FPICs, that can reprogrammably establish the desired interconnections (U.S. Pat. No. 6,642,064, U.S. Pat. No. 5,428,750, U.S. Pat. No. 5,426,738). While this does allow electronic programming, using separate FPIC chips adds cost, exacerbates signal integrity due to longer paths, and with multiple stages of FPICs required for high-end circuit boards, most of the circuit-board area is consumed by FPICs rather than the chips for the target system. U.S. Pat. No. 3,486,160 also discloses an improvement on manually reconfiguring a circuit board; instead of individually-made wire-wrap connections, jumpers could be manually plugged into connectors to make connections; however jumpers are time consuming, costly in density, and exacerbate signal integrity issues if used on signal contacts, so U.S. Pat. No. 5,426,738 taught combining FPICs for signal connections with jumpers for power and ground connections.

The programmable circuit-board architecture according to a first family of preferred embodiments of the present invention overcomes these drawbacks of the prior art by providing a reprogrammable circuit board wherein signals from components affixed to it can be reprogrammably routed to other components affixed to it without having to route those signals through an external programmable interconnect chip or a manually modified external connection such as a jumper or a wire-wrapped connecting wire.

This can be achieved through embedding in or on a circuit board a layer of lithographed silicon that contains one or more integrated circuits capable of establishing connections to the contacts of components affixed to it, and capable of reprogrammably interconnecting those contacts in a specified pattern. In one embodiment a number of commercially-available FPICs are embedded on one or more layers of the circuit board, and these FPICs are themselves connected in a multi-stage interconnect network such a Beneš network or a Hypercube network. This embodiment allows the use of mass-produced chips made with fine-pitched reticle-based lithography to achieve the high signal rates required in high-performance systems, and it allows tested FPIC chips to be used so that lithographic defects can be avoided by using only known-good FPIC chips.

But the FPICs to flexibly interconnect a system require several times more contacts than the chips of the target system; even a three-stage Beneš network, which is the most efficient for extending the roughly 1000 contacts of an individual FPIC to the tens of thousands needed for a high-end circuit board, requires three times as many contacts for the FPICs as for the system chips to allow the three-stage Beneš network to be built. Ideally the FPICs required should take no more area than the target chips, so the areal density of the internal FPICs should be three times higher than for the chips used in the target system.

A preferred embodiment therefore uses multiple layers of FPIC chips embedded in the circuit board, along with the circuit-board layers required to interconnect the FPICs in a Beneš network. As shown in FIG. 1, this allows the whole surface 110 of the reprogrammable circuit board 100 to be covered in chips 111 of the target system, increasing the areal density of FPIC-based systems to be on par with fixed-connectivity circuit boards.

Since the top surface 110 of the reprogrammable circuit board 100 can be largely covered in components, and the FPIC layers 120 and 120' need sufficient room between the FPICs 121 for vias 131 to interconnect the layers, more than three FPIC layers 120 and 120' are needed to maintain the 3-to-1 FPIC-contact 122 to system-component-contact ratio 112. As the density of contacts 102 on the top surface 110 approaches the maximum density of vias 131 for the circuit board material, the number of layers needed grows asymptotically because the vias 131 leave less and less space for FPICs 121. Fortunately circuit board materials can generally support a considerably higher via density than the contact density on the chips affixed to them; at a 2× higher density only six FPIC layers 120 and 120' are needed (as shown in FIG. 1) and at a 4× higher density only four FPIC layers are needed. Since the cost of the circuit board layers is small compared to the cost of the FPICs, especially preferred embodiments use circuit board techniques such as blind vias, buried vias and micro vias to maximize the via density and thus minimize the number of FPIC layers needed and the overall PCB thickness.

In addition to the FPIC layers, numerous layers are needed for the 'traces' 132 (horizontal metal lines) that interconnect the leaf-stage FPICs 121 to the center-stage FPICs 121'. At the center of the circuit board, half of all FPIC contacts 122 have traces 132 crossing to the other half, in each of the X and Y dimensions. In the example of a 256×256 array of 1-millimeter contacts 102, this is 256 traces 132 per millimeter at the middle of the circuit board 100. With a moderately tight pitch of 12 mils, or about 0.3 millimeters, this is 75 layers 130. However ¾ of the trace length is devoted to traces that are optimal only for interconnections that span at least half the diameter of a circuit board, and in essentially all real-world systems, these links are uncommon, typically constituting a few percent of the total links and very rarely more than 10% of the total links. Reducing the number of these long links to 10% of a full Beneš network also will typically not impact short-range connectivity because even at non-programmable circuit-board density it is rare to have more than half of the potential contact sites occupied; and such reduction in the long traces reduces the number of layers 130 need to support the traces 132 to 25 layers, which is within the range of high-end circuit boards today.

While the FPICs 121 could be spread among all of the layers 120 and 130 required to interconnect them, mechanically it is simpler to have only a few FPIC layers 120. Especially preferred embodiments thus comprise four layers that contain FPIC chips, with roughly 25 additional interconnect-only layers 130 to interconnect the FPICs into a three-stage Beneš network, implemented in a circuit board technology that can support a via density at least 4× higher than the contact density of the chips that will be attached. As shown for two system chip signal contacts 112' and 112" in FIG. 1, each signal contact 112 on a system chip 111 is connected through a via 131 and a trace 132 to an FPIC 121 in a leaf-stage FPIC layer 120, and each FPIC 121 in a leaf-stage layer 120 is connected, again through vias 131 and traces 132 to each FPIC 121 in center-stage FPIC layer 120'. An interconnection can thus be made from any system-chip contact to its leaf-stage FPIC to any center-stage FPIC to the destination leaf-stage FPIC contact and on to the destination system-chip contact by programming each FPIC to establish the appropriate internal connections between its contacts.

It is to be understood that the number of chips 111 and 121 and the number of contacts 112 and 122 per chip have been reduced for clarity. A full Beneš network supporting a 256×256 array of contacts with FPIC chips comprising 1024 signal contacts each requires 128 leaf-stage FPICs and 64 center-stage FPICs, with 8 interconnections from each leaf-stage FPIC to each center-stage FPIC, and even with reducing the number of long interconnections to 10% the network requires around 100 leaf-stage and 50 center-stage FPICs).

A three-stage Beneš network of 1000-contact FPIC chips 121 provides sufficient scalability to double the number of FPICs 121 to support system chips 111 covering both faces of the programmable circuit board 100. In practice, however, most circuit boards do not have anything close to the full density of contacts on the back of the board; since the back of a PCB is typically used for discrete components that have a lower contact density than chips, especially preferred embodiments have much or all of the back of the programmable circuit board less densely populated with contacts than the front of the programmable circuit board and therefore use only one FPIC layer 120 to support the back of the programmable circuit board.

The number of FPIC contacts needed to support the backside of the reprogrammable circuit board is conveniently in the range of the number of FPIC contacts saved by reducing the number of long interconnections, and the backside interconnections tend to be very short and thus not require long traces, so further preferred embodiments reduce the number of long leaf-stage-FPIC to center-stage-FPIC interconnects and devote the FPIC contacts saved thereby to supporting backside components.

When the number of center-stage FPIC contacts connecting toward the top surface 110 of the programmable circuit board is significantly higher than the number connecting toward the bottom surface, it is advantageous to invert the center-stage layers to eliminate the extra vias and traces that would otherwise be needed to route to contacts that would be underneath the center-stage FPICs.

Figure 2:
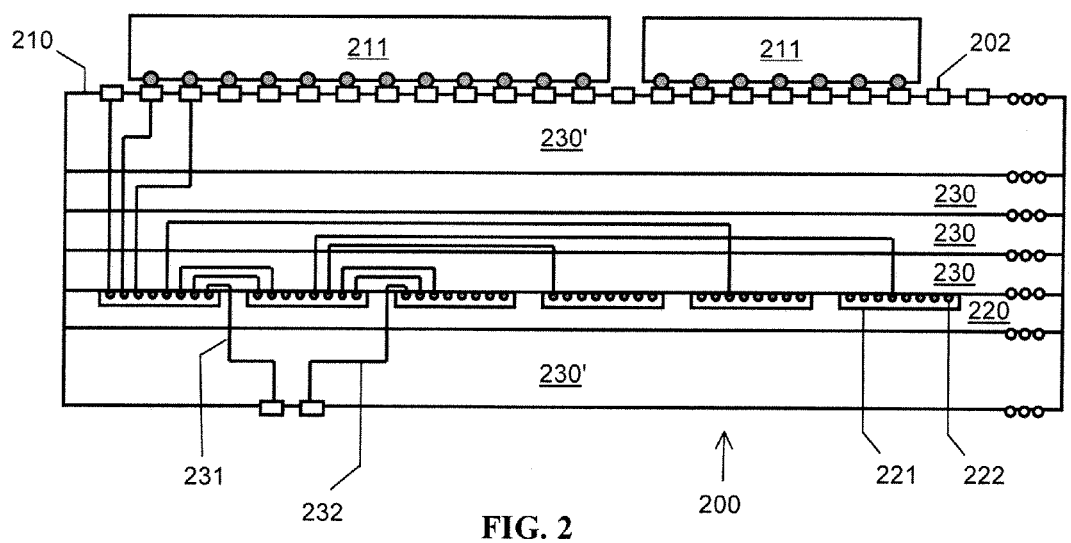
FIG. 2 is a depiction of a reprogrammable circuit board in which a fine-pitched MOM layer allows substantially all of the surface to be used for components of a system being prototyped.

A circuit board containing four or eight layers of FPIC chips plus the many layers needed to interconnect those FPIC chips in a Beneš or other network is much thicker than a normal circuit board, even though some of these layers replace the layers that would traditionally have provided fixed interconnectivity. Another preferred embodiment, as shown in FIG. 2, overcomes this by using bare-die FPICs 221 affixed to a fine-pitched ceramic (MOM) layer 220 embedded in the circuit board. Because bare dies such as the FPICs typically have a density of contacts 222 more than four times higher than packaged chips and the density of vias 231 does not exceed that for an MOM, this also allows the entire surface 210 of the programmable circuit board 200 to be used for chips 211 of the target system while only using one layer of FPICs 221.

Although such a fine-pitched layer 220 costs more to develop than a standard circuit-board layer, a programmable circuit board can be used for a wide variety of systems so those costs can be amortized over a very large number of circuit boards. Especially preferred embodiments therefore use multiple ceramic layers 230, with their finer conductive traces 232, to increase the routing density of the conductive layers, reducing the number of layers 230 needed and thus reducing the thickness of the resulting reprogrammable circuit board 200 to be comparable to a fixed-function PCB. Thin-film ceramic circuit board layers 230 can support a trace pitch as tight as 25 microns, which reduces the number of layers 230 for traces 232 from roughly 25 layers to 3 layers (or to 5 layers at a less-expensive 50-micron pitch), and these layers are thinner as well. When thickness is a critical attribute, further preferred embodiments use FPIC chips 221 thinned with a commercially thinning process to get the thickness of the FPIC layer 220 down to tens of microns.

In addition to the system component density advantage that the programmable circuit boards of this family embodiments provide, embedded-FPIC 'cores' of layers 230 can be mass-produced, and cores can then be capped with a simple, few-layer normal PCB 230', or sandwiched between two such normal PCBs 230' as shown in FIG. 2. This allows a single embedded-FPIC-based design be adapted to support different system component contact spacings, and different power and ground contact patterns for the system components, while still retaining the interconnection programmability through the FPIC core.

With the effective density of the reprogrammable connectivity matching the connectivity density of a fixed-connectivity circuit board, there is now sufficient connectivity available to provide debug connectors wherever the system developer desires. Typically these are small logic-analyzer connectors with several dozen contacts a piece, so their cost in circuit-board area is modest and a number of these connectors can be placed on the board so that there will always be a connector close to the contacts whose signals are of interest, thereby minimizing signal issues in bringing these signals to the connectors. Such connector placement is especially useful in debugging prototype systems, which is the primary use for reprogrammable circuit boards.

Second Family of Preferred Embodiments

Large-Area Integrated Circuits (LAIC) and LAIC Interconnection Networks

With the above embodiments the system-chip density of a reprogrammable circuit board can rival that of a standard circuit board. However the reprogrammability advantage is achieved at the cost of numerous FPIC chips embedded in the circuit boards and either very thick circuit boards or multiple fine-pitched MCM-style layers within the circuit board, and it does not overcome any of the subsequent limitations discussed in the summary of the prior art.

A second family of preferred embodiments of the present invention therefore replaces the network of FPICs with a Large-Area Integrated Circuit, or LAIC, that in its simplest form provides similar functionality. Achieving sufficient signal rates to interconnect modern chips requires fine lithography, which is currently reticle-based, so inter-reticle stitching, as taught in U.S. Pat. No. 6,597,362 by the present applicant, is used to interconnect the large-area integrated circuit across reticle boundaries, allowing integrated circuits up to the size of a wafer to be produced.

The densest typical high-end system chips currently have one contact per square millimeter, so a PCB the size of a 300-millimeter wafer would have almost 70,000 contacts if completely covered with contacts for such packaged chips. With discrete FPICs it is optimal to use large cross bars to reduce the number of cross bars a signal will pass though, because the total number of contacts needed for the cross bars is proportional to the number of stages. However with a large-area integrated circuit spanning the programmable circuit board, it is not necessary for a signal to pass through FPIC contacts at every cross bar stage because the cross bars are all part of the same circuit. Not passing through external contacts lets many more stages of much smaller cross bars be used, which greatly reduces the total circuit area used for the cross bars because the number of cross points in a cross bar is equal to the square of the number of interconnections the cross-bar handles.

Flexibly interconnecting this many contacts can be done with multi-stage and multi-dimensional networks of crossbars, and the crossbars can be interconnected in a number of topologies. While a neighbor-to-neighbor network such as a two dimensional mesh is efficient for establishing connections between near neighbors, it is inefficient for longer interconnections, with signals having to pass through hundreds of elements to cross a whole wafer.

While such a network could be optimal for some specific uses, the expense of the masks for deep-sub-micron lithography makes a more generally applicable interconnection scheme preferable. Preferred embodiments of the present invention therefore use a network that is more efficient at interconnections between more-distant neighbors. While many such networks are known in the art, three that are considered exemplary for their balance of simplicity, efficiency, flexibility and robustness are discussed herein, with optimizations for the interconnection needs of the present invention. These are higher-dimensional meshes, hypercubes, and Beneš networks.

Although current lithography produces circuits that are physically two dimensional and although circuit boards are also currently two dimensional, the interconnect pattern used can logically have a higher number of dimensions; the physical interconnections are thus a projection (essentially a shadow) of the higher-dimensional mesh pattern onto the number of dimensions physically used. The use of multi-dimensional interconnection patterns is well known in the art of networks; for example, U.S. Pat. No. 4,805,091 teaches a 16 dimensional hypercube network for connecting $2^{16}$ processors.

The maximum number of hops in a mesh drops very rapidly as the number of dimensions used to interconnect the elements is increased. For example, $2^{16}$ (two to the sixteenth power) is 65,536 elements, which is sufficient for a one millimeter contact spacing on the bulk of a 300 millimeter wafer. With a one dimensional toroidal mesh (a ring) the maximum number of elements passed through is 32,768 in the one dimension, with a two dimensional toroidal mesh the maximum is 128 elements in each dimension for 256 total elements, with four dimensions the maximum is 8 elements in each dimension for 32 total elements, with six dimensions the maximum is three elements in each dimension for 18 total elements, with eight dimensions the maximum is two elements in each dimension for 16 total elements, and with sixteen dimensions the maximum is one element in each dimension for 16 total elements.

As well as the number of hops decreasing, the redundancy and the connectivity both grow with increasing number of dimensions. With a one dimensional toroid, for example, there are only two paths from any element to any other element, with these paths passing through thousands of elements that chance of a defect in both paths is very high. Also it is not possible to connect even three contacts in one region to three contacts in another region since there are only two paths out of or into any region. This is insufficient for a practical programmable circuit board.

In a two-dimensional toroidal mesh each contact has four paths to neighbor elements, and any given defective interconnection link can be worked around by taking a path that is at most two elements longer than the ideal path. Also, the number of paths into or out of any region of the two-dimensional toroidal mesh now scales with the circumference of that region. While this is a huge improvement, it is still insufficient because the number of contacts in a region the size of a chip that must connect to outside of that region scales with the area of a chip rather than the circumference of a chip.

A toroidal mesh with connections in three dimensions does much better. To reduce the maximum number of elements passed through, the third dimension is best split between the two physical dimensions, so that if one calls the two physical dimensions X and Y, half of the elements would have their 'third-dimension neighbors' be 13 elements away in the X dimension and half would have their 'third-dimension neighbors' 13 elements away in the Y direction (after the cube-root of 65,536, or 40 hops, in the 'Z dimension' one would have circled the wafer once in the X direction and once in the Y dimension, as 13×40/2=260, which is just bigger than the square root of 65,536=256).

However with three dimensions the connectivity to outside a chip-sized region still falls short for the larger standard chip sizes; with a chip package 42 contacts on a side, the four 13×13 corners would all have one third-dimension interconnection out (676 connections), the four 16×13 side regions would have one connection out for every two contacts (416 connections), and every pin on the circumference would have an X or a Y connection out with the corners having two connections (172 connections, 172=4*42+4). This totals 1264 connections (1264=676+416+172) out of the region, which is short of the 1764 contact balls on the package, even after deducting several hundred contacts for power and ground. Also the total number of elements a signal must pass through to reach a given contact can be as high as 60 with three dimensions, which is far above the minimum obtainable with more dimensions. Chip package contact counts are also increasing (packages with over 2000 contacts are already available), so the shortfall of three dimensions is growing.

Figure 3A:
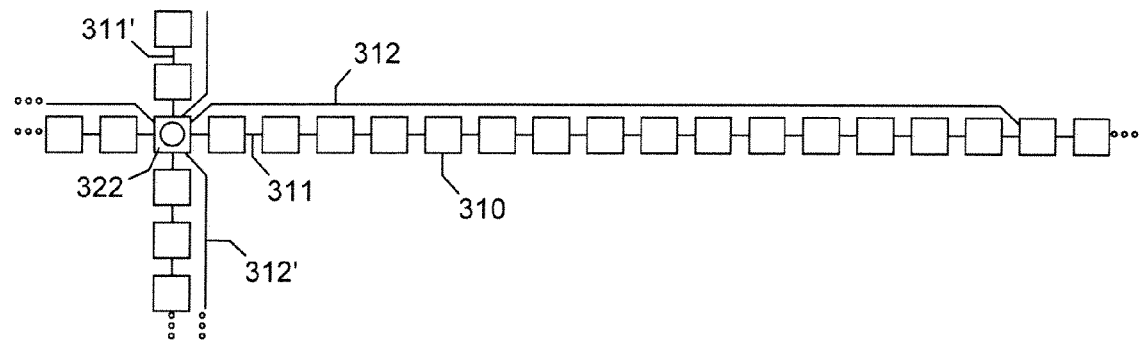
FIG. 3A is a depiction of a 4-dimensional continuous mesh internal interconnect network for a Large-Area Integrated Circuit based reprogrammable circuit board.

Four dimensions map more conveniently to a two dimensional wafer than three dimensions do, and with four dimensions, as shown in FIG. 3A, the element 310 supporting contact 322 not only has nearest neighbor links (connections) 311 in the X dimension and 311' in the Y dimensions, but also the third dimension maps to links 312 to elements 16 distant in the X dimension and fourth dimension maps to links 312' to elements 16-distant in the Y dimension. For the 42×42 package this means that substrate contacts in the four 16×16 corners now each have two connections to outside the region (2048 connections), those in the four 10×16 side regions each have one such connection (640 connections), and there are still 172 nearest neighbor connections from the lower dimensions. This totals 2860 connections (2860=2048+640+172), which is roughly double the number needed after allowing for power and ground. Even if chip packages as large as 70×70 were to be produced, the connections escaping from a 70×70 area would be more than sufficient after allowing for power and ground.

Figure 3B:
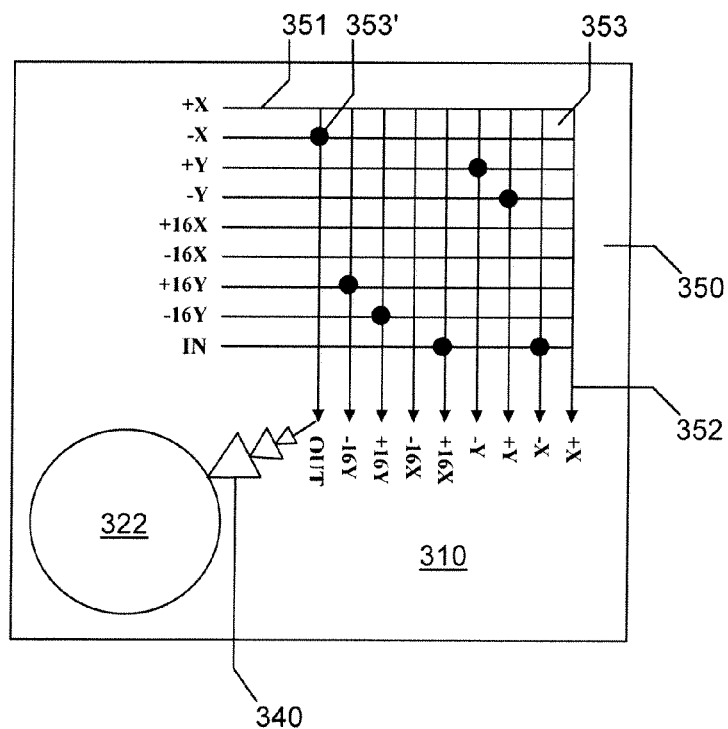
FIG. 3B is a depiction of an element containing a contact and a crossbar for a 4-dimensional continuous mesh internal interconnect network for a Large-Area Integrated Circuit based reprogrammable circuit board.

Each element can use a crossbar to selectively connect its contact to its links, or to connect links to other links, as shown in FIG. 3B. Links in each of two directions in each of four dimensions, plus a connection to the contact itself, can use a crossbar 350 with 9 inputs 351 and 9 outputs 352, and thus 81 cross points 353. In this example, the contact 322 in this element 310 is connected through the input 351 labeled 'IN' of crossbar 350, and thence through a set cross point 353' to the output 352 labeled '−X'. Also, the cross bar input 351 from the left neighbor (labeled −X) is connected through a set cross-point 353' to the crossbar output 352 labeled 'OUT', which is in turn connected through a driver 340 to drive contact 322. Thus a signal coming in from the contact 322 will be relayed to the neighboring element to the left (−X direction), and a signal coming from that left neighbor will be driven through the contact 322.

As well as connecting contact 322 to the element 310's left neighbor, the cross bar in this example has five other set cross points 353'. The −16Y input 351 is connected to the +16Y output 352 through a set cross point 353', and vice versa; this is indicative of a long interconnection traversing this element in the Y dimension. Similarly the −Y input 351 being connected to the +Y output 352 is indicative of a short interconnection traversing this element in the Y dimension. As none of these is connected to the input 351 labeled 'IN' or the output 352 labeled 'OUT', these traversing connections do not affect the contact 322 itself; they merely borrow otherwise-unused resources of this element 310.

In addition the input 351 labeled 'IN' has a second set cross point 353', connecting it to the element 310 that is 16 elements distant in the +X direction. Such asymmetric copying of the input signal to a distant element is typically indicative of sending a copy of the signal on the contact to a debug connector.

With four or more dimensions, toroidal meshes are no longer beneficial for the lowest dimensions (those with the shortest hops) because any long connections will go through the higher dimensions. This can be generalized to say that toroidal meshes are only useful for the highest dimension that maps to the physical X dimension and the highest dimension that maps to the physical Y dimension, as all long connections will use these highest dimensions.

In typical systems, most connections are made between adjacent chips, and usually even between the adjacent sides of adjacent chips, with the two most common kinds of connections being between the adjacent sides of logic chip and memory chips, and between the adjacent sides of logic chips and other logic chips. Logic chips are typically squares between 20 millimeters and 40 millimeters on a side (packaged size) and memory chips are typically rectangles between 12 millimeters and 15 millimeters wide, and the inter-chip spacing on dense PCBs is typically between 5 millimeters and 10 millimeters, so the most common connection distances can range from 10 millimeters to 50 millimeters, or, with a 1-millimeter contact spacing, between 10 and 50 contacts away. Interconnections generally run less than half a chip length in the direction parallel to the adjacent chip edges, or a few millimeters to around 20 millimeters.

If the links in the highest dimension in each direction are 16 to 24 contact-distances long, and those in the second highest dimension are 4 contact-distances long (and in the lowest dimension, hops connect neighboring contacts), then one can reach any contact in the 10 to 50 contact range in a maximum of 6 hops in each physical dimension. Typical short connections with four dimensions will thus be two or three hops in one higher dimension and one or two hops in the other higher dimension, and then an average of four hops in each of the two lower dimensions.

Other connections, however, run between such clusters of chips; these are typically up to half the length of the circuit board, which in this case would typically require eight hops in one higher dimension and four hops in the other higher dimension. Again an average of four hops and a maximum of eight hops would be required in each lower dimension. Thus with four dimensions, typical short interconnections require around a dozen hops and typical long interconnections require around 20 hops, with the maximum hops being 22 and 32 hops respectively.

The hop count can be reduced by increasing the number of dimensions, although a point of diminishing returns is quickly reached. With six dimensions, the ratio of the hop lengths between logical dimensions in each physical dimension is the sixth root of the total number of contacts, or just over 6 contacts, if all dimensions are distributed equally. But the dimensions do not have to be distributed equally; in fact it is optimal not to do so since in general the connection lengths on a circuit board are not distributed randomly. Also for longer hops many repeaters will be needed anyway, and the time delay for passing through a few extra cross points instead of just repeaters becomes relatively insignificant for the longer distances, so the dimension sizes chosen should favor short-range and mid-range dimensions, and even for the longest dimensions toroidal connectivity stops being worthwhile once the delay of the extra cross points becomes insignificant.

With a programmable circuit board substrate wafer made with reticle-based lithography, cost is reduced if all reticle images are identical. Although U.S. Pat. No. 7,055,123 teaches patterns that allow one reticle per layer to be used with interconnection patterns whose repetition does not need to match the reticle spacing, a repeat pattern that does match the reticle spacing is none-the-less simpler. Today's reticle images are typically limited to 20 to 24 millimeters by 33 to 34 millimeters, so convenient higher dimensions are those that repeat every 16 millimeters, or in this case every 16 contacts, so that a near maximum sized 16×32 reticle can be used (to minimize lithographic costs and inter-reticle stitching) with a repeat pattern that is both efficient and is the same round number in each physical dimension (which simplifies routing algorithms).

The link lengths of 16 contacts and 4 contacts are also very efficient for the typical shorter distance in the physical dimension parallel to the adjacent chip edges. The longest path in the target distance range is five hops plus four hops, or nine total hops. It should also be noted that routing around defects generally only lengthens the shortest paths because in the longer paths one can reorder the hop lengths in many different equal-length ways. Link lengths of 16 contacts, 4 contacts and 1 contact thus provides a very efficient interconnection arrangement for the targeted reprogrammable circuit board and an interconnection arrangement that is also very robust in the face of defects.

However it is not yet a non-blocking arrangement because an interconnect pattern can have all the interconnections from contacts in a region require two hops of the same length in the same direction, and the above embodiments only have one link of each length in each direction for each contact, so there would not be enough links to support the required hops in the worst case.

The simplest answer is to increase the number of interconnections of each type for each contact. Doubling the available links is sufficient for most patterns, but in a pathological case all interconnections in one direction use long hops that undershoot by two of the next shorter sized hop, while in the opposite direction each interconnection uses a long hop that overshoots by one, requiring a short backward hop. But a backward hop in the opposite direction uses the same type of link as the two short links just used in the first direction, so in this pathological case the shorter links would have to be tripled to handle the worst possible case.

Unless longer connections are added, links of length 16 would have to be more than tripled to handle the worst case because to reach a contact 45 or 50 millimeters away, which is within the common range, requires three such links per contact, and the rare much long connection crossing that area would also require these links. But setting aside these rare long interconnections for now, for the same price in metal as adding two links each of lengths 1, 4 and 16, one link each of lengths 2, 8 and 32 could be added, and this link-length diversity would provide more choice of routing lengths and simpler cross points. This link-length diversity avoids using two hops of the same length in the same direction to make a connection, and also avoids the worst-case reverse-path use of links because rather than taking a long link forward and taking the next shorter link backward, one would simply take the next shorter link forward. Non-worst cases where one would take a long link forward and a much shorter link backward can always be handled using just forward links with fewer than the worst-case number of hops because the worst of these cases, a longest link forward and a shortest link back, can be handled by taking the link backward first (since the contact being routed from 'owns' that link, that link won't be needed for another interconnection that must reach that contact).

Figure 4A:
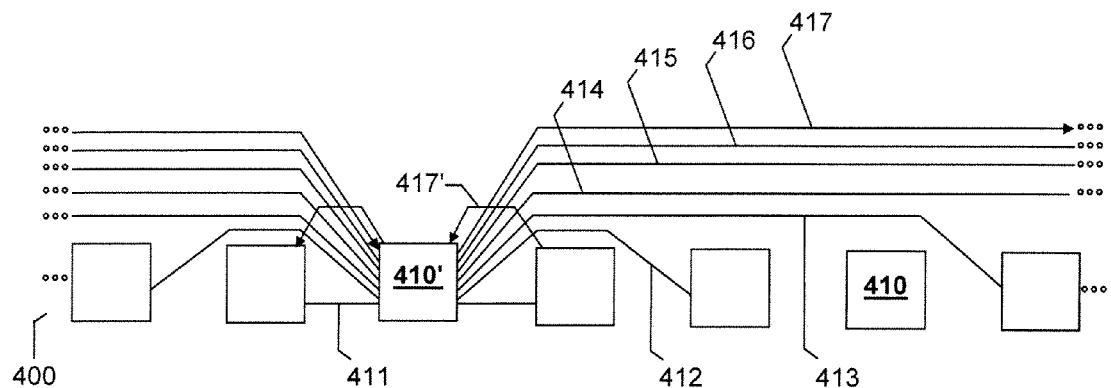
FIG. 4A is a depiction of one physical dimension of a 14-dimensional continuous mesh network for a reprogrammable circuit board, optimized for typical system interconnect patterns.

FIG. 4A is a depiction of the connections in the physical X dimension from one element 410 of a row 400 of elements. This element 400 has length-1 links 411, length-2 links 412, length-4 links 413, length-8 links 414, length-16 links 415, and length-32 links 416 in each direction. All of these links are bi-directional links, as indicated by the lack of a directional arrow; in a LAIC embodiment using conductive signal connections bi-directional links are best done with two signal conductors per link, with one conductor being driven by the element on one end, and the other conductor being driven by the element on the other end. A bi-directional link could also be done with a single metal link, but this requires more complex circuitry and is currently less efficient for links that remain within the same integrated circuit.

For those rare long interconnections, adding even longer links helps speed the longest connections as well because a repeater introduces slightly less delay than a cross point. But very long connections are uncommon, so adding two complete extra dimensions with hops of 64 in the physical dimensions is far more than is necessary. Also adding longer links would be relatively expensive in terms of metalization, as each length-64 link requires as much metal as a link of each of shorter length all added together; thus a full set of length-64 links would double the total metalization required for links. At most around 10 percent (and typically only a few percent) of the interconnections would require these longer links, and it would be a rare connection that would require more than two such links. Therefore even one shared extra dimension (see the previous discussion regarding a toroidal mesh with connections in three dimensions) would be more than twice what is necessary.

Figure 4B:
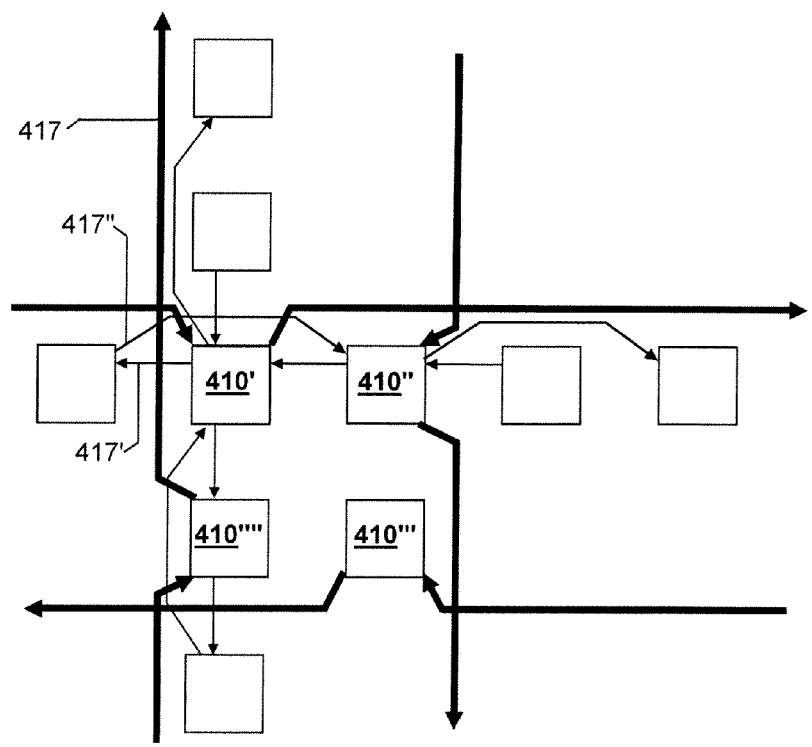
FIG. 4B is a depiction of an arrangement of sparse longest links of a 14-dimensional continuous mesh network for a reprogrammable circuit board.

In the interest of keeping the crossbar elements as similar as possible, a preferred answer is therefore to have each such element have a length-64 link 417 in only one direction per element 410, as show by the arrowhead indicating the direction of the links 417. As shown in FIG. 4B, in a 2×2 square of elements 410', 410" 410''' and 410'''', each element has its length-64 link 417 pointing in a different physical direction (+x, −y, −x and +y respectively). Each length-64 link 417 lands on an element that contains a length-64 link in the same direction, allowing a long distance to be traversed through a series of such length-64 links without requiring intervening short links to be taken. Because the worst-case paths will have length-of-1 hops in both physical dimensions anyway, those length-of-1 hops can be chosen to occur either before or after long hops to have the long hops start from a contact that has them in the right direction. That way the worst-case paths are not increased in hop count at all, and even the fewer-hop paths, which can afford extra hops, would be increased by at most four length-of-1 hops compared to the shortest path that they could take even with two full extra dimensions.

However this does create an additional constraint on where the shortest links are chosen, which could conflict with having only one copy of each of these links. While the rare long interconnections would be unlikely to be common enough to exhaust this resource in a real-world example, these are the least expensive links of all, so simply doubling them is a low-cost insurance policy. These additional shortest links are also ideal for routing around defects, so having extra such links around also makes routing algorithms simpler and faster. This insurance policy can be made even more convenient by having the doubled short links only in the three directions other than the direction of the extra-long link, making for a symmetrical pattern for all but the metalization, and saving a count of one on each cross bar.

As FIG. 4B shows, in each element one of these unidirectional links 417' is opposite to the direction of the length-64 links 417; this can be a length-1 link 417'. Furthermore in a given row or a given column of elements 410 only every other element has a length 64 link 417 in a given physical dimension, for example element 410' in the row containing 410' and 410", the other element (in this case 410") has length-2 links 417" instead. Rather than adding two full dimensions of longest links, with the metalization that would entail, this effectively adds two dimensions where ¼ of the links length-64 links 417, ½ of the links are length-1 links 417', and ¼ of the links are length-2 links 417". While this is more than sufficient for typical circuit-board interconnect patterns for today, if the need for long links were to be greater in the future, then having ½, ¾ or even all of these links be of length 64 would a simple variation to implement.

With the 64-millimeter hop lengths the length-64 links 417 create in the present example, there is no need to have these longest links be a toroidal mesh, as the worst-case cost of three cross points is not significant relative to the numerous repeaters for efficiently driving a signal hundreds of millimeters. Thus all dimensions can use continuous meshes, which means that this design scales cleanly beyond a 256×256 array of 65,536 contacts because no dimension has a fixed number of contacts. Scaling cleanly is useful in extending the array out into the crescent of the wafer so that the full surface can be utilized rather than just the central 256 millimeters by 256 millimeters region, and it is a great simplification in extending the design to other sizes of wafers or other contact spacings. With other combinations of contact spacings and reticle sizes, the length-of-64 contacts would be adjusted to be an integral multiple of the reticle size.

To ensure that the design fits with today's lithography; the contents of the repeated unit cell can be evaluated and compared to other chips made with the same lithography. The unit cell consists of one element plus its links to other elements, or one contact plus one crossbar plus configuration memory for that crossbar, plus signal conducting links to other elements (the links from other elements will be considered part of the unit cell containing those other elements).

The contact can be a multi-purpose I/O such as is used in FPGAs; these are currently on a one-millimeter spacing when the FPGA is packaged, and the package has more than four times the area of the die inside. Thus a suitable contact and the flexible I/O circuitry behind it consumes at most ¼ of a square millimeter (and in actuality much less, because the total I/O circuitry occupies only a small fraction of the FPGA die).

With 14 dimensions, and each cross bar supporting a link in each of two directions in each dimension, a 28×28 crossbar is needed for each cell. This takes 784 cross points per cross bar with each cross point requiring one bit of configuration memory (while a full crossbar is not needed, as there would be no point in allowing a link in one dimension to couple to a link in the opposite direction in the same dimension, these savings are minor and are not worth the extra design complexity except when the crossbar space needs extreme optimization). This crossbar fits easily in the available ¼ square millimeter, as a large Xilinx Virtex-4 FPGA packs roughly 100 times that much configuration memory in with each contact in the aforementioned ¼ square millimeter; almost all of that memory is for configuring cross points, so we know that the cross points fit as well, this time with at least a factor of 400 to spare.

The metal links interconnecting cross points are the final piece to evaluate. Each contact is supported by a number of metal links; 1×64 millimeters, 4×32 millimeters, 4×16 millimeters and 4×8 millimeters, 4×4 millimeters, 4×2 millimeters and 7×1 millimeters, for 319 millimeters (319=64+128+64+32+16+8+7) of metal lines (in this most recent embodiment) passing over each one-square-millimeter 'cell' containing the cross bar and the contact. While this sounds like a lot, metal lines on semiconductors are measured in microns, not millimeters; 319 millimeters passing over each square millimeter is the same as 319,000 microns of metal lines passing over each million square microns. In today's advanced semiconductor processes, even the coarsest upper lines can be spaced closer than a 2-micron pitch, so less than 0.6 metal layers out of the 7 or 8 metal layers typically available is consumed. In implementation metal links would be spread out over at least two metal layers to allow for lines to cross, but would consume less than a third of each of these layers. The total length calculation also allows the number of repeaters to be bounded; even if a repeater were placed as often as every millimeter, there would be fewer than 300 per cell (319-28 because the cross-points act as repeaters as well), which is inconsequential because current lithography can achieve over a million repeaters per square millimeter.

An area of fine-featured circuitry the size of a 300 millimeter wafer would typically have on the order of a few hundred defects if it were made with leading-edge lithography, but because the interconnections are defect tolerant (since an alternate path can be chosen to avoid a defect), and because the contacts and the I/Os behind them do not require defect-prone fine features, the 'critical area' in the above embodiments is the area of the configuration memory, which is much less than 1% of the die area. Therefore even without further defect tolerance a decent yield of perfect wafers would be obtained, and the remainder would have only an occasional contact with a defective crossbar, and these could be tolerated by avoiding placing chips on them (much as large liquid-crystal displays are acceptable even though most have a defective pixel or two if one looks closely).

However the yield of fully functional wafers can be increased markedly by applying defect tolerance to the position-sensitive direct outputs, as taught in U.S. Pat. No. 5,801,715 by the present applicant. This uses more cells than necessary to support the outputs, in an overlapping arrangement that lets any of several cells control any given output (or contact in this case). Since there is plenty of circuit area available, 50% extra cells can be added at no cost, providing tremendous defect tolerance given the small critical area of each cell. To locate any such defects, a defect tolerant scan chain, as taught in U.S. Pat. No. 6,928,606, can be used. Configuration is the reverse of reading a scan chain, and can be similar to configuring FPGAs except modified to be defect tolerant in the same way as the defect tolerant scan chain.

Thus by using properly optimized large-area circuits, the many-layered embedded FPIC-based reprogrammable circuit boards of the first family of embodiments of the present invention can be replaced by a single large-area integrated circuit layer and can be packed using standard whole-wafer packaging techniques such as are used to produce chip-scale packages. Having the entire reprogrammable 'circuit board' produced in one piece, already wired together, and without the need for testing and packaging hundreds of individual FPIC chips, greatly reduces the cost of a reprogrammable circuit board as well as achieving full PCB density for system components without a massively thick PCB or one containing multiple embedded fine MCM-type layers.

An exceptionally preferred embodiment for supporting the flexible interconnection of a few hundred contacts to millions of contacts is a multi-dimensional continuous mesh with dimension hop lengths in power-of-two ratios in each physical dimension up to at least half the size of the longest common interconnections, and with partially populated dimensions of even longer links (padded with shortest links to form full dimensions) until dimensions where delay of a cross-point versus a repeater becomes inconsequential compared to the propagation delay (in this case the highest dimension), and matched to the size of the reticle image with which the pattern is made. The examples above are optimized for the interconnection lengths that dominate essentially all current PCB designs, but the embodiments can easily be adjusted for architectural changes in PCBs, such as longer connections becoming more plentiful, as well as to the specific physical realities of the process with which it is made and the contacts numbers and spacing of chips they are to support.

As previously mentioned, two other network families can also be made suitable for the substrate's internal interconnect network. The first of these, the hypercube, is equivalent to a mesh with a number of dimensions being taken to its limit of $\text{Log}_2$ of the number of cells, and with each cell having a link to only one neighbor instead of two in each dimension. With no more than one hop required in any dimension for any link, and with each cell having one link in each dimension, there are always enough links available and no replicated links are required. This makes for a very simple routing algorithm, and the crossbars are also much smaller, in this case 16×16 instead of 28×28, which takes 256 instead of 784 configuration bits per crossbar.

In unoptimized form a hypercube takes more metal; with links in each of to physical dimensions of lengths 128, 64, 32, 16, 8, 4, 2 and 1, it takes 510 millimeters of metal per cell to reach 65,536 contacts; this doubles to over a meter of metal per cell if one goes to 300×300 instead of 256×256. But this can easily be reduced; links of 128 and higher can be made sparse, which brings the total metal into the same range as the continuous mesh.

However while a hypercube has a comparable maximum hop count to the many-dimensional continuous meshes described in previous embodiments, the number and length of those hops can be much worse for the common short cases. This can be seen by considering the positions of the elements of a hypercube as binary addresses; as is well known in the art of hypercubes, if the addresses of two elements in a hypercube are 'XORed' together, the resulting bits that are ones equate to the dimensions through which the connection must traverse a link. This shows that in a hypercube two contacts that are physically close together can require very long links on the path between them, with the worst case being right in the middle of the wafer, where a contact with a binary cell position of (x=01111111, y=0111111) is physically only one cell away in both X and Y directions from the contact in cell (x=10000000, y=10000000), but to interconnect them would require two links of 128, two links of 64, two links of 32, two links of 16, two links of 8, two links of 4, two links of 2 and two links of 1, because the binary addresses of the two cells differ in every bit position.

It is known in the art that hypercubes are well suited to diagonal interconnects, where a cell has a link added to the exact opposite cell in terms of address. These diagonal links reduce the maximum hop count almost by half, and, more importantly in the current case, they eliminate using the very longest hops to go short distances. However they do not eliminate having to use the second longest links to go a short distance, such as from 00111111 to 01000000. And the diagonals can be expensive as well; for example, the diagonal from 00000000 crosses the entire wafer to 11111111.

Hypercube embodiments could take advantage of the scarcity of long interconnections in a PCB to remove the sparse longest dimension and to make the next longest dimensions sparse. The metal thus saved could be spent on additional links of 32 to bridge all places where interconnects would otherwise be forced to take hops of 64 and to then work backward, and for additional links of 16 where taking a link of length 32 would then require working backward, and for additional links of 8 where taking a link of length 16 would then require working backward, etc. But taking this to its logical conclusion of adding extra links of lengths 8, 4, 2 and 1 to prevent ever having to overshoot and work backward transforms the hypercube into a continuous mesh. In other words, optimizing a hypercube for the realities of a typical circuit board converges on the same solution as optimizing a continuous mesh for those same realities. Since a continuous mesh needs fewer optimizations, it is considered a simpler and hence preferred way of arriving at this optimum.

However not all systems fit the rule of short-range connectivity dominating or path length within the interconnections being important. For example, if the target system involved a hypercube (such as prototyping a successor to the 'Connections Machine' described in U.S. Pat. No. 4,805,091), then the connectivity of the hypercube would be a perfect match for the target system and a simple hypercube would have the most efficient metal and configuration memory use. In fact such a wafer-based hypercube would make an ideal interconnection system for such a system in production as well as for prototyping, and to enable really large systems the density should be as high as possible. A preferred embodiment for building systems with Hypercube-like interconnection length distributions thus uses hypercube interconnectivity within the programmable circuit board itself.

A third family of applicable interconnect arrangements is multi-stage, rather than multi-dimensional, networks. Clos-family multi-stage networks can be dynamically non-blocking, but the rearrangeably non-blocking Beneš subfamily is preferred because with only a few connections, such as to debug connectors, being added or modified while the system is running, only a small capability to move or create connections without affecting other connections is required. A rearrangeably non-blocking Beneš network takes just over half the resources of a dynamically non-blocking Clos network, and with typically more pins being devoted to power and ground (and hence not needing internal interconnection resources) than would be dynamically rerouted to debug connectors, ample flexibility is provided for rearrangement.

A Beneš network interconnects a large umber of entities through a series of stages, each of which can reach a fixed number of intermediate entities. The number of entities of the next stages reachable for one entity of the current stage is known as the 'fan-out' of that stage. Typically Beneš networks are symmetric, so that for every stage of fan-out N on one side of the center stage, there will be a fan-in of N on the opposite side. For simplicity in explanations, therefore, only the fan-out stages will be discussed except in non-symmetric cases.

Each time another stage with a fan-out of N is added, N times as many entities can be reached. Thus a high fan-out allows a very large number of entities to be reached in relatively few stages. This minimizes the delay because interconnections pass through the fewest cross points, and also because there are more choices at any stage allowing more direct paths to be chosen, minimizing path length on any given interconnection. However high fan-out is more costly in terms of cross points; the number of cross points per stage is proportional to $F^2$, where F is the fan-out. The number of stages, in contrast decreases much more slowly, being proportional to $\log_F(\text{entities})$.

Thus if minimal delay is important, then a high fan-out is used, and if cross point area is important, more stages of a lower fan-out are used. Even when delay is critical, a high fan-out quickly reaches a point of diminishing returns. For instance to interconnect 16 million entities takes 24 stages if a fan-out (and fan-in) of two is used, which is reduced to 12 stages with a fan-out of four (for a savings of 12 stages). However a fan-out of eight still takes 8 stages, saving only four more stages while costing even more in cross points, and going to a fan-out of 16 saves only two additional stages at a very high cost in cross points. Previous work on Beneš networks, such as U.S. Pat. No. 6,940,308 has evaluated these tradeoffs between cross points and fan-out stages.

But an un-modified Beneš network for the most common short-range interconnections, as these must go all the way to the center stage of the Beneš network and back, just as the long connections do. Doubling the size of the crossbars helps by allowing an interconnection to shortcut back toward the target contact when the contacts being interconnected are on the same branch, avoiding going through more central Beneš network stages. But just as with a Hypercube, contacts that are physically close can be on different branches, so links between adjacent branches are needed to prevent these from having to travel to the center of the network and back.

But even after these modifications, a Beneš network is not optimal for the most common short-range interconnections because it provides as much interconnection capacity between contacts across the entire system from each other as it does between contacts that are near to each other. Since almost all systems have fewer than 10% of their interconnections span a significant fraction of a circuit board, supporting an equal number of these longest links is excessive, and the longest links, which are the most expensive in terms of metal, can be made sparse. Making the long links sparse can be accomplished by making the central stages have a lower fan-out per cross bar, but not increasing the number of crossbars per stage.

Figure 4C:
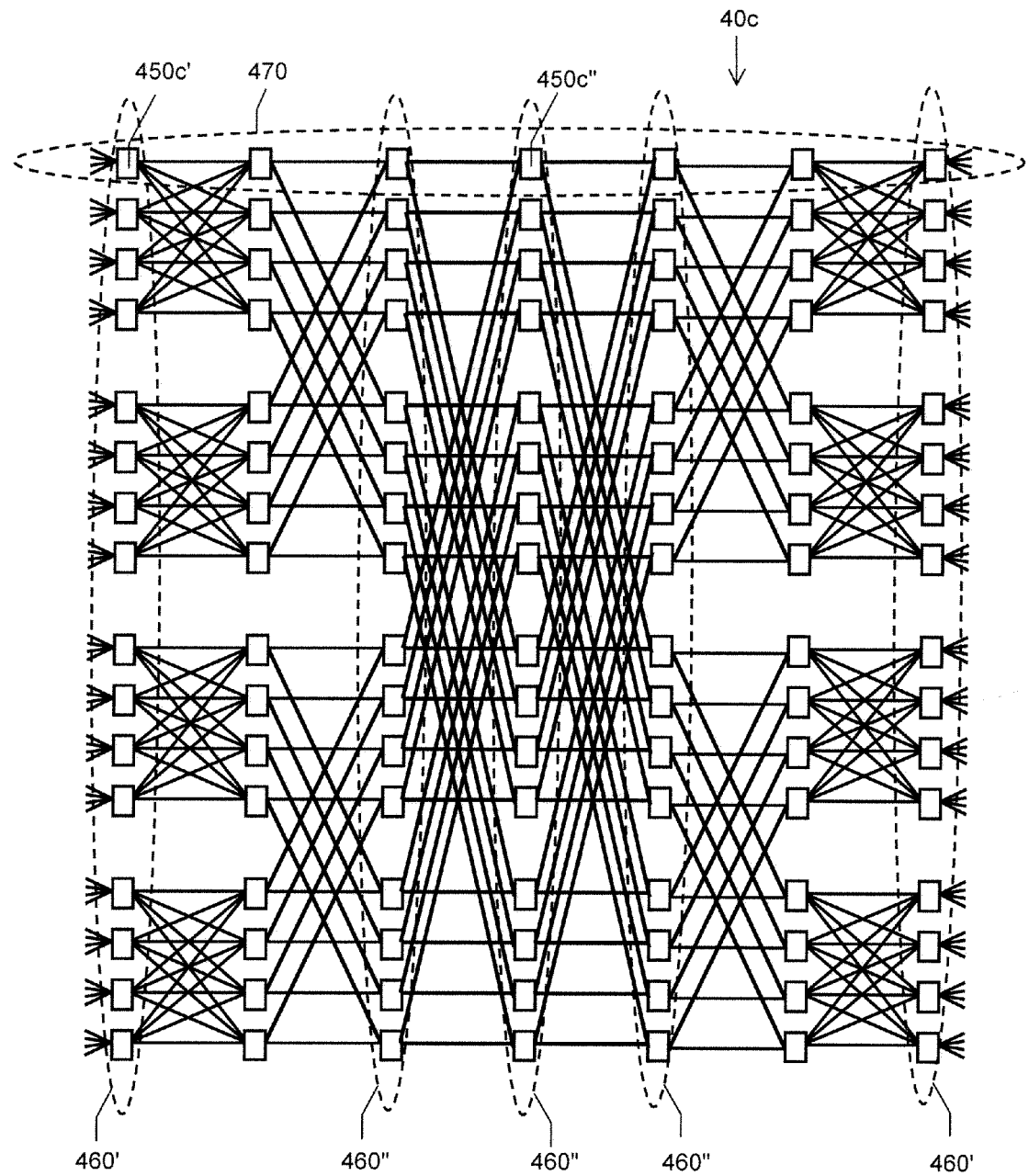
FIG. 4C is a depiction of a Beneš interconnect network with spare central stages for a reprogrammable circuit board.

For example, if the leaf stages have a fan-out of 16 and the central stages have a fan-out of two, then a factor of eight in sparseness can be achieved by simply decreasing the fan-out. With the three most central stages in each physical dimension having a fan-out of two and the other stages retaining a fan-out of 16, the total metalization for a Beneš network for interconnecting contacts is reduced to comparable to that of a continuous mesh. A simpler example of this is illustrated in FIG. 4C, where leaf stage cross bars 460' of centrally-sparse Beneš network 40C have fan-outs of 4, and the central-stage cross bars 460" have fan-outs of 2, but there are only as many low-fan-out cross bars 460" per stage as there are high-fan-out cross bars per stage.

A further issue that must be addressed with a Beneš network is that in a traditional implementation the cross points are grouped by stages, which produces a non-repetitive pattern across a Beneš network in contrast to the needs of a wafer-scale implementation with reticle-based deep-sub-micron lithography. However if each cell contains, in each of the physical dimensions, an entire row 470 of the Beneš network as drawn in FIG. 4C, or one cross bar for each stage from leaf stage crossbar 450C' to center stage crossbar 4500" for connections to send to other cells, and also one cross bar for each stage from center to leaf for connections to receive from other cells, then although the connectivity is logically still the same, physically the cross bars of the Beneš network are grouped by contacts rather than by stages (having the same number of crossbars per stage makes this possible). For each stage that crosses reticle boundaries, a physical interconnect arrangement is also needed that uses identical reticle images while allowing each cell to send to its corresponding cells in other reticles. Such an arrangement is disclosed by the present applicant in U.S. Pat. No. 7,055,123.

Together these transformations allow the Beneš network to be a sea of logically identical cells that are made with physically identical reticle images. Since this is the most suitable case for wafer-scale implementation, especially preferred embodiments of the present invention that use a Beneš network implement that network as equally spaced, logically identical cells lithographed with substantially identical reticle images.

While this is sufficient to fit a Beneš network interconnecting a wafer full of 1-millimeter cells, applying the constraints derived from typical real circuit boards and pruning unnecessary links has once again converge upon an answer similar to that achieved by adding sparse longer links to the continuous mesh. In approaching this optimum, the continuous mesh has several advantages; it naturally has a structure that matches the requirement of identical reticles, it is extensible to larger arrays of contacts with no modifications unless the distribution of interconnection distances changes, and the link lengths in its internal network are exponentially distributed, whereas while a Beneš network has the link lengths linearly distributed within a stage and is only exponential from stage to stage.

The Beneš network has an advantage in that it is trivial to make the crossbar area smaller at the extent of extra stages passed through by interconnections, but this comes at the expense of flexibility in the order of the hop lengths; while reducing the crossbar area is somewhat more complex with a continuous mesh, it can be accomplished with fewer added cross points passed through for typical interconnections (optimizing continuous mesh crossbars is dealt with in detail in the sixth family of preferred embodiments of the present invention). This eliminates the Beneš network's one advantage, leaving the continuous mesh as the generally preferred embodiment for programmable circuit boards. Of course for specific systems whose topology matches a Beneš network, a full Beneš embodiment is preferred.

Third Family of Preferred Embodiments

Conductive Programming Elements

While the above embodiments of reprogrammable circuit boards of the present invention provide all of the advantages of an FPIC-based reprogrammable circuit board at a lower cost and at the full density of packaged chips, they rely on transistor-based cross-points to program the interconnections between contacts, just as FPIC-based reprogrammable circuit boards do, and while cross points in a modern lithographic process are suitable for digital signals up to a few gigahertz, they are not suitable for analog signals or for radio-frequency (RF) digital signals in the tens of gigahertz. The antifuse-based one-time programmable circuit boards and MCMs discussed in the prior art statement do support such signals through establishing low-resistance conductive paths through the programming elements, but they are not reprogrammable.

Although the analog and RF markets are not as large as the digital PCB market, they are not insignificant. A third family of preferred embodiments of the present invention therefore builds on the large-area circuit principles of the second family of preferred embodiments, providing each cell with control logic to establish reprogrammable conductive paths through the programming elements. Reprogrammable conductive paths through the programming elements can be established in many ways, several examples of which are discussed hereafter.

A first suitable technology for reprogrammably establishing conductive paths is MEMS, or micro-electro-mechanical systems, a set of technologies that can produce micron-scale moving parts on silicon or other wafers. In the present invention, each cross point of the second family of preferred embodiments can be replaced with a MEMS actuator that is operable to reversibly bring two metallic (or other conductive) members into contact. If these conductive members are conductively coupled to the metal links between cells, then a low resistance conductive path capable of carrying analog or RF signals can be reprogrammably established. Since such MEMS elements are much larger than transistor-based cross-points, especially preferred embodiments that use MEMS actuators use an interconnect architecture that minimizes cross points at the expense of metal links, such as the hypercube-based network embodiments discussed previously.

A second suitable set of technologies for reprogrammably establishing conductive paths is NEMS, or nanometer-scale electro-mechanical systems. A suitable example is the flexing of carbon nanotubes to make contacts as Nantero, Inc. is using for memory systems. Analog and RF signals require low resistance and low inductance, and an individual carbon nanotube has an inductance in the kilo-ohm range, but inductance and resistance scale inversely with the number of conductive elements in parallel, so having a large number of contacting nanotubes in parallel reduces the resistance by a comparable ratio.

The cell size for such reprogrammable conductive connections can be extremely small for memory systems; Nantero is quoting cell sizes on the order of 0.001 square microns per contact, and the Nantero memory bits have on the order of dozens of nanotubes in contact. The several thousand nanotubes needed to get into the sub-Ohm range needed for high-speed and analog signals would thus fit in under one square micron, and so the on the order of 1000 reprogrammable conductive links would take under a thousand square microns, or under 0.1% of the available area per cell. Thus a second preferred embodiment of the reprogrammable conductive paths family of embodiments uses NEMS to reprogrammably establish conductive paths, and uses enough such NEMS elements in parallel for each programmable element to bring the resistance and inductance to the appropriate level for those conductive paths. Especially preferred embodiments comprise the ability to determine the resistance and increase the number of NEMS elements use for any given programming until these value reach the appropriate level. The space of a cell in a modern lithographic process provides for a granularity of several hundred steps even if a configuration bit is assigned to each step, and a binary coding scheme would provide a thousand levels using a trivial amount of configuration memory.

A third technology for reprogrammably establishing conductive paths is to use the rearrangement of atoms or molecular states. Numerous examples have been developed for the memory industry that are capable of achieving the needed reprogrammability; the current work in the memory industry is to match DRAM or SRAM speeds and densities of about 10-to-the-$16^{th}$ states switching per square millimeter per second. While these potential memories still have not replaced SRAM or DRAM in commercial production, this family of embodiments of the present invention needs only 1000 state changes per square millimeter and would be acceptable if it took 100 seconds to program (all the programming would be done in parallel, as there is plenty of room for control logic in each cell, and 100 seconds is far faster than the many days of turn-around for fabricating a complex PCB). Thus the switching needs of the present invention are only a millionth of a billionth as demanding as for the memory industry, although a few orders of magnitude are lost in bringing resistance down to the right level.

The most developed suitable technology in this third set is phase-change memory materials (such as chalcogenides), which are serious contenders to replace DRAM, SRAM and flash memory; however any such process that dramatically changes conductivity is suitable. In the chalcogenides phase-change memory case, regions nanometers in diameter undergo three orders of magnitude of resistance change upon reversible crystallization, achieving a value in the kilo-Ohm range (see article "PRAM Process Technology"), and this low resistance is precisely controllable by varying the time of the programming current. Thus the equivalent of around 500 such elements in parallel would achieve the low resistance needed for typical conductive paths for high-speed signals, and around ten thousand in parallel would achieve the even lower resistance needed for analog signals, even with passing through several dozen programmable connections on a given path.

Test chips for the memory industry such as that by Samsung (see article "PRAM Process Technology") have already achieved 64 million such cells on a chip at a density of over 2 million per square millimeter even in a relatively coarse 180 nanometer process, with a billion-fold faster switching speed than needed for the present invention. For high-speed signals 250 PRAM bit cells in parallel takes around 0.025% of a one-square millimeter cell, and even for analog signals the PRAM area needed is under 1% of the available substrate area.

Advanced memory technology conferences have a host of other contenders for replacing today's RAMs; any of these that can produce the requisite resistance and impedance in an area of 1000 square microns (0.001 square millimeters) is suitable for this family of preferred embodiments of the present invention. Thus another preferred embodiment of the conductive programming elements family of embodiments of the present invention uses the rearrangements of atoms (such as electrolytic conductive bridging) or of molecular states (such a phase-change memories) to reprogrammably establish conductive paths, and gangs together enough such elements in parallel for each programmable element to bring the resistance and inductance to the appropriate level for those conductive paths. Especially preferred embodiments comprise the ability to determine the resistance and inductance and reapply the programming current (or voltage) for any given path until these values reach the appropriate level. Suitable control logic for each of the above technologies is well known in the art because the control logic for their potential use in the memory industry is more than sufficient for the needs of this family of embodiments.

Fourth Family of Preferred Embodiments

Enhancements Enabled by Large-Area Integrated Circuits (LAIC)

The LAIC interconnect networks of the second family of preferred embodiments also overcome an additional drawback of the prior art of programmable circuit boards in general (both reprogrammable and one-time programmable circuit boards) and even impact fixed-function circuit boards. The power required to drive a given type of signal from the contact of one chip to the contact of another chip depends on many factors, with distance being of primary importance but including other factors that affect signal integrity as known in the art, such as impedance mismatches, cross-talk, reflections, etc.

With the reprogrammable circuit boards of the first family of preferred embodiments of the present invention, the maximum path length from a contact of an affixed component to the first transistor of the reprogrammable circuit board is less than one centimeter, and in the second family of preferred embodiments it is less than one millimeter. A centimeter is shorter and a millimeter is much shorter than the length of a comparable connection in a standard PCB or an FPIC-based reprogrammable circuit board, in which most connections are several centimeter and a few connections are tens of centimeters. Thus either of these families of preferred embodiments allows affixed components to use much less power in driving their contacts than fixed-function or FPIC-based reprogrammable circuit boards. Since power is a key limiting factor in system designs, this allows system chips to be packed more densely or to run faster.

Many components that can be affixed to a PCB (such as FPGAs) have adjustable power levels for driving their contacts depending on specifics of the connection they are driving, and these can be set to their lowest power levels when using the embodiments of the present invention. Also, future chips designed to be used on LAIC-based PCBs can build in and use even lower power level, comparable to those for driving millimeter-length on-chip connections, and can thus use smaller drive circuitry as well as less power.

The ability of the LAIC interconnect networks of the second family of preferred embodiments to have active circuit elements anywhere in the interconnection path also allows overcoming other drawbacks of the prior art of reprogrammable circuits and of circuit boards in general, and a fourth family of preferred embodiments thus uses this ability to overcome these drawbacks.

While multiple interconnect hops that can be centimeters long are involved in the present invention, which without further work would make total path lengths comparable to or even slightly longer than those on fixed-function circuit boards, these hops are through fine micron-scale wires with very low capacitance, and buffer insertion tools well known in the art of integrated circuit design can automatically insert repeats at optimum locations to keep the total power low and the signal propagation speed high. As well as speeding transmission and reducing the power needed for a given voltage swing, repeaters clean up accumulated noise and thus reduce the voltage swing needed to maintain the integrity of the signal, which further reduces power.

While a traditional circuit board or even a reprogrammable circuit board can use repeaters, each pass through a repeater requires exiting the circuit board into a contact for an active component affixed through that circuit board, passing through a repeater capable of driving the signal to the next repeater, and passing through a contact back into the circuit board. Clearly having multiple repeaters on every interconnection would be prohibitively costly in PCB real estate due to the multiplication of the contacts involved. However in this family of embodiments of the present invention, repeaters can be placed as often as desired on every interconnection because they can be built right into the large-area integrated circuit as it is fabricated at essentially no cost in area, as each repeater takes less than a tenth of a square micron (a ten-millionth of a square millimeter) of silicon and takes no extra metal area (and repeaters can even be split into pairs of spaced-apart inverter to cut their area in half). A preferred embodiment of this fourth family of preferred embodiments therefore uses repeaters in each interconnection link, placed so as to minimize the total power needed to reliably send a signal at a high propagation speed.

Traditional circuit boards also need huge numbers of passive components; capacitors and resistors for terminating signal lines with minimal reflections, and ferrite inductors for very high-speed transmission lines. For extremely fast signals many of these have been brought on-chip, reducing the problem somewhat from the PCB perspective, and some PCBs have capacitive layers to reduce the need for capacitors, but PCBs are typically still littered with these small passive components, adding cost and reducing density. However with the maximum signal length driven in a single hop being shortened by the use of numerous repeaters, the resonant frequency of ringing on signal lines is increased to where it is not significant for digital signals. Even for 2 GHz digital signals (the fastest non-differential signals on the highest-end FPGAs today, a half-millimeter repeater spacing is sufficient to minimize ringing; this takes less than 0.01% of the available circuit area for repeaters. Especially preferred embodiments therefore include repeaters on each interconnect spaced closely enough to keep the transmission time between repeaters at less than 1/10 of the rise time of the fastest expected signal (the 1/10 rule is well known in the art of minimizing reflections).

Being an integrated circuit, a LAIC-based circuit board can also contains capacitors and resistors, allowing any programmable termination technique from the FPGA industry to be used (in addition to preventing ringing through having short distances between repeaters). These signal integrity enhancements and the tiny distances between the send circuitry on the substrate and the receive circuitry on the component (or vice versa) greatly simplify the flexible I/Os, reducing their size to hundreds or even tens of square microns, which is of great help in achieving high density.

Another drawback of the prior art of reprogrammable circuits and of circuit boards in general, is that when the interconnections between components include a differential pair of signals or a bus of several or of many signals, it is difficult to route all of those interconnections so that signals in parallel arrive at the same time. The time difference between the arrival of the first and last signals is referred to as 'skew', and it has many sources. First, there may be inconsistencies in the circuits sending the signals that cause the signals to be generated at slightly different times; this is usually very small because H-tree clock distribution and other techniques well known in the art of skew minimization can be used to reduce this to a few picoseconds. Second, the paths from the signal (I/O) contacts through the packaging to the contacts of the sending chip may vary in length from one another by up to a centimeter, creating several tens of picoseconds of skew. Third, the path lengths on the PCB can vary from one another; PCB designers put great effort into avoiding having this be a very large factor, but the work involved climbs rapidly in reducing it from several hundred picoseconds (easy) to a hundred picoseconds (moderately difficult on complex boards) to tens of picoseconds (very difficult). Fourth, the path length from the contacts of the PCB through the package to the signal contacts of the receiving chip can introduce several tens of picoseconds of skew. And fifth, there may be a few picoseconds of internal skew within the receiving chip. FPIC-based reprogrammable circuit boards are especially skew-prone because the skew accumulates as signals through the circuitry and packages of multiple components, and signals may even traverse long links that are not length-matched.

The more skew that has accumulated, the harder it is to recover the signals at a receiver, and this difficulty grows rapidly as signal rates increase due to the relative size of the skew to the clock period of the signals. However while traditional PCBs are contributors to skew (and require large amounts of design work to keep them from becoming even bigger contributors), the LAIC-based circuit boards of the present invention can remove skew before it accumulates. Even for non-reprogrammable LAIC-based circuit boards similar to any member of the second family of the preferred embodiments, but with repeaters replacing the cross points that would have been selected to program the reprogrammable circuit board for what is now in the non-reprogrammable design, skew removal can be accomplished by having circuitry comparable to the receive circuitry of the receiving chip.

Because the LAIC circuit board length traversed from the sending contacts to the integrated circuit containing this receive circuitry elements of this receive circuitry is less than a millimeter, this introduces at most a few picoseconds of skew, thus accumulated skew is at worst the few picoseconds of sending circuitry skew, the few tens of picoseconds of sending package skew, a few picoseconds of circuit-board skew and the few picoseconds of receiving circuitry skew. This is far better than the standard PCB case where instead of a few picoseconds of circuit board skew, there are tens of picoseconds of both PCB and package skew added. Hence receive circuitry like that in the receiving chip (and thus already known in the art), is easily sufficient to recover the reduced skew (and even simpler receive circuitry will suffice).

The LAIC circuit board can then re-drive the signals using send circuitry like that in the sending chip, with the same few picoseconds of skew. With the several-hundred-fold increase in routing capability of an integrated circuit versus a PCB, it should always be trivial to keep the signal path length close enough to identical to avoid more than a few picoseconds of added skew. However even if skew were to accumulate, the receiving and re-driving circuitry could be repeated to de-skew the signals again every time a skew comparable to the package skew had built up. In particular it may be useful to de-skew the signals at the end of their path through the LAIC circuit board, just prior to sending them to the receiving chip. In this way the skew never builds up beyond a few picoseconds of skew each from one copy of sending and receiving circuitry, plus skew equivalent to the few tens of picoseconds of package skew. Having a lower maximum skew allows the signals to be driven at higher rates, which allows data to be transferred faster.

A preferred embodiment of this fourth family of preferred embodiments of the present invention therefore includes de-skewing circuitry within a non-programmable LAIC-based circuit board, and in a further preferred embodiment this is within one millimeter of the receiving substrate contacts. Especially preferred embodiments have further de-skewing circuitry within one millimeter of the receiving component contacts, and even further preferred embodiments have additional de-skewing circuitry every place where a set of signals will have built up as much additional skew as the skew of the package of the sending component.

In addition to applying de-skewing circuitry to non-programmable circuit boards, de-skewing can be applied to one-time programmable and reprogrammable circuit boards; this is key because in prototyping the cost of designing a PCB for low skew is not amortized over large production runs, and these programmable circuit boards are usually used for prototyping. With programmable circuit boards there are additional challenges; the contacts that will make up a bus are not predetermined, and even the bus size is not pre-determined. However one simplification is that with the very closely spaced lines and the frequent repeaters of a LAIC circuit board of the present invention, a differential pair can be treated as a bus of width two, rather than as a separate type of entity. Also, the contacts for the signals that make up a bus are generally close together (usually within a centimeter), and very wide busses usually treat groups of 16 to 36 contacts as separate entities with separate clocks to make de-skewing easier, so it is not necessary to handle extremely wide busses (such as 256-bit wide cache busses) as single units.

Figure 5:
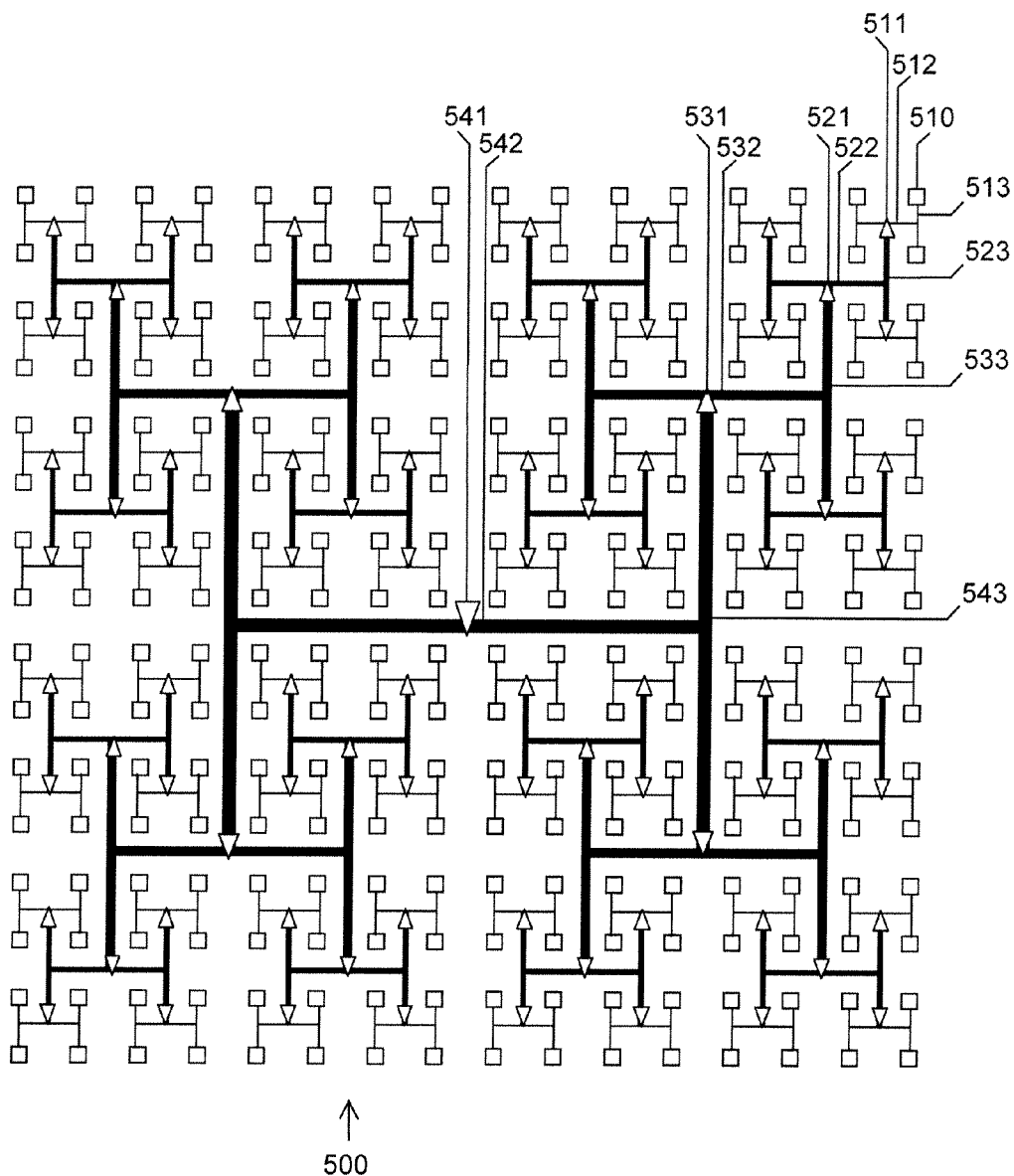
FIG. 5 is a depiction of an H-tree for sending clock signals for bus retiming to minimize skew in a reprogrammable circuit board.

The key component of de-skewing circuitry is the distribution of the clock signal that coordinates the receiving and the re-sending of the signals. An H-tree clock distribution, as shown in FIG. 5, uses a series of H-shaped branchings of decreasing size to distribute a clock signal to a number of end-points. As is well known in the art, if each branch of an H is the same length, then very little skew is introduced into the clock signal. By providing multiple H-trees for distributing clocks and the ability for any given cell to choose which H-Tree to use in de-skewing the bus of which its contact is a member, the need to have a predetermined bus to de-skew can be eliminated.

An H-tree distribution network 500 starts with the center of the largest H, in this case repeater 504, at the center of the area that the clock is to be distributed to. For illustrative purposes this is taken to be an area 16 contacts on a side; this is far more than is needed for almost all bus de-skewing needs, and allows the pattern to be clearly seen. The repeater 541 at the center of this first H drives two horizontal shoulders 542 each being ¼ the length of a side of the distribution area, or in this case a length of 4 cells, and each of these shoulders 542 ends in an arm 543 and a leg 543. Because a leg and an arm of the H are identical in function, they both have the same reference number, and they will hereafter be referred to collectively as 'arms'.

At the end of each of the four arms 543 of the central H is a repeater 531, which drives two shoulders 532, each of length 2; these shoulders each end in a pair of arms 533, also of length 2. The pattern repeats recursively; each of these arms 533 end in a repeater 521 that drives two shoulders 522 of length 1, each of which ends in two arms 523 of length 1. Each of these arms 523 ends in repeater 511 that drives two shoulders 512 and their arms 513, all of length 1/2. At the end of each of these smallest arms is an element 510, containing the contact and its interconnection cross bar. Collectively the 256 end-points of these final arms form a 16×16 grid with a spacing of 1, with all paths from the center of the central H being identical in length and number of intersections, which is what is needed to deliver a clock with no skew.

The final continuous mesh embodiment of the second family of preferred embodiments of the present invention has connections of exactly the lengths needed for H-trees supporting areas of up to 128×128 contacts (initial arms and legs of length 32). Each contact that joins an H-tree will use at most one link of length 1 in each of two directions to join the tree, plus at most one link of lengths 2, 4, 8, etc. up to the size of the central H, and since each contact is supported by at least twice that many links of each size, there are enough links of all sizes for twice as many unique H trees as there are contacts. And since there is no point in having an H-tree with fewer than two contacts, a network such as this continuous full mesh has at least four times as many links as are necessary.

Thus one preferred embodiment supports multiple H-trees with contacts programmably joining any H-tree in a bus-sized area by including a separate continuous mesh of 14 dimensions like that described in the second family of preferred embodiments, but with the hybrid dimensions of length-64 and extra length-1 links replaced by links of length %. By setting the appropriate cross points for this mesh, H-trees can be configured as needed; also since arms that would have no contacts need do not to be configured to be part of the H-tree, the power required by the H-trees is greatly reduced.

But the maximum number of contacts in a de-skew group is likely to be 36 or fewer because high-speed chips today typically include a clock signal at least as frequently as every 36 bus lines. Although the contacts in a de-skew group may not be packed into a minimal-sized square, they are generally physically close together, so they will almost always be within a region 16 contacts on a side. A de-skew diameter of 16 contacts requires a first-H arm length of only 4, so all of the dimensions with longer links are superfluous. Thus an 8-dimensional continuous mesh with X and Y link lengths of ½, 1, 2, and 4 is sufficient to configure any set of H-trees likely to be needed, and forms an especially preferred embodiment. Since the number of cross-points grows with the square of the number of dimensions, this reduces the cross point area for the H-tree network dramatically compared to a 14-dimensional continuous mesh.

As discussed above, this continuous mesh has four times more links than is needed for implementing the number of H-trees that are likely to be required. While reducing these links to a hybrid dimension of the four link lengths for the physical X dimension and another hybrid dimension for the physical Y dimension would take up fewer resources, the 8-dimensional mesh only takes up 0.02% of the available circuit area for cross points and only about 0.5% of the available metal for links (0.03 layers), so the added complexity of additional optimization is generally not worthwhile.

If all interconnection paths on a bus go through links of the same lengths, then no appreciable skew should be added. Although normally the objective of routing a connection is to minimize the number and the length of the hops, in preventing bus skew one cannot do better than the worst signal. Therefore preferred embodiments use a routing program that makes each path as short as possible, and then adds links to the shortest paths within a bus to make them equal to the worst-case path length within that bus (the extra dimensions of shortest hops are suitable for this). In this case the hop lengths are all integers, and a path length cannot be increased by one because then it could not end on the same contact. Therefore the best that one can do is to come within a single hop of length-1 of matching the path lengths to the worst case. Thus especially preferred embodiments include a selectable delay line, with a delay equal to the delay of a hop of length-1, after the final crossbar that completes the interconnect.

An alternative to avoiding adding skew is to de-skew a bus before sending its signals to the contact of an external component. Another preferred embodiment therefore includes an additional H-tree for clock distribution to coordinate the de-skewing of a bus when sending just prior to sending its signals to an external component.

If knowledge of the signal skew in the package is available, then any skew longer than a half a single hop of length-1 can be included by rounding this to the nearest such length and taking this into account in the routing program. This can be applied to the sending package if its skew were for some reason to exceed the de-skewing capabilities of the incoming de-skewing circuit, but more importantly it can be applied to the receiving component package to add routing equal to the inverse of the package skew before sending to that external component. Especially preferred embodiments can use this to ensure that the skew at the integrated circuit inside the receiving component package is no more than the delay of a hop of length-1, which in a modern process would be roughly 20 picoseconds.

Another drawback of the FPIC-based electronically reprogrammable circuit boards of the prior art is that while the type of signal on any signal contact can be flexible (as with FPGAs), the distribution of power and ground pins is predetermined. Although there are only a few standard contact spacings and it might be possible to get all major components for a system with the same standard contact spacing (such as a 1-millimeter pitch), each family of chips has its own pattern of power and ground contacts. FPIC I/Os cannot drive power or ground pins (I/O drivers of 8 mA (milliAmperes) to 24 mA are nowhere near strong enough to drive power pins that typically require 200 mA to 800 mA (and sometimes as much a 1 Ampere), and power electronics cannot switch fast enough to be useful as I/O drivers, since I/O signals typically convey at least 100 megabits per second per contact, and not infrequently convey as much as one gigabit per second per contact. Thus while an FPIC-based electronically reprogrammable circuit board may allow the number of components to vary and the capacity of a component to vary within a family, and may allow interconnections between chips to be reprogrammed fairly freely, the types of chips it supports are predefined. As previously discussed, U.S. Pat. No. 5,426,738 addresses this by having the ability to connect power contacts to power and ground contacts to ground by manually inserting jumpers, while using FPIC for the signal contacts, however this is highly inconvenient for high-end circuit boards that may have thousands of power and ground contacts.

Usually FPIC-based systems comprise arrays of sites for FPGAs, each surrounded by memory, and the FPIC network handles only the interconnections between the FPGAs. Sockets can be provided for any other components needed; thus any other component needs either to be mounted on a small 'daughter board' PCB built specifically for it that connects through a standard socket, or an adaptor socket that remapped its contact pattern had to be developed specifically for that custom component. As with FPIC-based reprogrammable circuit boards, LAIC embodiments of the present invention can use an adaptor socket that adapts a different pattern of contacts to the pattern on the LAIC-based reprogrammable circuit board, but adapters add complexity, decrease density and impair signal integrity, and custom adapters would be needed for custom chips.

To overcome these drawbacks of the prior art, the LAIC-based electronically reprogrammable circuit board of a further preferred embodiment of the present invention provides multiple transistors capable of driving any given component contact site, with at least one such driver being operable to drive I/O signals at typical I/O signal strengths and speeds, and with some or all of the drivers in each component contact area being able to drive in total the current expected for a power contact and to sink in total the current expected from a ground contact. In an especially preferred embodiment the I/O-speed driver is a multi-purpose I/O driver such as is found in an FPGA. In this way if the contact of the affixed component is a signal contact, the flexible I/O driver is used and the other drivers are turned off so that they will nominally not conduct either to or from the component contact site.

Because the power drivers are only switched between off and on during configuration, their switching speed is not an issue. This opens up conductive technologies such as the MEMS, NEMS and molecular state-change technologies discussed in the third family of preferred embodiments of the present invention, as well as slower power transistors and multiple ordinary CMOS I/O drivers in parallel. The MEMS and NEMS technologies are attractive because they provide an extremely high ratio of on-to-off conductivity, and they could be incorporated even if the far more numerous link-programming elements are not MEMS or NEMS; however they are not yet standard in a mainstream CMOS process.

Technologies other than CMOS tend to have small leakage currents that could cause problems if not ameliorated. One step at amelioration is to eliminate the leakage in those contact sites that are not covered by component contacts. Providing each driver type with its own small conductive mini-contact, in the area for the component contact, and insulating these from each other, eliminates the leakage between power planes and ground planes at those contact sites where there is no conductive component contact bridging them.

But if a component contact bridges the mini-contacts, leakage through the big power transistors could gradually raise the voltage until leakage out balanced it at about half of the power plane's voltage, which could cause spurious signals (although some high-speed I/Os are deliberately precharged to half-voltage so that they can switch to either state faster, there are other types of I/Os that would not handle this). Further preferred embodiments therefore include the appropriate means to minimize leakage and to prevent charge build-up. In the non-transistor cases, to keep the voltage from building up, a high-resistance link can allow charge to gradually bleed to ground. Resistors in the hundred-kiloOhm range per signal contact will consume in the aggregate roughly one Watt for a reprogrammable circuit board using a whole 300-millimeter wafer, with all contacts of affixed chips, except for a few grounds, drawing power or driving signals.

In transistor-based embodiments, transistors are being fabricated anyway for switching purposes, so using transistors to connect any contacts that are power or ground connections to power or ground would be the simplest solution. However if done using compact high-speed transistors, the aggregate of the tens of thousands of contacts on a programmable circuit board would in total consume too much power. For example, the article "65 nm Transistors for a 90 nm CMOS SOC Platform" shows that even with NMOS (the Negative part of CMOS that uses negatively charged electrons for conducting current), the highest drive strength of roughly 1000 micro-Amps per micron has an off-current (leakage) of roughly 3 microAmps per micron, or an on/off ratio of roughly 330. If each of roughly 66,000 contact sites on a 300-millimeter wafer-sized region were to be capable of driving a one-ampere power contact, this would be 200 amperes consumed by leakage current, which would far exceed the total current of all affixed components.

Fortunately switching speed is not an issue for the power transistors, so for transistor-based power mini-pads the transistors can be made with thick oxides and can be heavily biased, keeping their leakage very low and reducing the aggregate leakage power to below one Watt, and the transistors to ground can be slightly leakier to allow current to leak out more easily than to leak in. Reducing leakage current does decrease the drive strength for a given transistor size, but the reduction in leakage is exponential while the reduction in drive current is merely linear, so leakage can be greatly reduced at an acceptable cost in drive current.

The article "65 nm Transistors for a 90 nm CMOS SOC Platform" also shows that for advanced NMOS transistors in a 90-nanometer process, leakage can be reduced from roughly 3 micro-Amps per micron to roughly 0.003 micro-Amps per micron at a cost of reducing the drive strength from roughly 1000 micro-Amps per micron to roughly 600 micro-Amps per micron; or a 1000-fold reduction in leakage for less than a two-fold reduction in drive current. The Large-Area Integrated Circuit implementation of the second family of preferred embodiments of the present invention provides more than sufficient circuit area for the lower leakage power transistors; any given contact site could have a one-ampere power or ground contact, which would require 1.7 millimeters of gate length for the main power transistor.

The driving transistor for a power mini-pad can consist of a single transistor, or of multiple transistors ganged together. Since switching speed is not an issue, a long series of increasingly large transistors is not needed, and a short chain makes more optimal use of transistor space. Using a transistor chain where each is at least ten times larger than the previous in the chain keeps the aggregate gate length of transistors for a power mini-pad to under 2 millimeters, and in a 90 nanometer process this can be packed into a region of approximately 700 square microns, or 0.07% of the available one square millimeter.

It is fortunate that the area required is so acceptably small, because modern PCBs typically have multiple "power planes" with different voltage levels, and may even have separate ground planes for digital and analog grounds. Typically there are two to four power planes and one ground plane. Since on-die pads a few tens of microns on a side are capable of handling the current of a power pin, and since even in an ordinary CMOS there is room for multiple power transistor chains, especially preferred embodiments include a separate power mini-pad for each power plane and ground plane in the reprogrammable circuit board, and in even further preferred embodiments this includes at least four power planes and at least one ground plane. This lets contacts of affixed components be reprogrammably connected to the appropriate power and ground planes without having to predetermine which contact sites will be connected to which power and ground planes, and even with 6 planes connectable, it uses under 0.5% of the available circuit area.

While the above embodiments solve the issue of connecting unpredetermined affixed component contacts to unpredetermined power and ground planes, the distances that the currents in those planes must be carried are larger than in a traditional chip, and are more akin to the distances involved in a circuit board. Also the total power consumed by multiple affixed components, of which many are likely to be traditional chips, will typically be higher than for any given single traditional chip. And here the finer-pitched lithography of integrated circuits is a disadvantage, as building a much thicker power layer while building the circuitry would require either modifying the carefully tuned process steps, or adding many process steps to build the thick power and ground planes out of large numbers of traditional-thickness layers.

While it is possible to add the thick power layers with traditional lithography, it is a considerable expense. A much better solution is therefore to form the power and ground layers with a circuit-board or MOM process, which costs less per area and already uses layers so much thicker that they are typically measured in mils rather than in microns (with a mil, or ⅟1000 inch, being just over 25 microns). To prevent having to pass internal connections to the numerous contacts through insulated vias through these thick layers, these layers can be added to the back of the wafer rather than to the surface that components will be affixed to. While this involves bringing the power through the wafer, this can be done through relatively large vias spaced millimeters apart, keeping the aspect ratio manageable. Further preferred embodiments of the present invention therefore include thick power and ground plane layers produced with MOM or PCB processes, and still further preferred embodiments have such layers on the back of the programmable circuit board.

A typical packaged chip has roughly 10% of its pins being power pins, and another 10% of its pins being ground pins. With pins on a one-millimeter spacing, this puts power pins roughly three millimeters apart, and the same for ground pins. These pins are connected to pads that are two orders of magnitude smaller, or on the order of 30 microns on a side, which are in turn connected to vias that are even smaller. Even using through-wafer vias the size of pads to keep the aspect ratio low, each set of power connections thus takes roughly 0.01% of the total wafer area. Thus through-wafer vias for four power and two ground planes for a LAIC-based programmable circuit board would take an insignificant amount of area, roughly 0.06% of the available area.

Techniques for making vias through wafers are well known in the art of chip stacking, these usually use thinned wafers but since wide vias are desired for the present invention, thinning the wafers is optional due to the relatively moderate aspect ratio. However mechanical thinning is relatively inexpensive and speeds up the production of the vias, so especially preferred embodiments use thinned wafers with the large-area integrated circuitry on the face to which components will be affixed, and thick power and ground planes on the reverse face. Where wafer thickness is advantageous for mechanical reasons, a thick 'handle wafer' of inexpensive silicon can be bonded to the back of the power planes.

The prior art teaches using adaptors to allow components with given contact patterns and spacings to be used on substrates that were designed for different contact patterns and spacings; these are basically just small PCBs that have the component contact pattern on one side and have contacts matching the substrate pattern on the other side, using the internal connectivity of the small PCB to route the signals and the power and ground connections from one face to the appropriate contacts on the other face. But because the power and ground patterns vary from chip family to chip family, a unique custom adapter has been needed for each type of chip and for each type of contact pattern that chip is to be adapted to. This makes using such adapters for programmable circuit boards, which are generally targeted toward small-volume runs, largely impractical.

However the above embodiments of the present invention eliminate the need to predetermine the contact pattern even for power and ground, allowing a generic adapter to be made to adapt each of the relatively few popular component contact spacings to the substrate contact spacing of the reprogrammable circuit board. This is far more practical than requiring a custom adaptor for each of the far larger number of contact patterns.

Fifth Family of Preferred Embodiments

Supporting Bare-Die Component Density

While the preferred embodiments discussed above support packed-chip-density contacts, high-end bares dies (unpackaged chips) typically have a contact density an order of magnitude higher than chip packages, and IBM has produced commercial chips for multiprocessor servers with up to 5000 contacts on a die of just over 300 square millimeters, for 16 contacts per millimeter or 16 times denser than the typical leading-edge packaged chips that the second preferred embodiment family used as an example. Chips with such dense contacts are designed to be used with very expensive ceramic multi-chip modules, which, as previously discussed, support much higher contact and interconnection densities than standard PCBs do but also have much higher design and manufacturing costs and hence are in even more need of programmable technologies for prototyping and low-volume production.

As discussed previously, programmable multi-chip modules (MCMs) are known in the art, but to keep from having to design and build a new MCM for every pattern of contact spacings, components are affixed contact-side-up with space in between them, and their contacts are then wire-bonded to the appropriate contact sites of the MCM. There are several drawbacks to this, including the need for space in between the components, which typically lowers the system density by a factor of two (although density is typically still higher than with a traditional PCB); to prevent wires crossing the wire bonds from the center of a die have to pass over the wires from the edge of the die, and hence they can be several centimeters long (this hits high-end array-contact chips much more than low-end peripheral-contact chips); and a separate wire-bonding program must be developed for each system being developed.

Wire-bonding is also a semi-permanent attachment, so while new components can be added to unused areas of the programmable MOM, existing components cannot be moved without an arduous process of removing up to thousands of wire bonds, at considerable risk to the integrity of both the expensive substrate and what are likely to be scarce prototype chips. And the programming is through antifuses, which are not reprogrammable, so while new connections can be added, existing ones cannot be altered. Thus although one can make minor changes like re-routing a few signals by carefully clipping their wires near the MOM, bonding them to new MOM pads, and then interconnecting those new pads to the wires' new destinations, this MCM-based prototyping system is not electronically reprogrammable.

To overcome these drawbacks, a fifth family of preferred embodiments of the present invention provides an extremely high contact-density programmable circuit board that uses the LAIC-based interconnection circuitry to interconnect non-pre-determined sets of contacts of components affixed to it, with those components affixed contact-side facing the programmable circuit board. This eliminates the need for wire bonding and thus eliminates the need for space between components to expose pads to bond to, and it provides much shorter connections. While a first embodiment of this fifth family can use antifuses for programming, preferred embodiments are reprogrammable and especially preferred embodiments include other attributes of the second, third and fourth families of preferred embodiments of the present invention, especially including the signal integrity attributes that greatly reduce the area needed for passive components.

Although at one contact per square millimeter the $2^{nd}$ and $4^{th}$ families of preferred embodiments use almost 10% of the available metal (as well as from a fraction of a percent of the circuit area up to around 1% if all of the features described so far are used), they can achieve the 16× contact density increase needed to support dense-contact bare dies. This is primarily because the pattern of connections remains the same with bare dies as with packaged dies, and the distances are smaller. Thus although if a system is shrunk by a factor of four in each direction and the number of contacts remains the same and the density of contacts increases by a factor of sixteen, the interconnection lengths shrink by a factor of four and hence the amount of metal per area merely increases by a factor of four.

A 16-fold density increase in contacts therefore increases the cross-point density 16-fold, but the metal density increases only 4-fold. For the power and ground contacts, typically in a high-end chip the highest-power package contacts drive several on-die power contacts, so power and ground each may use more die contacts but each such contact is typically only a few hundred milliAmperes. Thus although the contact density may rise up to 16-fold, the percentage of the area required to drive reprogrammable power to contacts more typically rises 5-fold due to the lower current per power contact. Even including all of the features in the fourth family of preferred embodiments, this consumes under 10% of the available circuit area in a leading edge process (figures have been used from a 90-nanometer FPGA), and it consumes roughly ⅓ (2.6 layers) of the available metal (8 metal layers is typical at 90 nm, although more layers can be added, with up to 11 metal layers having been used for high-end ASICs).

With denser circuitry, the critical area of circuitry becomes large enough that defect tolerance becomes essential for wafer-sized regions, as without it yields would drop to a few percent. As discussed earlier in the present application, the efficient direct replacement cell defect tolerance of U.S. Pat. No. 5,748,872 can provide multiple cells capable of replacing any defective cell at a modest increase in circuit area, raising yields dramatically. For supporting packaged components this provides the simplest interface to the routing program; because that program does not need to know about the defects at all due to the direct replacement at the hardware level. However if applied to all links from a cell when supporting bare-die density, the cost in metal for direct replacement would be prohibitive in such a dense-contact reprogrammable circuit board.

But with the numerous extra length-1 links present in the internal interconnect network, a suitable longer link can always be reached for any sparse pattern of defects; full direct replacement is therefore not necessary. Because routing programs can already handle routing around links that are in use, simply starting with a map of the defective links (for which data can be acquired through the scan chain, as will be known to those in the field) and labeling those links as 'in use' will enable the routing program to route around the defects without even requiring modifications to the software beyond initializing the map of links 'in use' from the defect data instead of zeroing it out upon initialization. While even whole defective unit cells could be handled in this way by marking all of their links as 'in use', there is one resource where the position of the resource used is important, and that is the contact itself.

Therefore the critical resource to protect with robust circuit design and/or redundancy is the ability to drive a substrate contact, and to connect the contact to the first cross points. Such redundancy for driving a positionally dependent resource is known in the art of displays; U.S. Pat. No. 5,801,715 by the present inventor teaches this for reaching positionally sensitive display elements from multiple cells, and the same principles can be applied here. In the preferred embodiments of the present invention, applying this defect tolerance comprises having each substrate contact being capable of being driven by any of a plurality of unit cells, and being capable of driving at least one cross-point (and thus its associated link) in a plurality of cells.

One way to accomplish this is to have the links from the multiple cells each drive an AND gate in cooperation with a configuration bit (which controls whether its link's value is ignored), and the AND outputs drive an OR gate that then drives the transistor chain for the contact; similarly for driving a given cell's cross-point, each signal from a contact drives an AND gate with a configuration bit, and the AND outputs drive an OR gate to produce the input to the cross point array (although simply adding additional inputs to the cross-point array would add extra flexibility, that flexibility is not needed and combining the inputs takes less space than increasing the cross bar size would).

Because these circuits are simple and not numerous (compared to the cross points themselves), and the drive chains are already made with large transistors, it takes little extra area to make these positionally dependent resources with robust design rules to make defects extremely rare. Thus especially preferred embodiments take advantage of the natural redundancy of the internal interconnect network, and only add additional circuitry for defect tolerance to protect the circuitry between the contact and the interconnect network.

Sixth Family of Preferred Embodiments

Alignment-Insensitive Contacts

Even with gaining all of the advantages of the preferred embodiments above, the present invention (in common with FPIC-based reprogrammable circuit boards) still lacks one important attribute that the one-time programmable MCMs have: that a single substrate can be used with a variety of different contact spacings, without the need for adapters. In a sense even with one-time programmable MCMs adapters are needed; the set of bond wires for a given component is the adaptor for that component. And developing this 'adaptor' for a new component is non-trivial, as a new wire-bond program is needed to adapt to a new contact spacing or pattern. But since a new wire-bond program is needed anyway for a new system, and the wire bonding is needed anyway to connect the components to the programmable MOM substrate, these are not extra steps but merely extra uses of existing steps.

Wire-bonding an MOM is a more expensive process than the process used for most PCBs, in which the component contacts are connected to the substrate contacts en masse, typically through adhering solder balls to the component contacts, placing the components solder-ball-side down upon the substrate, and melting the solder by passing the substrate through a heat source. Wire bonding requires an expensive wire bonder, and adds the cost of the aforementioned programming of it for each new system design, and these are especially expensive relative to the small experimental runs that programmable circuit boards are most valuable for. On the other hand even generic adapters add complexity, decrease density and impair signal integrity. Therefore it would be advantageous to have a programmable circuit board that could adapt to a wide variety of contact spacings, as well as contact patterns, without requiring either wire bonding or adaptors.

While a MEMS-based programmable circuit board could conceivably physically move a substrate contact to where it is required, the movement needed could be up to half the contact spacing, or hundreds of microns, and this would have to be done without breaking the internal connections for signals, power and ground. Therefore even in MEMS-based programmable circuit board embodiments, a better method is needed.

A sixth family of preferred embodiments of the present invention therefore uses the high substrate contact density and power/ground pattern insensitivity enabled by the above embodiments to provide small contacts (the term micro-contacts is also used herein) several times more closely spaced than the component contacts. This can be designed to allow the programmable circuit board to accept a wide variety of contact spacings and component alignments while ensuring that at least one small substrate contact connects to each larger component contact.

Figure 6:
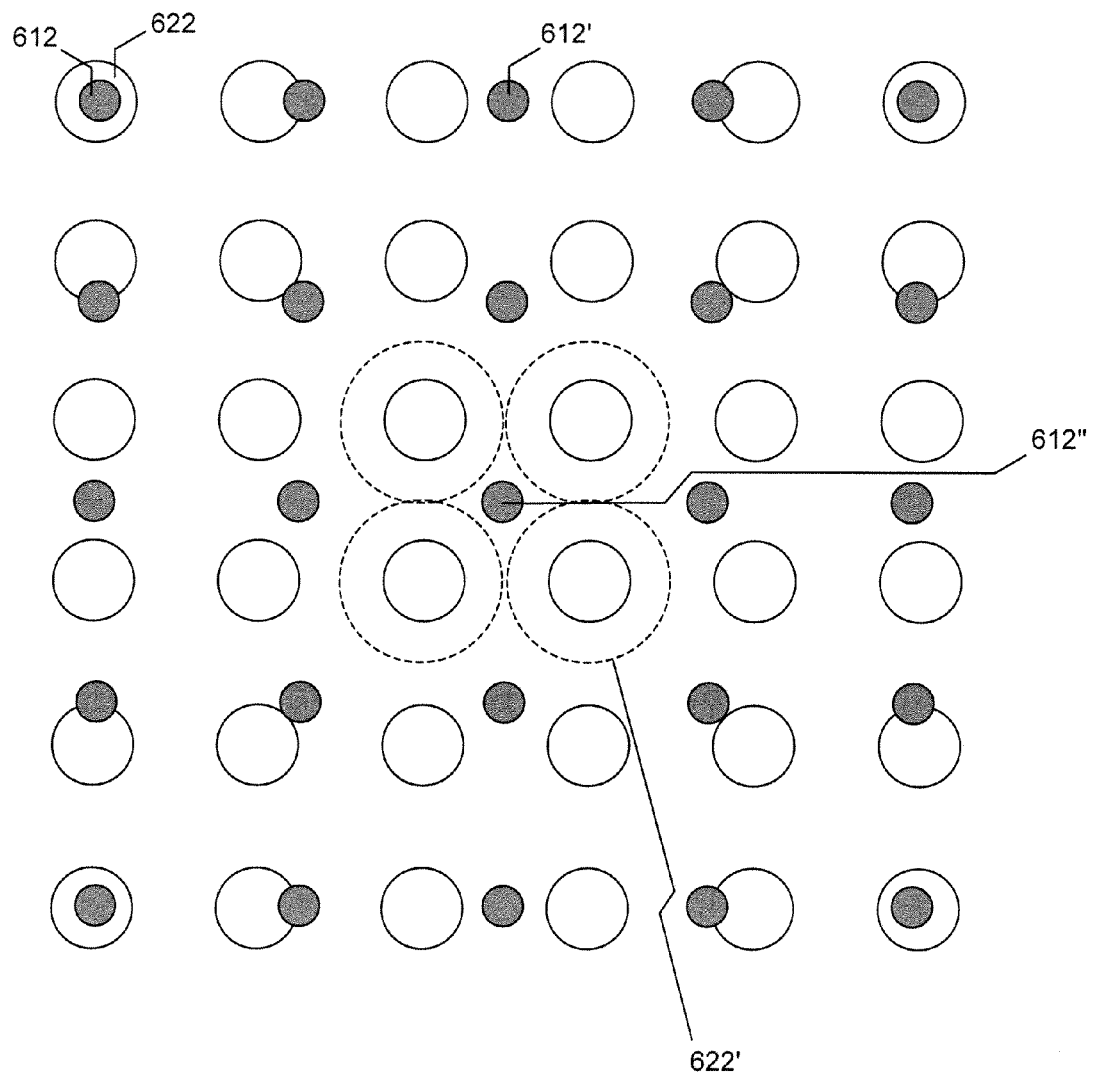
FIG. 6 is a depiction of how substrate contacts for one component contact pitch misalign with component contacts on a different pitch.

Consider a simple example of adapting to two common component contact spacings in ball-grid arrays, the older but still popular spacing of 1.25 millimeters, and the newer 1-millimeter spacing. Obviously a substrate contact spacing of 1.25 millimeters will match the former spacing, but it will not have enough contacts for the denser 1-millimeter spacing. And while a 1-millimeter substrate contact spacing would have sufficient contacts for either component spacing, with a 1.25 millimeter spacing, as shown in FIG. 6 if the first substrate contact 622 is aligned with the first component contact 612, the second component contact would be 0.25 millimeters beyond the second substrate contact, the third component contact 612' would be 0.5 millimeters beyond the third substrate contact and an equal 0.5 millimeters shy of the fourth substrate contact, the fourth component contact would be 0.25 millimeters shy of the fifth substrate contact, and the fifth component contact would align properly with the sixth substrate contact.

Since the component contacts 612 would typically be solder balls 0.25 millimeters in diameter, a substrate contact of at least 0.25 millimeters would have some overlap with a component contact that was misaligned by up to 0.25 millimeters. For the troublesome third component contact, which falls halfway between two substrate contacts, the substrate contacts would need to be increased to at least 0.75 millimeters to ensure that the third component contact intersects a substrate contact, plus a few microns to ensure a bit of overlap to establish good contact.

But this considers only alignment in one dimension; a much worse case is the third component contact 612" in the third row, which is off by 0.5 millimeters in each of two directions. Here simply increasing the substrate contact size is not sufficient, for the contact diameter needed is greater than the 1-millimeter contact spacing, and thus enlarged substrate contacts 622' would overlap each other before any of them would overlap component contact 612". And if the component contacts 612 are made bigger instead to resolve this particular case, a substrate contact 622 that falls halfway between two larger component contacts 612 will then overlap both of them, thus shorting those component contacts 612 together. Furthermore requiring custom component package attributes such as enlarged solder balls would defeat the purpose of the substrate adapting to different packaging.

Figure 7A:
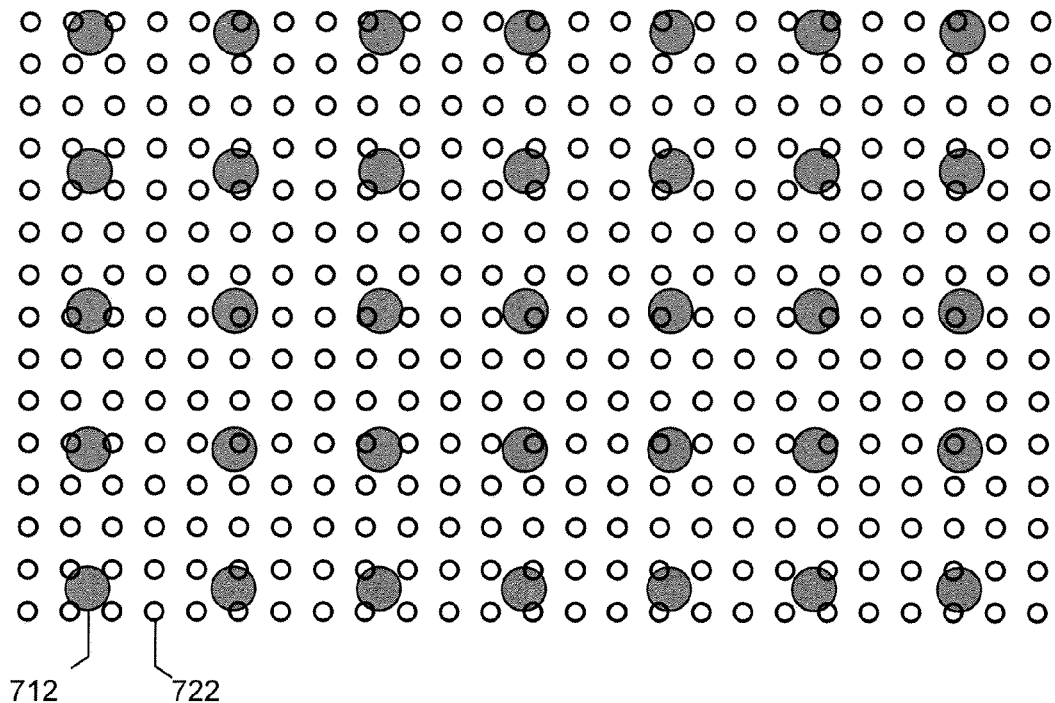
FIG. 7A is a depiction of how tiny substrate contacts can overlap with larger component contacts regardless of the component contact pitch.
Figure 7B:
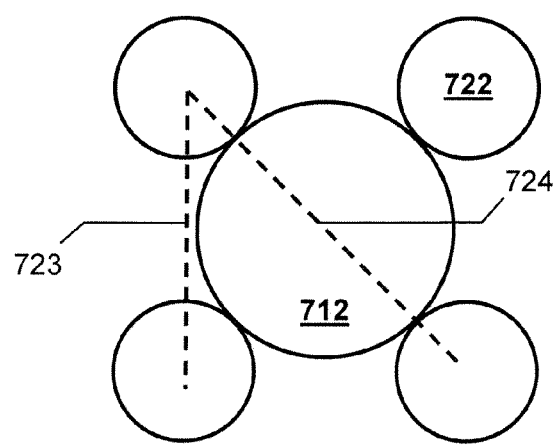
FIG. 7B is a depiction of the minimum size that a component contact must be to always overlap at least one substrate contact when the substrate contacts are in a square lattice.

A better solution lies in another direction. As FIG. 7A shows, if the substrate contacts 722 are made smaller than the distance between the component contacts 712 at the tightest supported contact spacing, and if the distance between substrate contacts 722 is smaller than the size of the smallest component contacts 712, then at least one substrate contact 722 overlaps with each component contact 712, and, since a substrate contact 722 can fit between two component contacts 712, no substrate contact 722 overlaps with more than one component contact 712, avoiding shorts between component contacts 712. This makes the array of substrate contacts insensitive to the size, spacing and alignment of the component contacts as long as the size and spacing meet these criteria With standard BGA packages today having component contacts 722 that are solder balls (or solder columns in the case of a column-grid array) on the order of 0.25 millimeters in diameter, and with spacings only now reaching 0.8 millimeters, the inter-contact spacing is bigger than the contact diameter. As shown in FIG. 7B, with a square grid the maximum substrate contact spacing 723 that ensures that at least one substrate contact 722 always overlaps each component contact 712 occurs when substrate contacts' diagonal spacing 724, or the square root of 2 times the substrate contact spacing 723) is less than the diameter of the substrate contacts 722 plus the diameter of the component contacts 712.

For example, if the component contact diameter is 250 microns (0.25 millimeters), and the substrate contact diameter is 100 microns, then the maximum substrate contact spacing is (100 microns+250 microns)/1.414, or 247 microns. Allowing a few extra microns to ensure sufficient overlap to prevent electromigration problems (the overlap area needs to be roughly 100 square microns per ampere for aluminum and only about 30 square microns per ampere for copper, so a few microns of overlap between regions hundreds of microns across is more than sufficient), and a few more to cover process variations, the substrate contact spacing should be at most 240 microns.

Even reducing this to 170 microns to allow for anticipated 200-micron balls and for ensuring hundreds of square microns of overlap, this uses just half of the available metal layers and just ¼ of the available transistor area. Preferred embodiments of the present invention targeted at components with BGA and CGA packages, and even TSOP and QFP packages that have compatible contact sizes and spacings on the package perimeter, thus use contact spacings of at most 240 microns, with contact sizes significantly smaller than the contact spacing, and especially preferred embodiments use a contact spacing of at most 170 microns.

Without further optimization, the limit in the 8-metal-layer, 90 nanometer process used in the above examples is around 85 microns. At this point the metal layers are exhausted, but this limit can be postponed by roughly a factor of two simply by optimizing the metal widths used to match the capability of the lithographic process to take advantage of the lower layers of metal supporting a tighter pitch than the coarse upper-layer width. This postpones the exhaustion of the available metal layers until the spacing is below around 45 microns.

85 micron spacing, however, is also approaching the limit of the transistor area needed for power, configuration and cross points. Being able to source one ampere from any of four different power planes and sink one ampere to either of two ground planes, which in the low-leakage 90 nanometer process example uses almost 750 square microns for each of these 6 planes, takes 4500 square microns, plus the configuration memory for the cross-points at around 2500 square microns (the cross-point plus configuration memory density in a 90-nanometer FPGA), for a total of 7000 square microns, which would just fit in a square 85 microns on a side.

Figure 7C:
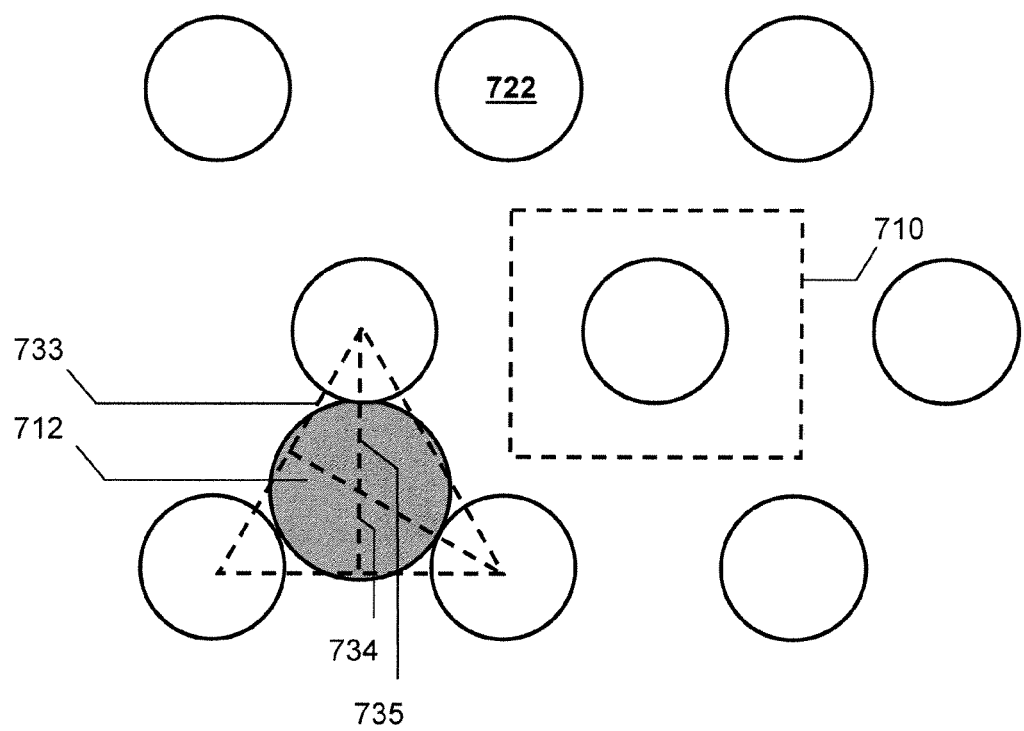
FIG. 7C is a depiction of the minimum size that a component contact must be to always overlap at least one substrate contact when the substrate contacts are in a hexagonal lattice.

But the square packing shown in FIG. 7A and FIG. 7B is not the best way to pack substrate contacts 722 of a given size to minimize the size at which a component contact 712 must overlap at least one substrate contact 722. Hexagonal packing, as shown in FIG. 7C, is more efficient. Since the lines bisecting the angles of a triangle meet at a point ⅔ of the way from a corner to the opposite side, length 735 is twice as long as length 734, and since the lengths together equal the height of the triangle, which is half the square-root of three (about 0.866) times the substrate contact spacing 733. But length 735 is equal to the radius of the substrate contact 722 plus the radius of the component contact 712, so the minimum diameter for a component contact 712 to always overlaps at least one substrate contact 722 is 2*(0.866*⅔) times the spacing of the substrate contacts 722, minus the diameter of the substrate contacts 722. This is approximately 1.15 times the substrate contact spacing minus the substrate contact diameter.

Another optimization is that the unit cell containing a substrate contact does not have to fit entirely under a substrate contacts; it can extend into area between the substrate contacts as well, as indicated by the dotted rectangular outline 710 in FIG. 7C. While a hexagonal unit cell would pack equally well, the rectangular cell is better suited to some current circuit design tools, and hence is slightly preferred. In either case the area is the same, the spacing of the substrate contacts 722 times the vertical pitch or 0.866 times the spacing. For a unit cell area of 7000 square microns, this is a 90-micron horizontal spacing between substrate contacts 722, and a 78 micron vertical spacing between rows of substrate contacts 722.

IBM's latest C4NP wafer bumping process (see article "Low-cost Wafer Bumping") can produce 75-micron component contact 712 on a 150 micron spacing, so a substrate contact 722 must fit into the 75-micron gap between such contact, with at least a few microns to spare. For this 2-to-1 component contact pitch to component contact diameter, the substrate contact diameter should therefore be a maximum of around 90% of the gap, or around 45% of the component contact pitch. So if the substrate contact spacing is 90 microns and the substrate contact diameter is 45% of 150 microns, then a component contact 712 will always be overlapped by at least one substrate contact 722 if its diameter is at least (1.15*90 microns)−(0.45*150 microns), or 36 microns. So with a hexagonal packing of an optimally shaped unit cell of 7000 square microns, even the 75-micron contacts on a 150-micron pitch can be supported.

If the component contact pitch remains at twice the component contact diameter, the above embodiment could support component contacts 712 as small as 55 microns on a 110-micron pitch. Although this is not necessary for today's mainstream chips, this would provide future-proofing down to 55-micron solder balls. It also shows that when the slower transistor speed of a 180 nanometer process is acceptable, a less-expensive 180-nanometer implementation would be sufficient to support 100-micron solder balls on a 200 micron pitch, which would meet the needs of the 4-mil (100 micron) bumps on a 9-mil (225 micron) pitch also discussed in the article.

Furthermore bumped chips generally have a higher percentage of their contacts devoted to power and ground, but at a lower amperage; the maximum current is typically a few hundred milliAmperes and is almost always under 500 milliAmperes. Even allowing for 500 milliAmperes, this reduces the area needed to drive each such contact to around 360 square microns per power/ground plane, which at 2200 square microns in total or 4700 square microns for a unit cell. With the hexagonal packing and a 2-to-1 component contact spacing to pitch, this would support component contacts 712 as small as 45 microns on a 90-micron pitch.

Especially preferred embodiments of this family therefore use substrate contacts that are smaller than the component inter-contact spacing, with the spacing between the substrate contacts being smaller than the component contact, thus ensuring that at least one substrate contact overlaps with each component contact and that no substrate contact overlaps more than one component contact, while maximizing the substrate circuit area available per substrate contact. Further preferred embodiments use unit cells comprising rectangular circuit areas that together occupy substantially all of the substrate circuit area, with round substrate contacts, and in exceptionally preferred embodiments alternating rows of cells are offset by half a cell width to put the round contacts into a hexagonal grid for closest packing.

While a 90-nanometer pitch is fine enough to support advanced commercial wafer bumping such as IBM's C4NP, and would even support the next convenient step of 50-micron (2 mil) bumps on a 100 micron (4 mil) pitch, experimental contact arrays push the art to even higher densities. For example, experimental work has been done with "microbumps" comprising 20-micron balls on a 50 micron pitch (see article "Systems-in-Silicon Architecture and its Application to H.264 Motion Estimation for 1080/HDTV", ISSCC 2006). Although standards have not yet emerged at such high densities, it would be advantageous for a programmable circuit that may be in production for years to be able to support as high a density as possible.

Several optimizations can be made that will allow a significantly increased density at a modest cost in complexity. All cells in the continuous mesh embodiments discussed so far are the same except for the very highest dimensions, and this uniformity makes routing algorithms simple. But as this density the resources devoted to cross points and to internal network metalization have become limiting factors in further increasing the substrate contact density, and optimization of them is thus worthwhile.

Figure 8A:
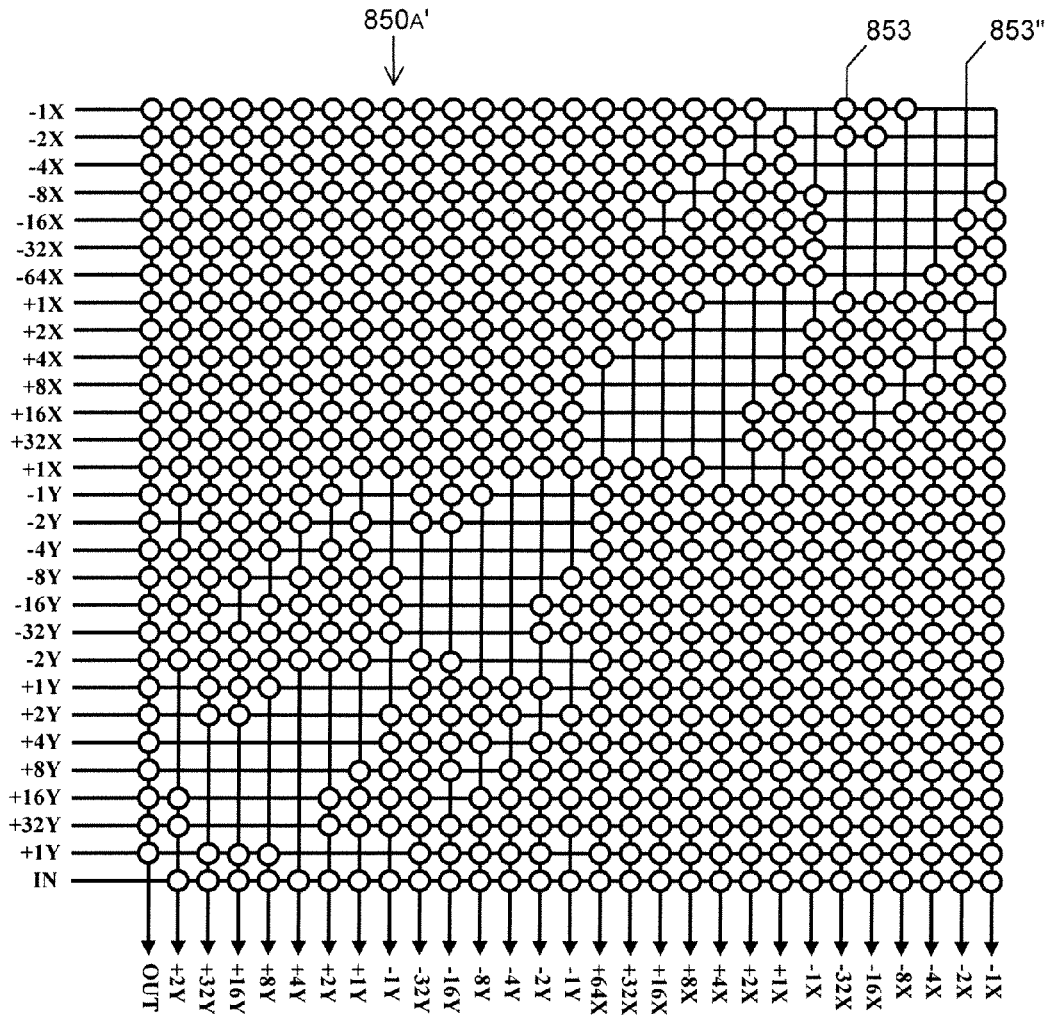
FIG. 8A is a depiction of a crossbar for a 14-dimensional continuous mesh, where non-useful cross points have been removed.

As mentioned earlier it is not necessary to have a full cross bar in each cell. FIG. 8A shows an example partial crossbar 850A', which has highest-dimension links that correspond to those of element 410' of FIG. 4B. In partial cross bar 850A' the useful cross points 853 are indicated as open circles; intersections 853" with no open circle represent superfluous cross points eliminated from the cross bar design. A connection from the element L cells away a given direction, for example, does not need a cross-point that would connect it back to the element L cells away in that direction because that's where the connection came from. This can be seen by the major diagonal of the crossbar having bare intersections 853" rather than open circles 853 that would represent settable cross points.

A crossbar input from an element L cells away in a given direction also doesn't need to be able to connect to the crossbar output that would hop L/2 back in that direction either, because the element L cells away would have just used its L/2 connection, rather than using a length L link that overshoots. And that crossbar input also doesn't even need to be able to connect to the L/4 crossbar output back in that direction, because an L/2 hop followed by an L/4 hop would be better than an L hop followed by a backward L/4 hop. The inverse also applies; after taking a hop of length L in a given direction, there would be no point in taking a hop of length 2L or 4L in the back beyond where the first hop came from. Thus for every crossbar input 851 from an element L cells distant in a given direction, the cross points 853 that would have connected L/4, L/2, L, 2L or 4L back in that direction have been eliminated from the crossbar design, as indicated by the bare intersections 853".

Additional cross points can also be eliminated at a potential cost of an interconnection passing through extra cross points. The least costly of these is eliminating the L/8 and 8L backward-hop cross points. For example, a hop of +16× followed by a −2× uses an L/8 backward hop; this could be replaced by a +8× followed by a +4× followed by a +2×; +16, −2× only passes through two cross point while its replacement +8×, +4×, +2× would pass through three cross points. On the other hand +16, −2× has a total length of 18 unit cells versus a total length of only 14 unit cells for +8×, +4×, +2×, which tends to offsets the cost of passing through an extra cross point.

While the cost in cross points is independent of the link length, the cost in path length depends linearly on the 'backward-hop' link length. Therefore while the balance depends on the performance goals and the relationship of cross point delay versus the increased delay of the longer path in a given semiconductor process, additional 'backward-hop' cross points will be eliminated for the longer backward links before they will be eliminated for shorter backward links. In FIG. 8A, the L/8 cross points have been eliminated where L is 64 or 32, and the 8L cross points have been eliminated where 8L is 64 or 32.

Also a hop of link L should generally not be followed by another hop of length L in the same direction, except for the longest links in the highest dimensions. The cross points for these for lengths 1, 2, 4, 8 and 16 have also been eliminated from FIG. 8A; the cross points for the length 64 links were left because they are the longest dimension, and those for length 32 were left because with the longest links being sparse, allowing back-to-back hops half as long provides a low-cost safety margin in case the longest links were made too scarce.

If the longest links were not sparse, the pattern of omitted contacts would be symmetric. However the sparse long links in the highest dimensions being filled in by shorter link shows up as asymmetry in 'arms' on the bare patches in the diagram where these shorter links have cross points eliminated matching their shorter length, rather than the long length that they would have in a full dimension of longest links.

Removing addition cross points is possible, but the cost in extra hops is larger and the offsetting savings from shorter path lengths is smaller. Therefore FIG. 8A doesn't have L/16 or 16L cross points removed.

A much larger savings in cross points, and also a savings in metalization, can be achieved at a trade-off in flexibility. An interconnection typically does not use a link of every length in each physical dimension; on the average two cell positions will, when expressed in binary, differ in half of the bits in their positions, and hence will use hops of only half of the link lengths. Furthermore pins for power and ground don't use any of the internal network links, so on the average significantly fewer than half of the links would be used even if components were packed side by side with no space in between.

There is therefore an opportunity to depopulate the links, as well as the cross points that connect the links. Interconnections typically traverse a longer distance in one physical dimension than the other, and routing can bunch together hops in one physical dimension, so a pattern that groups links in by physical dimension is acceptable, and this produces the largest savings in cross points. Half of the elements can thus be are dominated by links in one physical dimension and the other half dominated by links in the other physical dimension, and if these two types of elements are arranged in a checkerboard pattern, then any given element has four neighbors of the other type. Keeping a full set of length-1 links for every element lets an element that has links in one physical dimension access links in the other physical dimension through any of its four nearest neighbors.

Referring again to FIG. 4B, elements 410' and 410''' have longest links in the physical X dimension and links 410'' and 410''' have longest links in the physical Y dimension. Since these already form a checkerboard pattern, elements 410' and 410''' can be stripped of all but their length-1 links in the physical Y dimension, and 410'' and 410'''' can be stripped of all of their links in the physical X dimension.

Figure 8B:
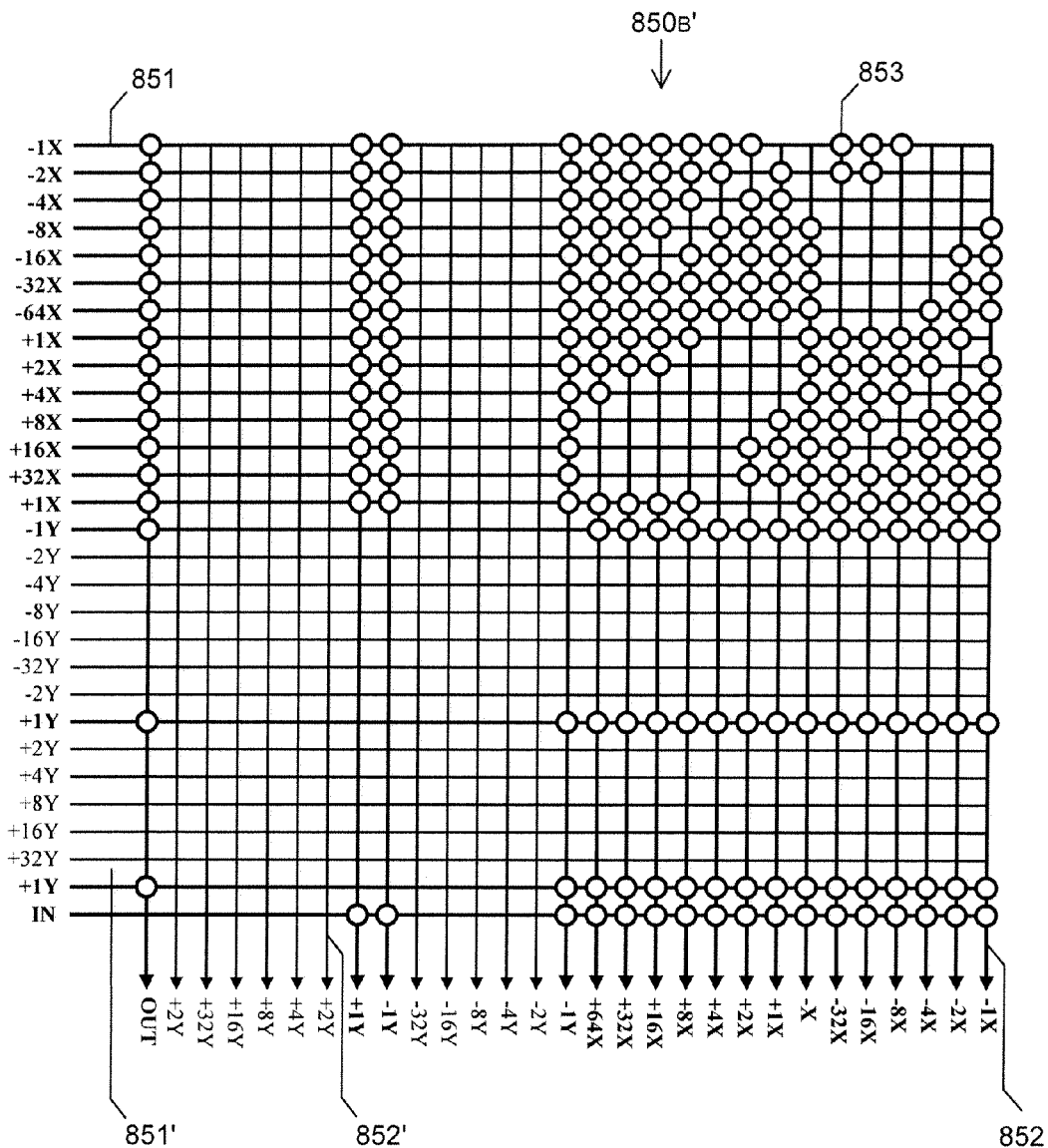
FIG. 8B is a depiction of a crossbar for a 14-dimensional continuous mesh, where low-value cross points have been removed.

FIG. 8B shows an example 850B' in which this concentration on a single physical dimension is applied to the already-reduced crossbar 850A' of FIG. 8A. The cross bar inputs 851 in the physical X dimension, as well as the inputs from the length-1 links 851 in the physical Y dimension are retained, as are the crossbar outputs 852 in the physical X dimension, and the outputs to the length-1 links 851 in the physical Y dimension. The cross points 853 from FIG. 8A are retained only where both the input and the output that they would connect are retained.

The other inputs 851' and outputs 852' that are not retained are shown in a lighter font and have no associated cross points 853; these would be eliminated in an optimized physical implementation, and are only shown here for easy comparison to FIG. 8A. Because length-1 links use a trivial amount of metal, the total metalization for an element as shown in FIG. 8B is reduced by approximately half compared to an element with both physical dimensions implemented. The number of cross points that remain in an element is also greatly reduced; from 841 in a full 29×29 cross bar to 240 in the partially depopulated crossbar of FIG. 8B.

Using the 90 nanometer lithographic process of the earlier examples, this would reduce the cross bar from around 2500 square micros to around 700 square microns. The metal required has also been reduced; when measured in link lengths, it has been reduced by 50%, so if the interconnect length distribution pattern remains the same, this reduction in metalization would support a substrate contact spacing as tight as about 25 microns.

Optimization the cross points leaves power as the dominant consumer of cell area, but delving deeper into the characteristics of power contacts reveals some areas for improvement. Power pins are usually widely dispersed around the chip package; this helps reduce the interference of signal contacts on each other, and, for array packages, it minimizes the thickness of the internal component power planes needed. Therefore while it is necessary to support any contact in a region being a power contact, it is not necessary to support every contact in a region being a power contact. This dispersal makes the power per area much smaller when regions of contacts are considered. ½ Ampere per square millimeter would be high for an array-contact chip (although with a packaged chip a single contact might draw that much). Thus if power could be drawn from several cells to feed one power contact (and likewise for ground), one Ampere per square millimeter, rather than one Ampere per contact, would be sufficient.

Typically power contacts make 10% of the contacts in a region, and the power contacts in a region all tend to be from the same power plane. Therefore it is rare that component power contacts closer together than a few hundred microns need to be connected to different power planes in an array-contact component. It is also uncommon to have more than one ground plane per component, and even when a component requires more than one ground plane, the contacts are usually on opposite sides of the die. Therefore for ground planes, it is rare to have contacts for different ground planes within a millimeter of each other.

Not driving two different power planes or two different ground planes in close proximity allows regional power planes to be used, where every cell in a region can contribute a small amount of power to the regional power plane from any of the system-wide power planes, and any power contact in the region can draw from the region power plane through one power transistor chain, rather than one power transistor chain per system-wide power plane, and the same for ground planes.

For example, if a regional power plane is added for each 200-micron by 200-micron region, then each cell in the region can contribute to that local power plane. For one Ampere and four power planes, this takes still takes 2900 square microns, but this for the whole region rather than for each cell so it is only about 7% of the 40,000 square microns of the 200-micron by 200 micron region, and hence only 7% of the area of each cell in the region. If every cell in the region then has a single ½ Ampere power transistor chain (consuming only 360 square microns) that can connect the regional power plane to the cell's contact, then any substrate contact in the region can drive a ½ ampere component contact, and any component contact large enough to overlap two cells can be driven with a full one Ampere. A similar regional ground plane takes even less area per cell because there are only two ground planes (requiring 720 square microns each for one Ampere) and the region can be a full millimeter (1000 microns) on a side, reducing the area required to support the regional ground plane to an insignificant 0.15% (0.15%=2*720/1000*1000) of the cell area. Thus area for ground is reduced to only the 360 square microns per cell to connect the cell's contact to the regional ground plane.

At this point the power, ground and crossbars have been optimized enough that the I/O drive circuitry is starting to become noticeable. But because the needed current for a signal contact is relatively modest, with 8 milliamps being typical and 24 milliamps being considered large, even the final driver transistor for the output is relatively small, as 24 milliamps requires about 36 square microns in a low-leakage 90 nanometer process (and could be fit into 30 square microns at an acceptable cost in leakage). But switching speed is important for signal contacts (as opposed to for power contacts), so the transistor chain driving the signal contacts in especially preferred embodiments is optimized for speed rather than area; this typically uses a chain where the size ratio between transistors is a factor of between three and five (the ideal ratio for speed depends on the details of the types of transistors used and of lithographic process); this means that the overall chain increases the area by between ½ and ¼ (from summing the series of the transistor sizes). Thus the area needed for the final signal driver chain is between roughly 38 (38=30*1¼) and 54 (54=36*1½) square microns; with an area of 50 square microns being used in the examples (even when 3-to-1 would be ideal, an area of 50 square microns will be only marginally slower than a 54 square micron chain since the performance curve is fairly flat near the optimum and the 3.9-to-1 is close enough to 3-to-1).

The power and ground chains are thus reduced to around 720 square microns, which with 700 microns for the crossbar and 50 square microns for an I/O driver comes to around 1470 square microns. Adding 7% for the regional power plane support bring the total area per cell to around 1600 square microns. Using the packing of cells illustrated in FIG. 7C, this corresponds to a minimum cell spacing of 43 microns within a row and 37.5 microns between rows. This is just barely sufficient for matching the 20 micron contacts on a 50-micron spacing of the article "Systems-in-Silicon Architecture and its Application to H.264 Motion Estimation for 1080/HDTV" article because 1.15 times 43 microns is under the 50 micron spacing.

Especially preferred embodiments of this family therefore include providing cells with partially depopulated cross bars, and in further preferred embodiments the cells are split into two types intermingled in a checkerboard pattern, with the links in each type concentrated in one physical dimension with only length-1 links in the other physical dimension. Even further preferred embodiments include regional power and ground plane driven cooperatively by multiple cells and from which any cell in a region can drive a substrate contact.

At this point the design with the closest packing of contacts with the maximum sized substrate cells where there is a simple one-to-one ratio between cells and contacts has been achieved, and this has yielded a contact density high enough to support the full range of packaged components and flip-chip bare-die components in common use today, with significant headroom for the future. When standards or norms emerge for a contact density approaching or even tighter than a 50-micron contact spacing, further optimization can be undertaken; for example, it is likely that the current per power contact or per ground contact will typically be much lower, allow saving several hundred square microns per unit cell. Also by that time a technology like flexing carbon nanotubes may provide a much higher current density per square micron than transistors currently do, allowing hundred of milliAmperes in tens of square microns. The cross point configuration memory will also much likely be more compact than the SRAM used in the above calculations, because a conductive non-destructive-read technology like PRAM may be mainstream by then.

Figure 9:
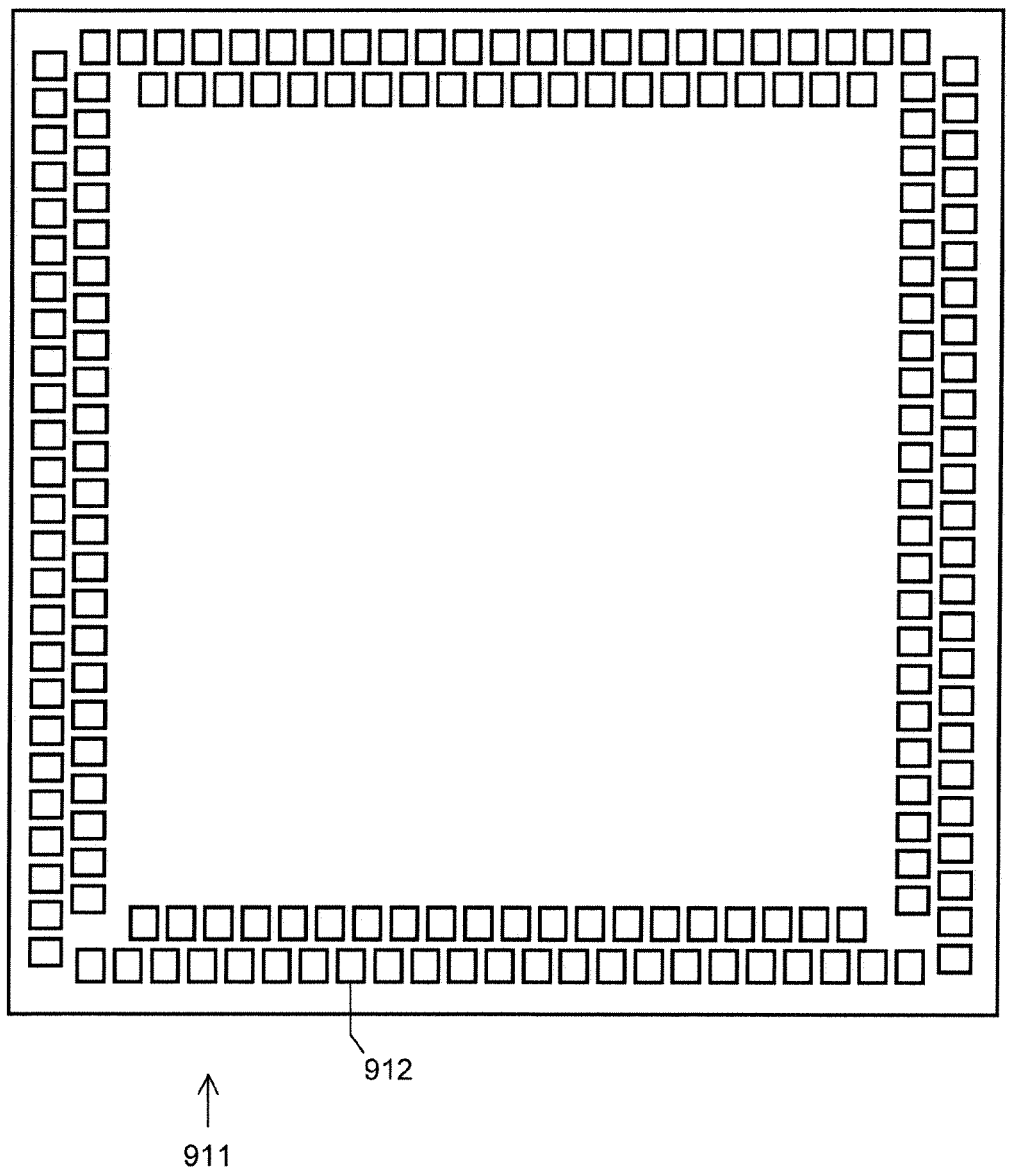
FIG. 9 is a depiction of peripheral pads on a bare-die component.

However the above discussion only has dealt with array-contact components and coarse peripheral-contact components. Although array-contact components are becoming dominant at the high end, another component type, bare-die chips with peripheral contacts, should also be considered. As shown in FIG. 9, a peripheral-contact bare die 911 can have multiple rows of 'pads' (contacts) 912 in a 'pad ring' around its periphery. When more than one row of pads 912 is used in a pad ring, the rows are typically staggered to make it easier for the wire bonder to avoid bond wires contacting each other. Typical peripheral-contact components have one or two rows of pads 912 in the pad ring; chips have been produced with three rows, but this is uncommon because the increasing difficulty of wire-bonding with more than two rows has lead to array-contact components dominating high I/O count chips, and array contacts also distribute power and ground contacts across a die, which is becoming increasingly important as voltage levels are lowered to reduce power consumption.

Although peripheral-contact components typically have fewer contacts than array-contact components, peripheral contacts are tightly packed within the pad ring, creating a high peak component contact density. Peripheral-contact components typically have their power and ground contacts spaced apart to help shield signal contacts, and hence most such components do not have contacts for different power planes within a few hundred microns. The power per given area is also small; ten Amperes on a chip with a 40-millimeter periphery, or ¼ Ampere per millimeter, would be high for a peripheral-pad-ring chip, so again having a regional power plane with one Ampere per square millimeter will typically be sufficient. Thus the optimizations for array-contact components are a useful starting point for optimizing for peripheral-contact components.

When peripheral-contact components are logic-limited rather than pad limited, this consists of a ring of such pads in the range of 60 microns by 80 microns on an 80-micron pitch. Tighter pitches are used for the peripheral contacts when a component is contact-limited; typically the pads would be placed in two rows of 40-micron by 60-micron pads on a 50-micron pitch within a row and an 80-micron row-to-row pitch. But while the density of the array-contact embodiments is high enough for either of these peripheral-contact chips, support for the highest-density array contacts must be traded off because the space in between the peripheral contacts is very small (at most 15 microns), and hence the substrate contacts must made very small so as not to be able to short together two component contacts. However even with a contact diameter of just under 5 microns, which is the point at which electromigration becomes a limiting factor if a copper contact carries 500 milliAmperes, cells on a 43-micron row spacing would still support 50-micron (2 mil) array contacts, which is a full generation tighter than the tightest pitch used in IBM's C4NP process.

Therefore optimizing for current peripheral-pad chips can be done without sacrificing support for any standard array-contact chips, and preferred embodiments use this to support both styles at all currently common contact pitches by using substrate contacts smaller than 10 microns in diameter.

However tighter pitches are sometimes used for peripheral-contact components, and while this is currently uncommon, it is worth considering how to support it in case it becomes more common (although array-contacts appear to be winning for high-end components). A tighter pitch currently being discussed is three rows of 25×40-micron pads on a 30 micron pitch horizontally and a 50-micron row-to-row pitch; with only 5 microns between pads this reduces the allowable substrate contact size to less than 5 microns and the substrate contact pitch to around 25 microns (depending on how much overlap is needed to prevent electromigration from becoming an issue). This tighter peripheral contact pitch thus reduces the area available to around roughly ⅓ of that needed for the above embodiments of the present invention.

Because the power alone even with regional power and ground planes would exceed the capability of transistor based programmable power to substrate contacts, a technology with a higher power density than transistors will be needed. Also, because of the vast number of such contacts, the programmable power will have to have lower leakage (a higher on/off ratio) than current PRAM memories (although these could be optimized for low leakage rather than high speed).

Although not mainstream yet, programmable conductivity such as the contacting carbon nanotubes discussed in the third family of preferred embodiments of the present invention, has been integrated into a CMOS process. The current density supported is even high enough to simply have a programmable conductive element for each contact for each power or ground plane, which will allow dispensing with the regional power and ground planes and gaining the ability to support closely intermingled power planes, such as core power contacts on an inner pad row and signal contacts requiring a different voltage on an outer pad row, which will be more common with three pads rows instead of two, on a denser pitch.

With power planes as low as one Volt in use today and typical tolerances of 10%, a 500-milliAmpere current would use half of its tolerance budget passing through a 0.1-Ohm resistor. A 0.1 Ohm resistor would require around 60,000 carbon nanotubes in parallel, which would require less than ten square microns. This is small enough to bring the total cell size down to 60 square microns for power and ground, 50 square microns for the I/O drive circuitry, and 700 square microns for the cross bar. In a rectangular contact with the proper aspect ratio for hexagonal packing, this is around 30.5 microns by 26.5 microns Unfortunately even this is too large to support 25×40-micron pads on a 30 micron pitch horizontally and a 50-micron row-to-row pitch with only 5 microns between pads (which allows only about 540 square microns per unit cell). Therefore in order to maximize the contact density that can be supported for peripheral pad rings, there is a need for a more compact arrangement of the circuitry of the overall array of unit cells. A preferred embodiment of the present invention therefore maximizes the contact density by allowing substrate circuitry to participate in driving a substrate contact that is not its nearest neighbor substrate contact. This takes advantage of substrate having plenty of cells near the pad rings whose cross-bars and links can be borrowed on behalf of the cells in the pad rings.

This requires that each cell be able to drive the nanopads in each neighboring cells as well as its own nanopads; this is 20 nanopads being drivable by any given cell. However since the drive circuitry is in the nanopads themselves, being able to drive any of 20 nanopads can be accomplished with a tiny transistor tree driving 20 wires, one to each nanopad; the 20 incoming wires from the nanopads would be each be ANDed with the value of one bit of configuration memory, and the results combined through eleven three-input OR gates (or whatever fan-in provides the fastest tree in the process being used). Each nanopad would also have an AND gate controlling the signal from each of the input wires, followed by two three-input OR gates. This allows each cell to be configured for which nanopad its crossbar's IN input is connected to, and which cell's crossbar OUT output each of its nanopads receives from. This is 40 extra memory bits and 54 extra gates per cell, but at over 700 kb/mm$^2$ for 90-nanometer SRAM, and with foundries offering over 400,000 gates per square millimeter in a 90-nanometer process, the increase is under 200 square microns per cell.

This brings the cell size to approximately 4*110+700+200=1340 square microns, or a size of approximately 40 microns by 34 microns in the aspect ratio for closest packing. However the nanopads would be on a 20-micron hexagonal packing (17 micron row-to-row spacing), which is tight enough for either the 25-micron wide nanopads of the tightest peripheral-contact pitch or the 20-micron bumps of the tightest array-contact pitch discussed earlier. Also, with a 1340-micron cell size, the cross-bar density would by higher than the density of either the peripheral pads on a 30 micron by 50 micron pitch or the aforementioned array contacts on a 50 micron by 50 micron pitch.

For convenience in layout the cross-point circuitry of each unit cell can still be concentrated in one place, but each cell will have additional circuitry capable of driving multiple small signal nanopads. In especially preferred embodiments, these nanopads will be placed along multiple 'arms' extending from the heart of the unit cell, with each arm being as wide as the cell and long enough to draw cells from enough area to support the local signal contact density of the ring of bond pads.

Figure 10A:
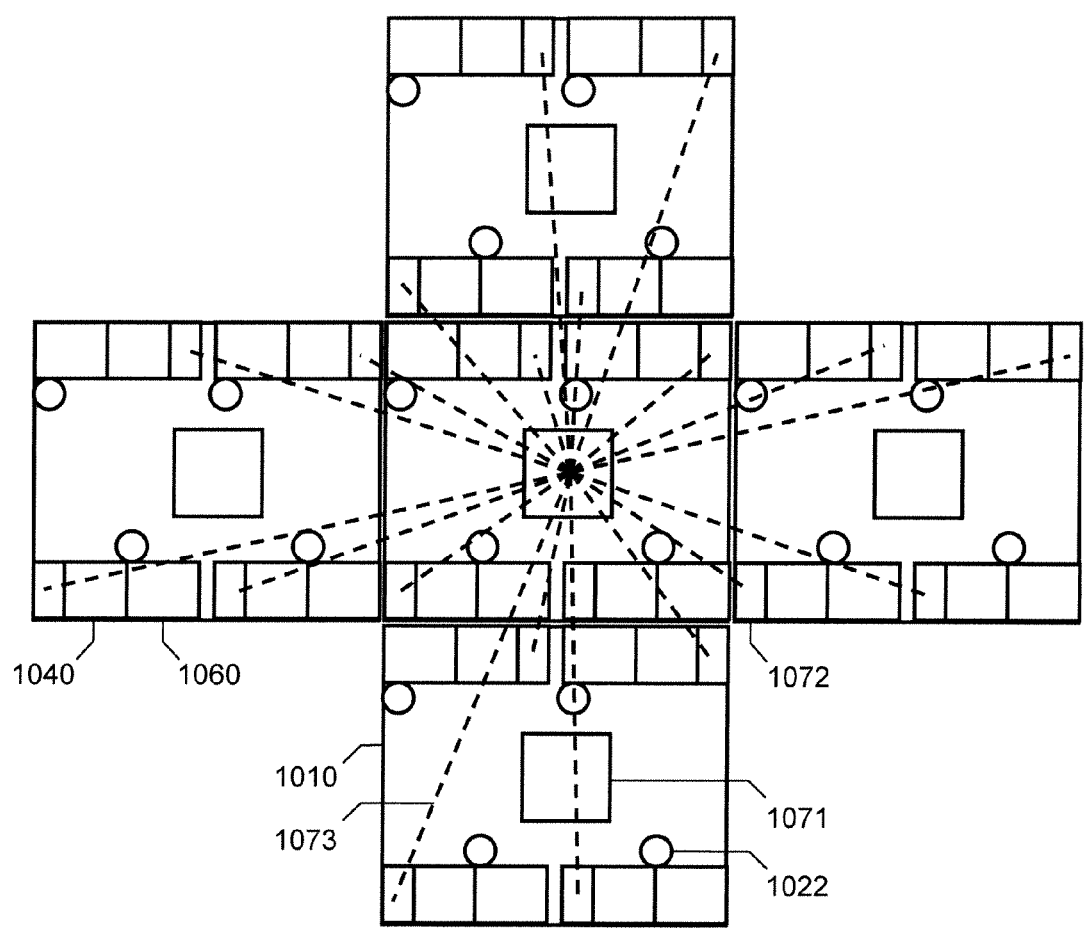
FIG. 10A is a depiction of a compact unit cell for a programmable circuit board, with multiple tiny contacts and with arms of tiny contacts that overlap other cells, showing the tiny contacts that can be driven by a unit cell.
Figure 10B:
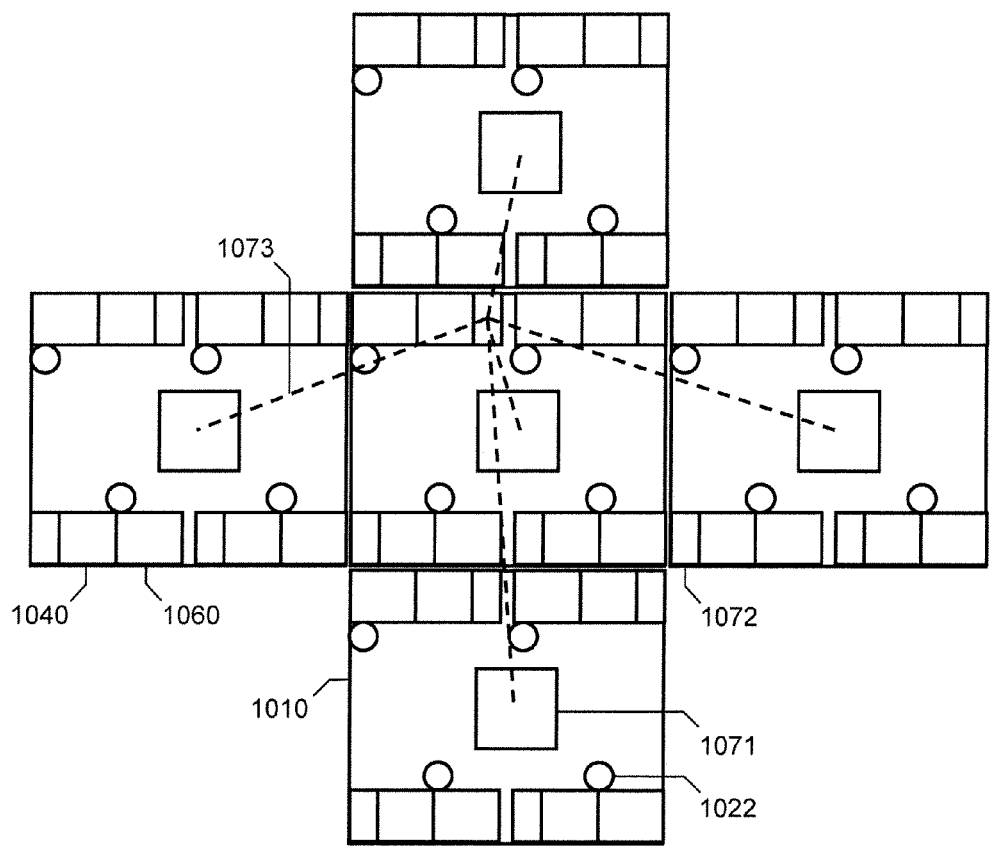
FIG. 10B is a depiction of a compact unit cell for a programmable circuit board, with multiple tiny contacts and with arms of tiny contacts that overlap other cells, showing the cells that can drive a tiny contact.

For example, as shown in FIG. 10A and FIG. 10B, four nanopad contacts 1022 could be used per cell 1010, with each nanopad contact 1022 having 50 square microns of I/O driver circuitry 1040 and 60 square microns of NEMS power and ground circuitry 1060. The added control circuitry 1071 can be configured to relay a signal from any given one of the four nanopad contacts 1022 in the cell 1010 itself or from any of the four nanopad contacts 1022 in any of its four nearest neighbor cells 1010 (twenty nanopad contacts in all in this example), as indicated by the dashed lines 1073 in FIG. 10A. Circuitry 1071 can also relay a signal to the nanopad contacts 1022; however this can merely be sent to all nanopads 1022 that the circuitry 1071 is in communication with, again as shown by dashed lines 1073 as each nanopad contact 1022 can be configured to relay or to ignore the signal.

Added circuitry 1072 at each nanopad contact 1022 is configurable to relay signals from a given one (or none) of the five instances of circuitry 1071 that it is in communication with, as indicated by the dashed lines 1073 in FIG. 10B, to the I/O driver circuitry 1040 that drives that nanopad contact 1022.

In both FIG. 10A and FIG. 10B, the cell's crossbar is not shown but would take up the bulk of the remaining area of each cell 1010. Although the components in these drawings are approximately to scale by area, these are meant only to illustrate the use of multiple nanopad contacts 1022 per cell 1010 and multiple cells 1010 being in communication with each nanopad contact 1022. The placement of the nanopad contacts has been made so that the nanopad contacts 1022 are hexagonally packed, which is preferred, and the power and ground circuitry 1060 has been placed adjacent to each nanopad contact 1022, which reduces the length of the large metal lines needed to carry the current; all other elements, however, are merely scaled to size and placed conveniently for the illustration as their physical placement within a cell would not be critical.

The above embodiments with multiple power contacts and nanopads per cell form an especially preferred embodiment for implementation where the programmable power contacts require considerably less area individually that a cell's crossbar. Especially preferred embodiments of this family therefore include providing cells with the ability to drive other contacts in addition to their own contacts, with those contacts being configurable as to which cell to be driven by, and even further preferred embodiments include multiple contacts per cell each being capable of connecting to multiple power or ground planes and to the interconnection circuitry of multiple cells.

While it would be possible to extend the above embodiments with more nanopad contacts per cell, this does not help with array-contact components because the crossbar density has become the limiting factor. Increasing the length of the arms to more than one cell would help support denser pad rings or additional rows of pads in a pad ring by allowing crossbars to be drawn from farther away, but the above embodiments support the highest densities proposed and currently the trend in high-end components is to use contact arrays rather than pad rings.

There are experimental contact types that further increase the density of contact arrays; work with inductively coupled signal contacts rather than conductive contacts has produced arrays of contacts on a pitch as small as 30 microns (see article "A 1 Tb/s 3W Inductive-Coupling Transceiver for Inter-Chip Clock and Data Link", ISSCC 2006). Each of these has miniscule power needs per contact, reducing the size of the drive transistors from the local power and to the local ground planes to an insignificant size. Because the components are not made to drive long distances on coarse circuit-board lines, and because the contacts are so plentiful, the signal current is also reduced to the point that the signal drive transistor chains will become insignificant in size. The key remaining bottleneck is thus configuration memory.

While the amount of configuration memory could be reduced by further optimization of the cross points, such as by restricting the order in which links of various lengths can be used and thereby allowing further depopulation of the crossbars, the savings would be modest and the loss of flexibility would be significant because the highest-payback optimizations have already been made. Significant increases in density therefore optimize the configuration memory itself rather than the number of bits needed. This also shrinks the memory area needed for nanopad contact configuration circuitry 1071 and 1072 as well as for the crossbar.

While SRAM provides the most convenient configuration memory, DRAM can be made many times denser. Unfortunately DRAM is awkward for configuration memory because using it to drive a transistor chain is equivalent to continuously reading it, and DRAM needs rewriting after reading. With large arrays this is not a problem, but with individual bits the added circuitry negates the space savings from the bit itself. However both NEMS memories such as Nantero's CNTs and phase-change memories can be made more than ten times denser than SRAM, which is sufficient to support even the densest experimental arrays, and use non-destructive reads. This will require extensive use of narrow metal lines at the lowest layers and optimizing the repeaters for minimal area rather than maximum speed, so such programmable circuit boards will be slower than their SRAM-based counterparts. Also since these memories are not yet main-stream, defect rates are likely to be higher, and so more redundancy will have to be included in an array; however this is complementary to being able to draw on the cross-point resources of cells at some distance so the area penalty will not significantly offset the higher density of the configuration memory. Especially preferred embodiments for supporting such extremely dense component contact arrays will therefore use a denser configuration memory with a non-destructive read rather than SRAM. When these dense non-volatile memory embodiments are combined with a dense programmable conductor technology such as the CNT embodiments discussed previously, the resulting cell size is small enough to support array-contact components with spacings as tight as 30 microns by 30 microns.

In gaining the ability to support very fine-pitched arrays, it would be ideal not to give up support for the massive one-Ampere power contacts sometimes used in BGA and CGA packaged components. Exceptionally preferred members of this family of embodiments therefore include means for configuring multiple tiny power transistors and/or multiple signal drive transistors to cooperate to drive a much-larger component contact. Since the drive power generally scales more slowly than the contact area, this allows the sea of tiny contacts of the previously discussed preferred embodiments to drive a wide range of component contact types and sizes.

Figure 11:
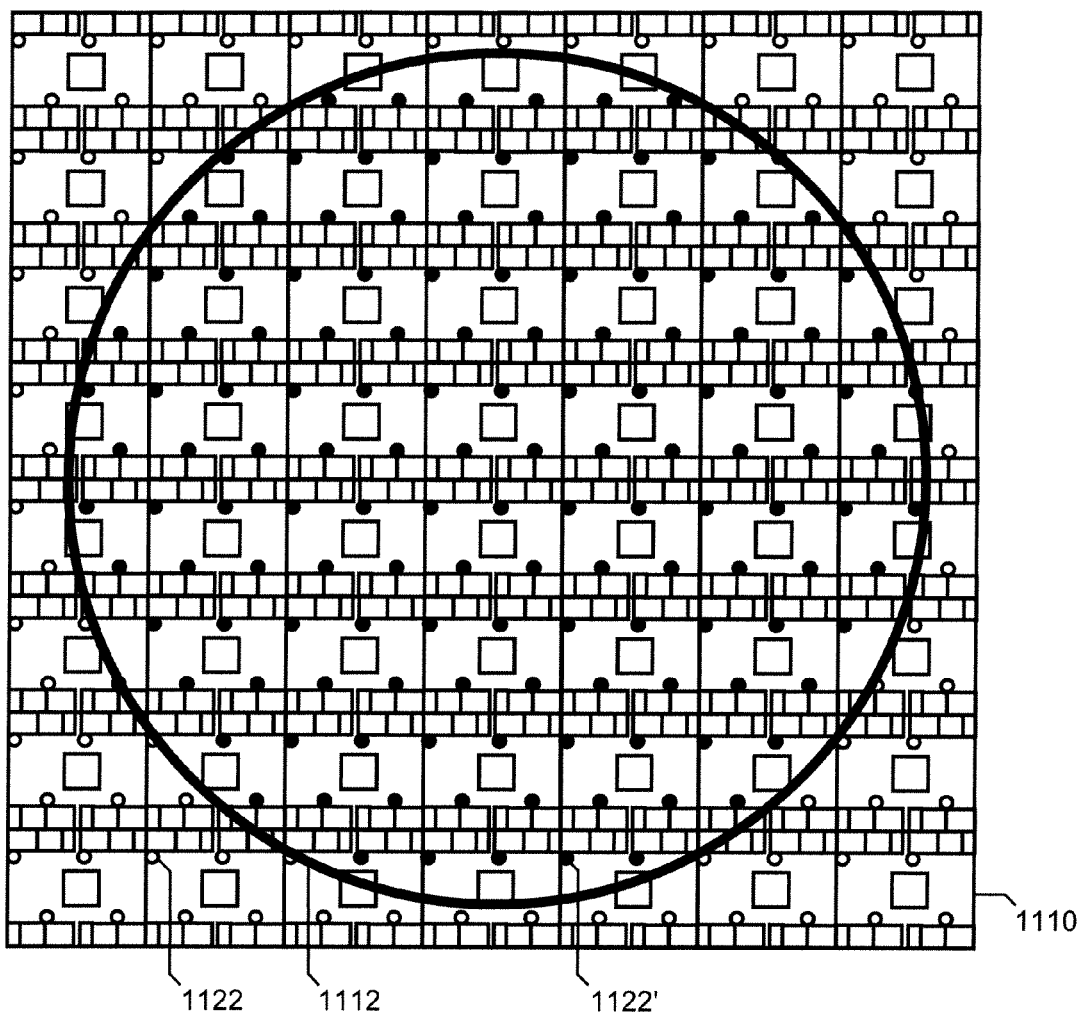
FIG. 11 is a depiction of a contact of a packaged component overlapping multiple compact unit cells.

Any component contact significantly larger than the substrate contact pitch will overlap multiple substrate contacts. For example, FIG. 11 compares an array of cells 1110 that have nanopad contacts 1122 on a 20-micron pitch in hexagonal packing to a component contact 1112 the size of a 250-micron solder ball typical of a BGA component package. Regardless of how it is aligned, component contact 1112 will overlap around 140 nanopads contacts 1122'. Allowing the overlapped nanopads 1122 to cooperatively drive component contact 1112 multiplies the power capability 140-fold over that which could be delivered to the smallest supported component contact by a single substrate nanopad contact 1122. For example, as long as each nanopad contact 1122 can contribute at least 8 milliAmperes, a packaged component contact 1112 that is 250 microns in diameter can be driven with a full one-Ampere of current. Embodiments that allow multiple substrate contacts to cooperate to drive a large component contact will therefore be limited in scale not by the need to support large high-current contacts, but by the current drawn by the smallest contacts that the substrate supports.

The ability to draw on cells some distance away to handle a substrate contact, together with multiple tiny contacts cooperatively driving large packaged-component contacts, greatly reduces the need for added circuitry for redundancy and defect tolerance. If there are five cells that can drive any tiny signal contact, only the very densest array components and triple-row pad ring components would use almost all of the cells in any region, and even then the ability to daisy-chain drawing the interconnect capacity of distant cells to reach beyond a region will generally allow defects to be overcome. And with a dozen or two cells able to cooperatively drive a big component contact, then a cell that cannot participate can be configured around. Two areas still need some added attention; the circuitry associated with each nanopad, and the circuitry associated with the transistor chains for the local power plane. These circuits should be made with transistors sufficiently coarse that defects are extremely rare. Since these transistors are not numerous and occupy a modest area, these circuits can be made robust at relatively little overall cost in area.

Other technologies that can provide conductive paths for power, such as phase-change memory cells, could be used, however they are not part of a mainstream CMOS process, and the on/off ratio of the closest one, phase-change chalcogenides optimized for memories, is only three orders of magnitude, so leakage power across millions of nanopads would be far too high. It is also possible to integrate transistors that support a higher power density, such as silicon germanium; currently the cost in complexity is too high to be an optimal solution, but with germanium increasingly being added to silicon for mechanical strain engineering to increase transistor speed, the cost penalty of using the electrical properties of silicon germanium for at least the power transistors is shrinking. Thus although 90-nanometer silicon CMOS has been used in the above examples, it is anticipated that the optimum technology for cost/performance balancing will depend on the speeds and densities intended to be supported by a given implementation, and that even at a given speed and density, the optimum technology will change over time as new processes are introduced or costs are reduced.

In addition to circuit-board-sized substrates supporting multiple components, regions of the programmable circuit board substrate of the present invention that are the size of packaged or unpackaged components are also useful. By adding through-wafer vias for signal contacts as well as for ground contacts, programmable interposers that can map a component's contacts to a different pattern can be achieved. This can be used, for example, to avoid redesigning a PCB when the contact patterned of a component changes with a new generation of that component, or when substituting a component with a different contact pattern when assembling a PCB. Such an interposer can also be used to adapt a component to a programmable PCB that that does not support the contact type or spacing of that component. Using the alignment-insensitive contacts and programmable connectivity of embodiments of the present invention for the interposer eliminates the need to have a custom interposer design for each component whose contacts are to be re-mapped.

Seventh Family of Preferred Embodiments

Contact Detection

Even with the preferred embodiments of the present invention discussed above, components still have to be aligned precisely enough that their contacts overlap the substrate contacts that are programmed to connect them to the crosspoints that are in turn programmed to interconnect them. This alignment requires sub-millimeter precision in placement even with packaged components, and much higher precision when dealing with the tighter contact pitch of bare dies. While pick-and-place equipment with the required precision is routinely used in the industry, such equipment is expensive and it has to be programmed to place the parts correctly. In a large production run this is only a minor drawback, as the costs of both the equipment and the programming can be amortized across a large number of circuit boards. But for one-of-a-kind boards and frequently-modified prototypes (the very systems where programmable circuit boards are most useful), these costs are a major impediment. There is therefore a need for a programmable circuit board that is tolerant enough of component placement to allow low-cost placement equipment to be used, and even to support hand-placement of components with up to several millimeters of placement variability and several degrees of alignment variability.

The array of substrate contacts of the above preferred embodiments can adapt to a wide variety of contact spacings and will always have at least one substrate contact overlap each component contact regardless of placement. However although at least one substrate contact will be capable of driving each component contact, which substrate contact will overlap with which component contact depends greatly on the placement.

By providing the means to determine the placement of the components and their contacts relative to the substrate contacts, and the means to provide this placement information to the routing program for figuring out and configuring the internal substrate interconnections needed to achieve the specified component interconnections, the programmable circuit board of the present invention can allow even hand placement, eliminating the need for pick-and-place equipment when building a system using the programmable circuit board. While a camera-based system could achieve the hundreds of microns of spatial resolution needed for detecting the placement of packaged chips to the necessary precision, and possibly even the tens-of-microns precision needed for bare dies, such a system would add considerable cost, and determining which substrate contact overlap which component contacts would involve a number of extra steps, providing opportunities for errors.

However by providing the substrate itself with the means to determine which nanopads overlap with component contacts, the need for external equipment like cameras can be avoided and the overlap information can be obtained directly. There are many means known to determine whether a region is covered by a conductor (and even where the signal contacts are inductively coupled instead of conductively coupled, or are optical rather than electrical, the power and ground contacts will still likely be conductors, establishing a recognizable pattern of conductive contacts), and simple ones such as conductive and capacitive detection are easy to integrate into an integrated circuit. Conductive detection is simple for component contacts large enough to cover several substrate contacts.

There are many ways known in the art of integrated circuits to see whether two conductors are shorted, but it is important to choose one that is compact and that doesn't interfere with the utility of the nanopads afterward. For example, if one uses a simple trick like connecting a first nanopad to power through a high resistance and a second nanopad to ground through a lower resistance and checking the voltage on the first nanopad, it is important that even the 'lower' resistance be high enough to ensure both that it doesn't interfere with I/O signals on either nanopad, and that the current leaking across all active nanopads does not consume significant power. With large millimeter-scale contacts, resistances of tens of kiloOhms would be sufficient, and even with the many millions of nanopads on a programmable circuit board designed to support dense bare-die contacts, typically only tens to hundreds of thousands of these would be active, so resistances in the hundreds-of-KiloOhm range would be sufficient for the lower resistance.

Even more sophisticated arrangements that support systems with millions of active contacts can be very compact; the 'lower resistance' can be a transistor that connects to ground, greatly reducing its power consumption when it is not being used to detect a component contact. In embodiments where each nanopad can serve as a ground contact, there is such a transistor already available. Especially preferred embodiments therefore use a programmable ground capability as part of the contact detection arrangement, and in further preferred embodiments this programmable ground connection capability is also operable to allow the nanopad to serve as a ground contact for an affixed component.

For component contacts large enough that each will overlap a plurality of nanopads, if two nearby nanopads are shorted together, they are covered by the same component contact (this is specific to nearby nanopads because father-apart nanopads can be shorted together by both sitting under a component's power or ground plane contacts). But component contacts may be small enough to overlap only a single nanopad, and it can be useful to detect this as well. Also it may be useful to know that there is a sufficient area of overlap, such as for ensuring that one does not try to power a one-Ampere component contact through a nanopad that it is barely touching (which could lead to electromigration problems over time).

Figure 12A:
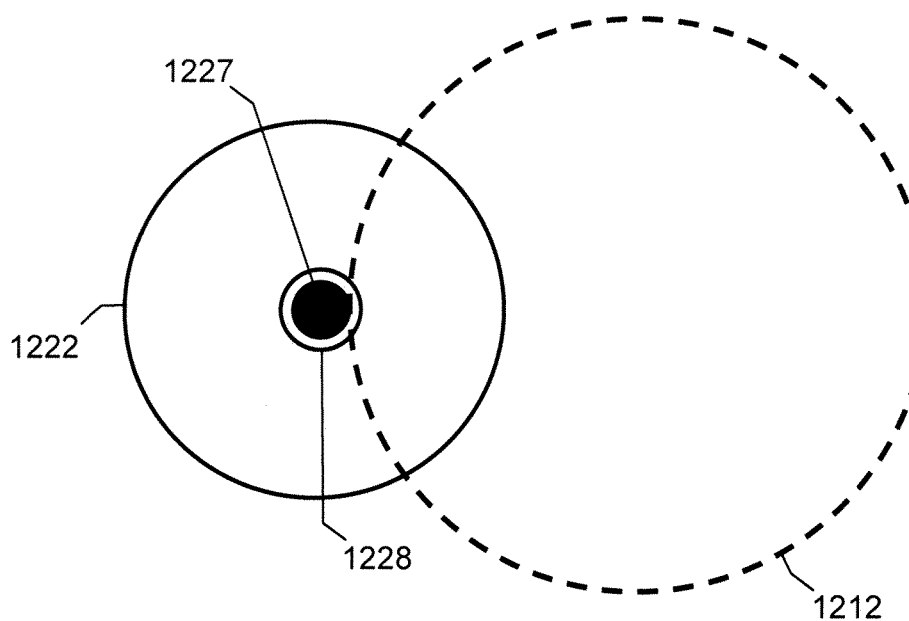
FIG. 12A is a depiction of a substrate contact with a central detection wire to detect the presence of a component contact.

The simplest case is shown in FIG. 12A; when a component contact 1212 is large enough that it will always overlap at least one nanopad 1222 at least to the middle of that nanopad 1222, and overlapping to the middle of a nanopad 1222 provide sufficient overlap area to drive any component contact 1212. Detection in this case is simple; a single detection wire 1227 can be placed in the middle of each nanopad 1222, in a small hole 1228 in the nanopad. Checking a given nanopad 1222 to see whether its detection wire 1227 is shorted to the body of that nanopad 1222 will determine whether that nanopad 1222 is overlapped at least to its middle by a component contact 1212. To occupy minimum surface area, the detection wires can terminate in vias (small vertical wires, as is well known in the art) as these each take only a few square microns of the surface area.

Figure 12B:
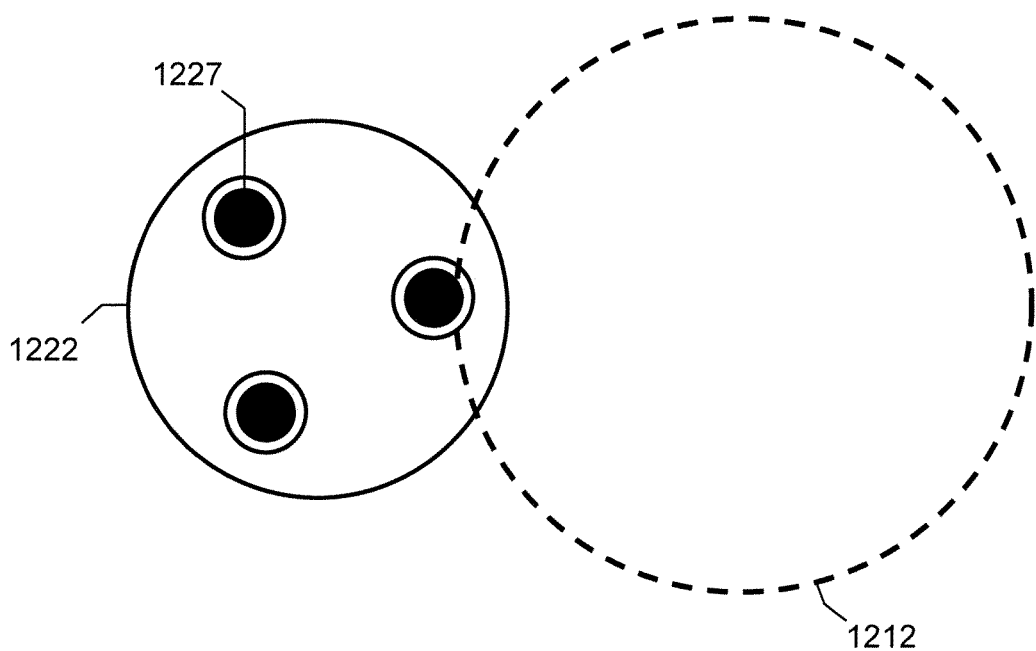
FIG. 12B is a depiction of a substrate contact with internal detection wires detecting slight overlap of a component contact.

As shown FIG. 12B, to support cases where a component contact 1212 may be small enough that its biggest overlap with a nanopad 1222 may not reach the middle of that nanopad 1222, then multiple detection wires 1227 can be used, with these detection wires 1227 set far enough in from the rim of a nanopad 1222 that overlapping a detection wire 1227 determines that there is sufficient overlap area between the component contact 1212 and the nanopad 1222.

Figure 12C:
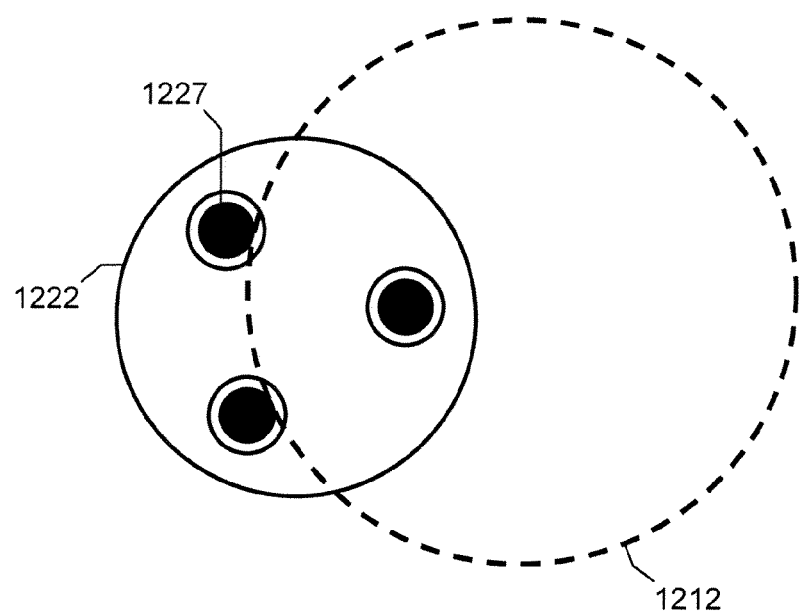
FIG. 12C is a depiction of a substrate contact with internal detection wires detecting substantial overlap of a component contact.

As shown in FIG. 12C, when it is critical that even more of a nanopad be overlapped, such as for driving a power contact when the nanopads are small enough that a nanopad can fit between two peripheral contact pads, then overlapping more than one detection wire 1227 can be used as the criterion for sufficient overlap. In this example, three detection wires 1227 are used to determine whether a component contact 1212 overlaps significantly more than half the area of a nanopad 1222.

Figure 12D:
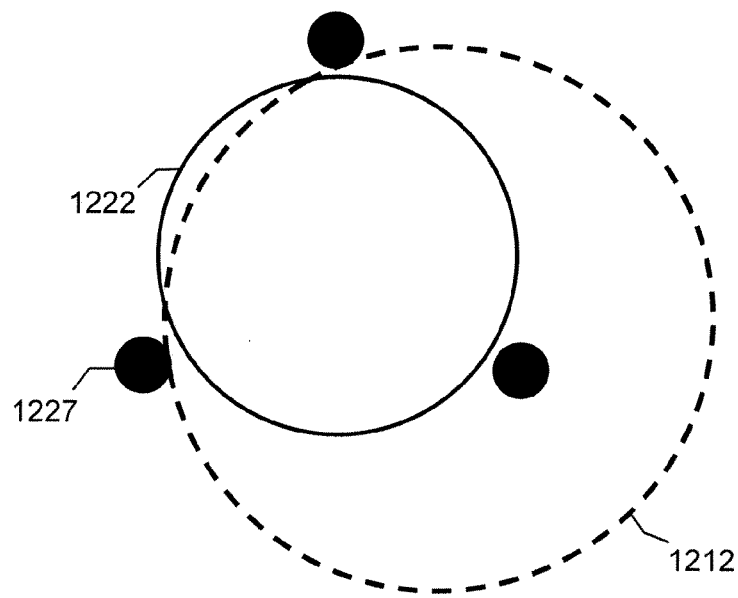
FIG. 12D is a depiction of a substrate contact with adjacent detection wires detecting substantial overlap of a component contact.
Figure 12E:
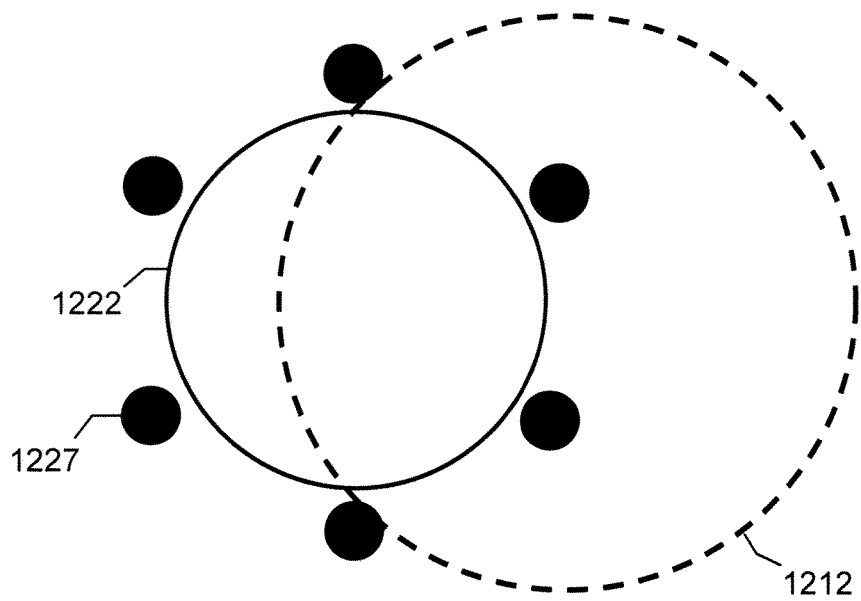
FIG. 12E is a depiction of a substrate contact with adjacent detection wires detecting the degree of overlap of a component contact.
Figure 12F:
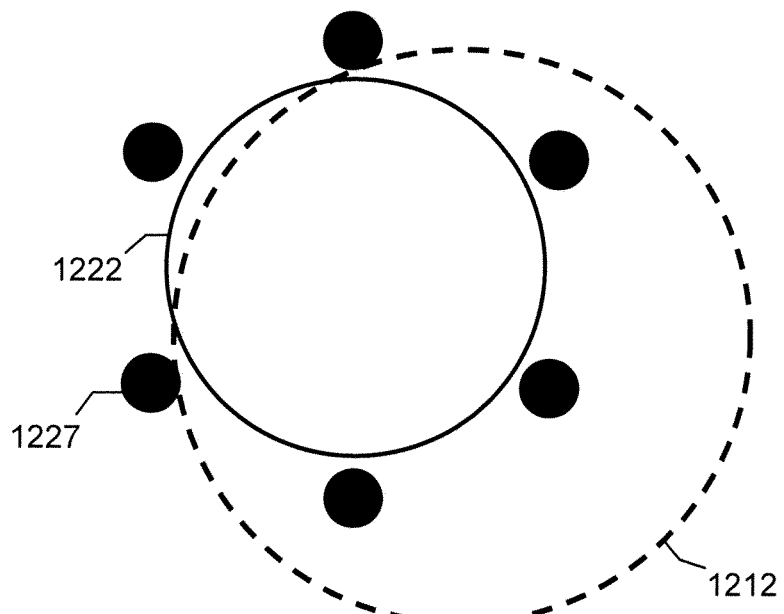
FIG. 12F is a depiction of a substrate contact with adjacent detection wires detecting a higher degree of overlap of a component contact.

As shown in FIG. 12D, for very small nanopads the area taken up by the detection wires themselves may become too costly, so it will be optimal to use exterior detection wires, the detection wires 1227 can be in close proximity to the nanopad. When more precision is needed regarding the area of overlap between a component contact 1212 and a nanopad 1222, more detection wires 1227 can be used. For example, FIG. 12E shows the minimum overlap between a component contact 1212 and a nanopad 1222 for four of six detection wires 1227 to be overlapped, and FIG. 12F shows the minimum contact overlap for five detection wires 1227 to be overlapped. The optimal number of detection wires 1227 depends on how much precision is needed; six wires are used solely to illustrate the principle.

In cases where the exterior detection wires 1227 are used because a small nanopad 1222 is required for fitting between closely-space component contacts 1212, it would defeat the purpose of making the nanopad small if the detection wires 1227 had a low-enough resistance path to the body of the nanopad 1222 to short together two component contacts 1222. It is therefore desirable to have a compact way to check whether a detection wire 1227 and its nanopad 1222 are overlapped by a conductive component contact 1212 without providing a low-resistance path between the detection wire 1227 and nanopad 1222. Also, the resistance of a resistor increases as its width shrinks, so using a very high resistance path is desirable to allow tiny resistors to be used. If the equivalent of a DRAM cell is used for the detection, the DRAM cell can be charged, and leakage across a very high resistance between the detection wire 1227 and its nanopad 1222 resistance will be integrated over time, allowing a very high resistance to be distinguished from not having a conductive path at all.

While in a 90-nanometer process a typical DRAM cell can be as small as 0.05 square microns, standard embedded DRAM currently introduces additional process steps, and therefore additional costs. Thus although a DRAM cell designed for a logic process can be up to ten times larger, logic-process DRAM is preferred because even the checks for eight wires will fit in under 5 square microns in a 90-nanometer process, and this area is insignificant compared to the other constituents of a unit cell. Since the objective is to detect charge leakage rather than to withstand charge leakage, a smaller DRAM capacitor could also be used, further reducing the area.

For packaged components whose contacts cover many substrate contacts, or even when the spaces between components are large enough that at least one non-overlapped substrate contact lies between any component contacts, this is sufficient information. However it can also be useful to distinguish whether two adjacent overlapped substrate contacts are overlapped by the same component contact. This can be accomplished by including the circuitry to determine whether two neighboring nanopads are shorted together as well as the circuitry to determine whether an individual nanopad is overlapped. Even in the case of a hexagonal grid, this still fits in less than 10 square microns of circuitry per nanopad.

Another suitable detection method is capacitive detection, which uses the fact that the capacitance of a capacitor changes when a conductor near its plates rearranges its own charges to partially nullify the electrical field between the plates, allowing more charge to be stored for a given voltage or reaching a lower voltage when the same charge is stored. Since differences in voltage and differences in capacitance are both easy to detect (every DRAM chip contains tens of thousands of 'sense amp' circuits for detecting voltage differences, and oscillator frequency is very sensitive to capacitance), pairs of 'plates' (which can simply be tiny vertical via wires) can have their voltage or capacitance compared to determine which have a conductive contact in proximity (suitable circuitry is well known in the art, having been used for both elevator buttons and computer inputs for decades). The placement of the detection wires can be the same as for the conductive detection, however placing the wires within or near the conductive nanopad itself dilutes the effect of the conductive component contact. Placing the detection wires some distance from the nanopads solves this but requires more of them to ensure the requisite contact placement detection accuracy. Therefore capacitive detection means are less preferred for detecting conductive component contacts, and are preferred only when detecting non-conductive contacts such as capacitively or inductively coupled contacts (which are still referred to as 'contacts' even though they don't actually physically touch each other).

Once the contact overlaps have been detected by the substrate circuitry, this information can be gathered and exported to configuration software through any of a number of means well known in the art. For example, a scan chain such as that used to report defects can be used to export the contact overlap information. This information can then be used in several ways to assist in establishing an operable system. Some of these ways involve displaying the overlap map; preferably a magnified image will be displayed, along with the ability to pan and zoom as are well known in the art of displaying positional data; magnification allows higher precision in displaying the placement of the overlapped contacts; even with wafer-sized programmable circuit boards with millimeter substrate contact spacing, panning is critical with tiny nanopad contacts due to the sheer number of such contacts typically exceeding the capacity the display; and zooming allows rapidly moving around at low magnification and then zooming in at high magnification when an area of interest is found.

Once the image of the overlap map is displayed on the screen, then the system assembler can, using drawing tools or schematic capture tools or techniques well known in the art of PCB layout, identify the components to the system software and specify how they are to be interconnected. A routing program, as is well known in the arts of chip layout and FPGA programming, can then calculate how to use the available routing resources within the programmable circuit board to establish the specified interconnections between components, and a routing program as used in the PCB and chip routing industries can be used to specify the appropriate connections to power and ground. As is well known in the art of PCB layout, once a part has been identified by the user, information to assist with connections (such as which contacts are inputs, which are output, and which should be connected to which voltage levels and which to ground) can typically be found in a commercially available parts library. Even with custom parts that are not found in a commercial library, it is typical to add such descriptions to a private parts library for convenience.

However in many cases the placement of the components and their interconnections to each other and connections to power and ground will already have been specified by the system designer before assembly of a prototype begins. In this case a desired overlap map can be calculated from the specified placement of the components and the relative position of their contacts as specified in a components library. The desired overlap map can then be displayed on the screen substantially simultaneously (relative to human visual perception) with the actual overlap map determined from the programmable circuit board itself. If a component has not been permanently affixed, it can be nudged until its position on the actual overlap map matches its position on the calculated overlap map. Preferably it can then be secured in position before nudging the next component.

While this does allow using a pre-specified placement instead of identifying the components every time, even with nudging hand placement is limited in accuracy (rolling the tip of a finger forward to gently push a component is the most precise hand placement technique that the present applicant knows of, and can readily achieve precision down to 200 microns, and to 100 microns if one is willing to make repeated attempts, but achieving such accuracy on placement in two dimensions as well as in orientation simultaneously is meticulous work). But for embodiments of the present invention that include programmable power and ground as well as alignment-insensitive substrate contact means, the specified placement for each component can be nudged instead until its calculated overlap map matches the actual overlap map as determined from the programmable circuit board. Commercial PCB design software allows similar 'nudging' of specified component placements during the design phase of a standard PCB to improve routability, and maintains specified interconnections between components during nudging). Nudging the specification to match the component placement rather than nudging the component to match the specification is far superior because this technique allows all components to be placed and temporarily or permanently affixed, and then all components to be matched without moving any physical components, and because it allows the nudging to be done with unlimited accuracy and/or with convenient substrate-contact granularity.

In cases where the components, their contact patterns and their placement are known to a sufficient degree, such as the hand-placement of known chips in a known arrangement with the uncertainty being substantially due to the precision by which they can be hand-placed, this process can also be automated. The outline of the known contact pattern for each component can be shifted and rotated around its theoretical position, while comparing the overlap map that its contacts would produce to the actual overlap map determined by the programmable circuit board, until they match (or until the best match is found, according to any of a number of algorithms known in the art of pattern matching). The calculated overlap map can then be used as is, or it can be adjusted on a contact-by-contact basis to produce a more perfect match with the actual overlap map; for instance if the calculated map indicated that a component contact will be centered squarely between two substrate contacts, but the actual map shows only one substrate contact to be overlapped (or to have a higher degree of overlap), then that component contact in the calculated map can be adjusted to match the detected overlap.

Preferred embodiments therefore include means to detect the position of a component on the programmable circuit board and to compare that position to a specified position for that component, and especially preferred embodiments detect the component position through circuitry in the programmable circuit board substrate that detects the overlap of component contacts with substrate contacts. Further preferred embodiments allow a component to be nudged while comparing its detected position to its specified position, and yet further preferred embodiments allow the specified position of the component to be nudged to match the detected position of the component. Exemplary embodiments also include software that automatically nudges the specified position of a component to match its detected position.

However in the very field that programmable circuit boards are ideally suited to, experimental prototyping, PCBs are repeatedly modified before a design becomes 'solid'. Also because the extreme routability of the programmable circuit boards of preferred embodiments of the present invention, the built-in circuitry for maintaining signal integrity, and the placement insensitivity, components placement can be much freer than with a traditional PCB. Thus it is not necessary to start with a carefully designed placement checked by sophisticated tools; one can use a design where the components that will be interconnected are simply placed near one another. Therefore it is useful to be able to simply place components on the programmable circuit board and to infer the 'desired placement' and the component types from the overlap map, and to feed that information into the PCB design tools.

Figure 13A:
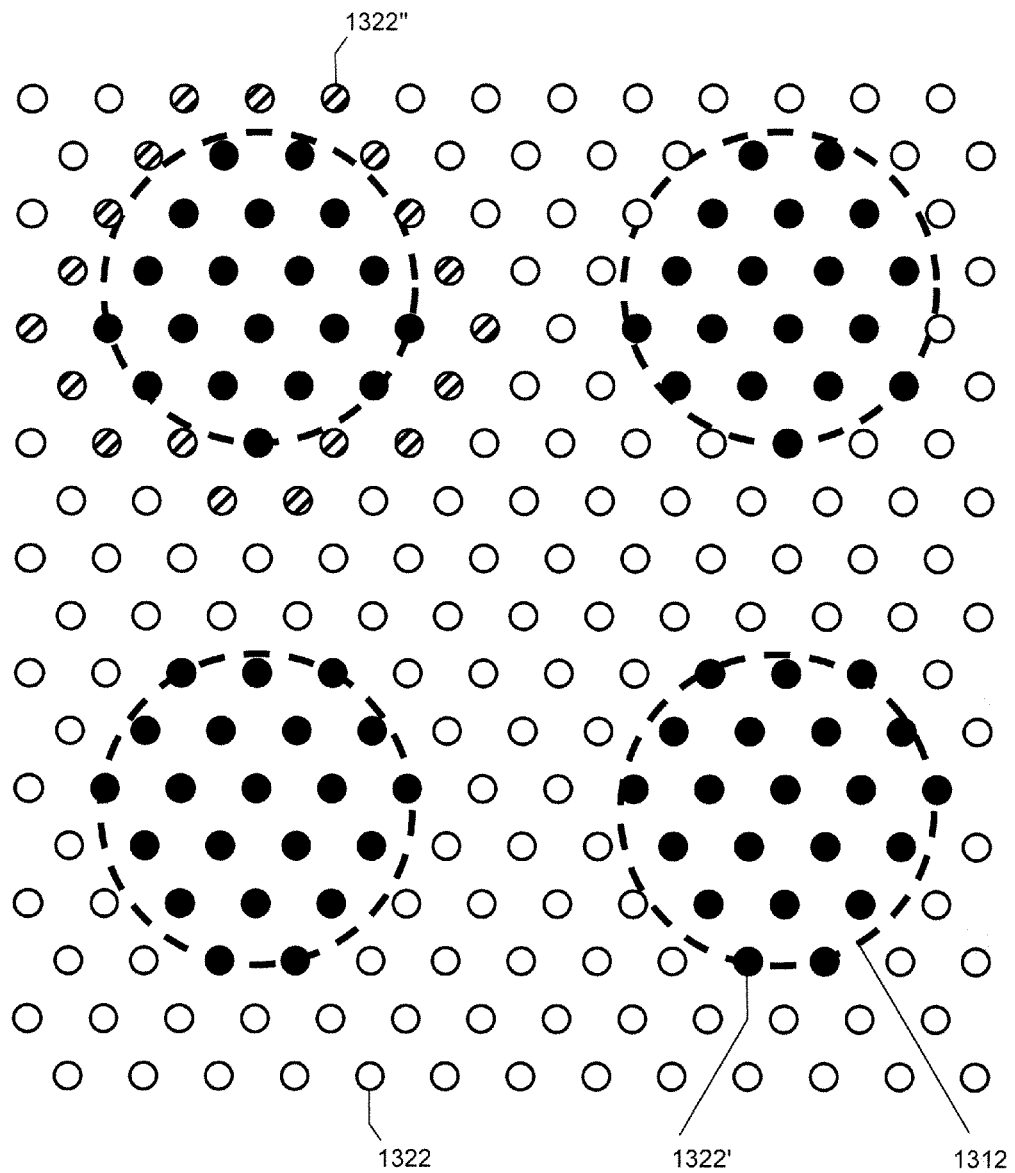
FIG. 13A is a depiction of using overlapped substrate contacts to map the contacts of a component placed on the substrate.

As shown in FIG. 13A, a higher-level mapping of substrate contacts 1322 to component contacts 1312 can be inferred from the overlap map by scanning the overlap map for an overlapped substrate contact 1322' that has not yet been mapped to a component contact 1312. When such an unassigned overlapped substrate contact 1322' is found, every nearest neighbor to that contact is checked to see if it is overlapped by a component contact 1312. In cases where the substrate contacts are denser enough than the component contacts to guarantee a non-overlapped substrate contact 1322" between any two component contact 1312, any overlapped neighboring substrate contacts 1322' must be covered by the same component contact 1312; if the substrate contacts are not dense enough to guarantee this, then the preferred embodiments described above provide means to determine if the neighboring overlapped contacts are overlapped by the same component contact, as discussed above.

Any neighboring overlapped substrate contacts 1322' on the programmable circuit board that are overlapped by the same component contact 1312 are mapped (assigned) to that component contact 1312 in the contact map, and the process is then repeated for the nearest neighbors to those substrate contacts (skipping checking substrate contacts already assigned). Once the limits of a given component contact 1312 have thus been established, the overlap map is scanned until the next unassigned overlapped substrate contact 1322' is encountered. The mapping of the component contact 1312 is then repeated around the newly found overlap substrate contact 1322', after which the scanning is continued, and this is repeated until every overlapped substrate contact 1322' in the overlap map has been added to the contact map.

Once the contact map has thus been established, it can then be then scanned to build a component map. This can be done by using the regular spacing found on essentially all standard components, such as an array of 250-micron component contacts on a 1-millimeter pitch, or a ring of 60-micron by 80-micron bond pads on an 80-micron (linear) pitch, to identify components by a set of contacts that matches such a pattern. Component contacts with a regular spacing in a pattern that matches one of the standard contact patterns (primarily but not limited to single, double and triple rings (which includes TSOPs and QFPs as well as peripheral-pad bare die) and square and hexagonal arrays (CGAs, BGAs, flip-chip and pad-array bare die), and hybrids like a peripheral pad ring with a sparse array of power and ground contacts in its center), are assigned to the same component in the component map.

Figure 13B:
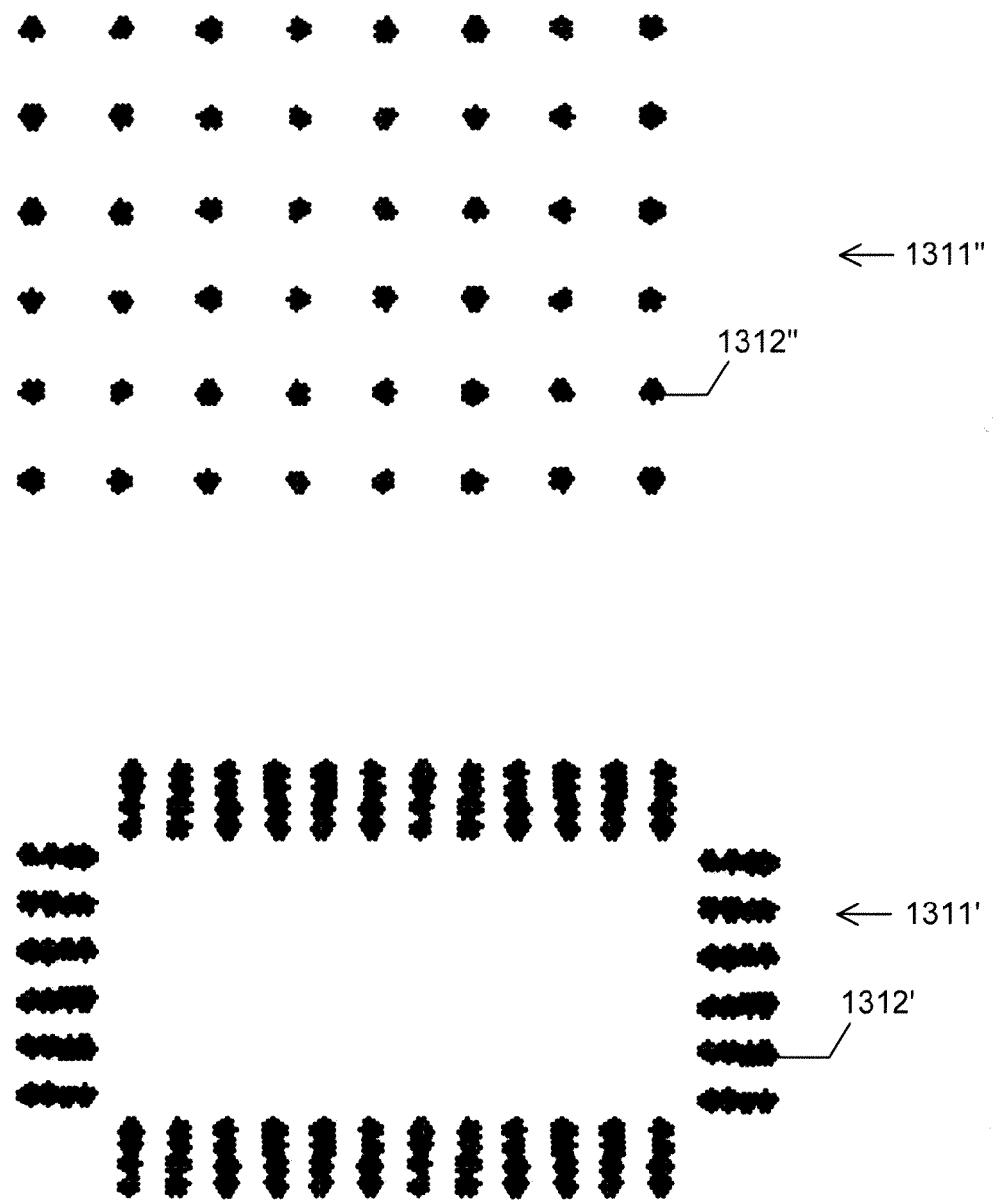
FIG. 13B is a depiction of using a map of the contacts of components placed on a substrate to identify those components' contact types and contact counts.

FIG. 13B shows part of a completed contact map, with two components 1311', a TSOP with ¼ millimeter wide contact wires 1312' on a ½-millimeter pitch, and 1311", a CGA with an array of 250-micron column contacts 1312" on 1-millimeter pitch, as would be produced from an overlap map as shown in FIG. 13A. Algorithms from the art of image recognition could easily distinguish such regular patterns and identify the contact type and number of contact of such components. But because many chips share the same package type and size, such as a 34-by-34 grid of 250-micron contacts on a one-millimeter spacing, such information is not sufficient to uniquely identify each chip.

None-the-less, when combined with a parts library this information would be enough to limit the choices to where a list of matching choices can be displayed for the user to pick from. Techniques well know in the art of allowing a user to pick from a list could be used to assist with this, such as scrollable lists, alphabetized lists that scroll as the choice is typed, searchable lists, lists that put the most recently used matching choice(s) at the top, lists that allow the user to enter a choice not on the list (which can then added to the list), etc. While it is possible that a pathological case could be contrived, such as two 10×10 array components placed so that their contacts exactly match a 10×20 array, in practice the hand-placement of components would make this highly improbable. Good software design would allow the 'other' choice (choice not on list) to be used to specify that it is two or more parts rather than one.

However further information can be gained from a programmable circuit board of the reprogrammable preferred embodiments above. If a substrate power plane is powered to a low voltage, then the mapping software can 'guess' at a power contact for a component (either at random or based on the list of likely components and their descriptions in the parts library), and configure the programmable circuit board of the present invention to power that contact pin from the low-voltage power plane. Each other contact of the component would then be checked by connecting it to ground through a resistance intermediate between the extremely low resistance of contacts that share a power plane (typically a small fraction of an Ohm), and the resistance of a normal switched-off output contact (typically tens of thousands of Ohms). If the voltage in the substrate contact is comparable to the voltage of the low-voltage power plane, then both component contacts share a power plane or a ground plane within the component (even one component can have several such planes, typically one power plane for a low core voltage and one for a higher I/O voltage, plus a ground plane); if the voltage is much less than the voltage of the low-voltage power plane, then the two component contacts do not share the same component power or ground plane. If no component contact shares such a plane with the chosen powered component contact, then the process is repeated with a different component contact being powered. (For parts that cannot take even a low voltage on some of their contacts, preferred embodiments will allow the user to exclude those components from this plane-mapping process).

Figure 13C:
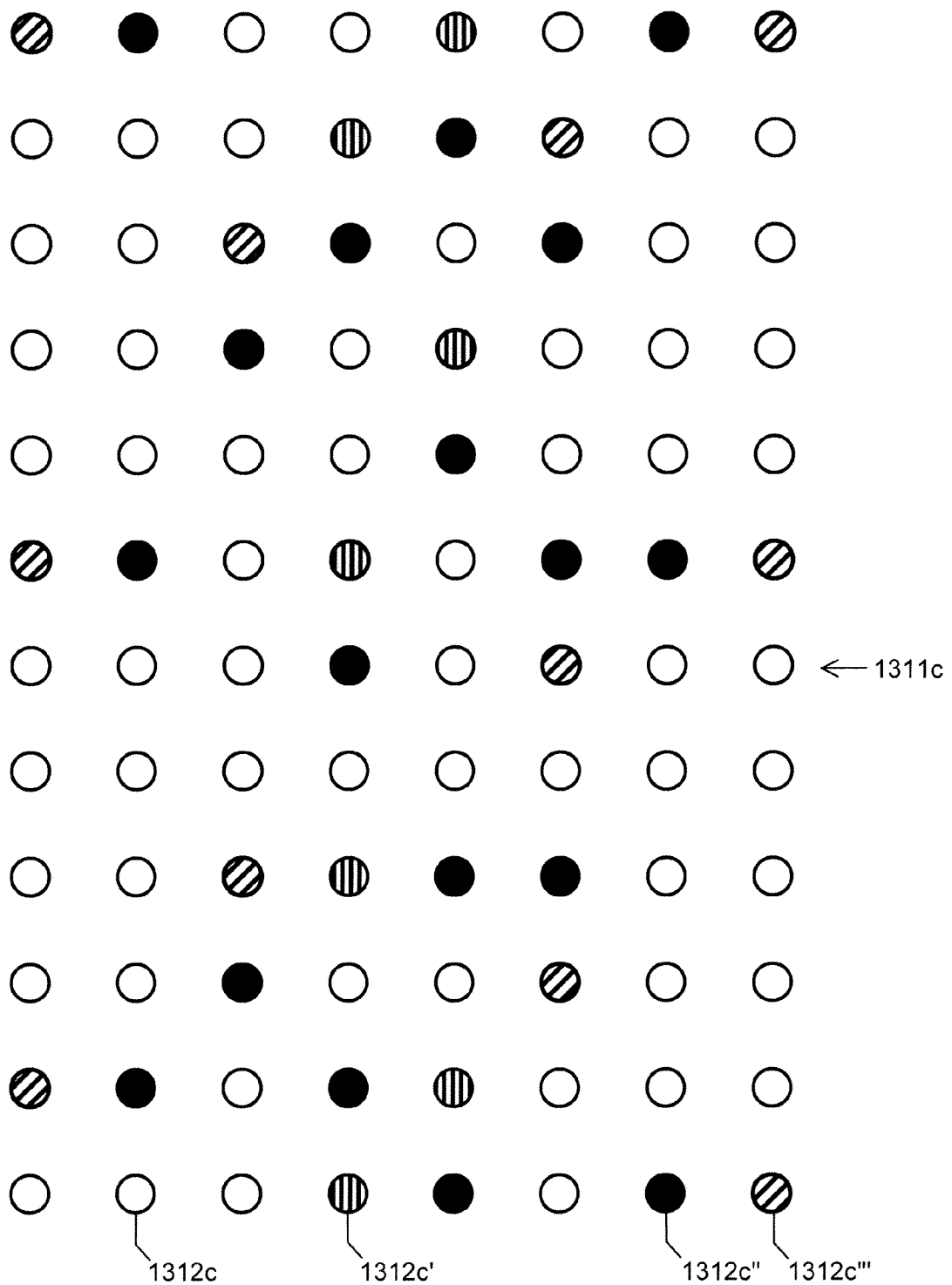
FIG. 13C is a depiction of using a map of the power and ground planes of a component to identify the component.

As illustrated in FIG. 13C, in such manner the contact map for a component can have one or more power and ground planes identified and mapped. In FIG. 13C three power-or-ground planes of component 1311C have been mapped; that with component contacts 1312C', that with component contacts 13120", and that with component contacts 1312C''', along with numerous component contacts 1312C that are not connected to other contacts through low-resistance paths. While it cannot be definitively determined from the contacts themselves what the three planes are (typically a core power plane, an I/O power plane and a common ground plane), the set of contacts form a signature for the component, and this signature is typically enough to uniquely identify a component at the connectivity level, as components with matching power and ground plane patterns are usually designed to be interchangeable and thus have identical uses for their other contacts.

Details that cannot be ascertained, such as the speed grade, usually do not influence the connectivity, however even in cases where one 'footprint signature' maps to more than one potential part (such as memory chips where the I/Os can either all be one bi-directional bus or be split into an input and an output bus), this information reduces the list possible matches to a few components, making the choice-assistance techniques for lists even more likely to pre-select the correct choice.

To confirm a highly likely 'guess' as to a component's identity, such as when one and only one matching component has been repeatedly used, this process is very efficient. However for an unknown component, where a given contact typically has a 10% to 20% chance of being a power contact or a ground contact and thus a member of such a plane, this process can be sped up by powering a group of contacts to start with. If the group doesn't power a plane, then many contacts have been eliminated at once and a new group is chosen. If the group does power a plane then at least one member must be a contact for that plane, and the group is reduced by eliminating some members; if it then no longer powers the plane, the group is then replaced by the members just eliminated. The elimination process continues until there is only one contact left in the group, and it powers a plane. Ideally such a search is a binary search, with the group size being chosen so that it has a roughly 50% chance of powering a plane, and with the number being eliminated each time being roughly half of the remaining group members. For example, the initial group size could be 8 contacts, in the likely event that this would contact at least one plane, this would then lead to 4 contacts 2 contacts and then 1 contact more quickly on the average than powering pins serially.

If it is desired to map additional planes, then the members of the newly-determined plane are eliminated from the contacts eligible for inclusion in the starting group. Also, if the number of contacts reporting that they are part of the plane decrease but not to zero following the elimination of some contacts from the powering group, then more than one plane was being powered and the retained group contains at least one contact for the plane that is still powered and the just-eliminated group contains at least one contact for the other plane; it can therefore be used as the initial group (minus contacts from planes already mapped by then) when scanning for the next plane to map. For an unknown part, having complete maps of the power and ground planes allows the software to automatically enter those contacts into the part description when the user adds that part to the parts library, and to connect that part the user just has to say which power plane of the part goes to which power plane of the programmable circuit board, rather than dealing with each individual contact.

If a search through a library has identified a number of potential matches for a component, then an initial group can be configured so that it contains at least one power or ground plane contact for each of the potential components. This will ensure that if the component is indeed one of the matches, at least one plane contact will be powered on the first try. In general the plane-map of contacts powered by that group will match at most one of those initial matches, immediately limiting the choices to that component or 'other' (and if it matches no components on the list, then the only choice is 'other').

Preferred embodiments of the present invention therefore include means to identify, in a library of components, those components that match the type, number and or spacing of detected contacts of a component. Especially preferred embodiments also include means to map the contacts of one or more power or ground planes of a detected component and to use the plane map(s) to identify or narrow down the set of possible components that match the contact type, number and or spacing, and/or to use the plane map(s) to assist a user in adding a new component to a component library. Further preferred embodiments also include means to determine, from a set of possibly matching components for the contact type number and/or spacing of a detected component, a set of contacts that if powered will produce a map of zero, one or more planes that will uniquely distinguish components in the of possibly matching components.

Once components have been identified, whether pre-specified, recognized, selected by the user, or a mixture of these, the software can then assist the user in interconnecting the components using techniques well known in the art of PCB design software, such as by allowing an entire bus of dozens or even hundreds of contacts to be routed from one chip to another en-masse. Once the connectivity has been specified, the routing program can calculate the configuration data (typically a bit-stream) that will program the programmable circuit board to connect the component contacts to power and ground and to interconnect them to each other. With many more paths between contacts than would be used in a typical system, and with signal integrity issues ameliorated by the embedded circuitry, this routing will typically be far faster than for a standard PCB of similar system-level complexity.

Of course in the prototyping of systems, small changes are frequent, so new components may have to be added or the connectivity changed. Preferred embodiments therefore comprise means to compare a new component map to a previous component map, and, if the similarity is high, to highlight only the differences, and to then allow the user to specify additional components within the areas identified as modified. If a single releasable attachment means is used to affix multiple components, small movements of components may be common as other components are added or removed, and software that automatically adjusts previously-specified interconnections for such minor movements is especially preferable.

Eighth Family of Preferred Embodiments

Mechanical Implementation

Even when components are permanently affixed to it, a reprogrammable circuit board retains considerable flexibility for modifying a system built with it. Additional components can be added if new requirements are added for the system to support, or if experiments using the prototype reveal that the initial set of components is not adequate for the tasks expected of it. Components can even be effectively 'removed' (even if they are physically still present) by re-routing the signals that interconnected them to the rest of the system. And with the signal integrity enhancements of the above preferred embodiments, components can even be 'replaced', whether due to defects or due to system redesign, by components added some distance away.

However there are still some limitations when components are permanently affixed to a reprogrammable circuit board; when a system is modified without physically rearranging the existing components, the modifications tend to result in longer signal paths, which are slower and consume more routing resources; scarce experimental components cannot be removed and re-used elsewhere, which also prevents the system from being used to test individual components; and the reprogrammable circuit board itself, which is not an inconsiderable cost for a full wafer-sized reprogrammable circuit board, cannot be reused for prototyping other systems. There is therefore a need for a reprogrammable circuit board that supports components being releasably affixed to its surface.

While components could simply be placed contact-side down upon the substrate surface, traditional attachment means such as solder balls and conductive adhesives do more than just touch the substrate contact; during the attachment process they are or become fluid, allowing them to spread out to achieve a larger area and to create a strong bond when they are cured, while remaining thick enough to bridge gaps up to a considerable fraction of their diameter. Such gaps can be caused by a non-planar part or substrate, which in turn can be caused by imperfect manufacturing or by post-manufacturing warping, and such gaps can be as high as tens of microns for a large packaged part. There are two families of techniques for handling such deviations from flatness, minimizing such deviations and accommodating such deviations; in addition hybrid solutions can reduce such deviations and provide some accommodation.

For minimizing deviations from flatness, in wafer-based embodiments of the programmable circuit board of the present invention, the substrate is a wafer that initially is flat to near atomic precision, and the reprogrammable circuit board can be purpose-built to maintain very high flatness. This can be accomplished by backing the wafer with a rigid planarized backing. To prevent temperature differentials from causing warping of the wafer, the material should be of high heat conductance. With a silicon wafer substrate more than half a millimeter thick providing high tensile and compressive strength parallel to the surface, a non-fragile, high thermal coefficient of conductivity, moderate thermal coefficient of expansion material like copper makes an ideal backing (copper has roughly twice the thermal conductivity of aluminum and half its expansion mismatch with silicon). A thermally conductive lubricant such as silicone grease can be used to allow the wafer to more readily slide against the flat backing, or a thin, hard, low-friction coating such as is used for machine tools can be added to the back of the wafer.

When a thinned silicon wafer is used for the substrate (to allow, for example, power and ground vias to more easily be implemented to allow thick back-side power planes), thermal mismatch should be minimized; a rigid backing made of silicon itself is preferred to provide a match while still maintaining high thermal conductivity (more than ⅓ that of copper and almost ⅔ that of aluminum). The backing silicon does not need to be wafer-grade, minimizing the cost. A thinned wafer could also be backed with a mechanical-grade silicon 'handle wafer' for mechanical strength (as is known in the art of wafer-thinning) after the power and ground planes have been added; in this case a copper backing would be preferred.

The rigid high-thermal-conductivity backing can act as a heat sink as well as a heat spreader. It can have fins affixed to it or machined into it to increase its surface area, it can have fans on it, or heat pipes, or any similar techniques as are known in the art of heat sinks. Although the programmable circuit board of the present invention is designed to maximize connectivity rather than power, variants designed to support numerous high-power components are possible; the backing could even have fluid channels in it for allowing a circulating chilled fluid to extract the heat produced, as is well known in the art of cooling high-power-density systems.

Figure 14A:
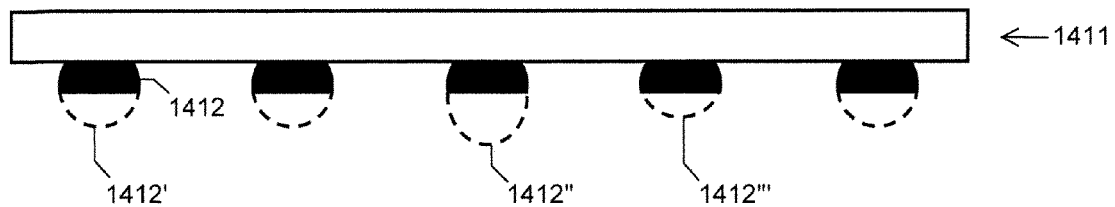
FIG. 14A is a depiction of the planarization of component contacts.

By pressing the flat substrate wafer against the flat heat-conductive backing to prevent warping, the substrate flatness can be maintained to a high degree. This leaves component contact flatness to deal with, and bare die components are likewise made with near-atomic flatness (this is a requirement for lithography since the depth of field for accurate focus is at most a few tens of nanometers across a whole reticle), so the issue of achieving flatness is largely one of contacts on packaged components. Packaged components can be prepared to increase contact co-planarity (flatness as a group) by procedures as simple as planarizing the contacts using an abrasive slurry, such as is done between lithographic steps in producing typical integrated circuits, commonly referred to as Chemical-Mechanical Planarization, or CMP. Abrading a spherical contact to approach the mid-point of the sphere also increases its contact area to approach the maximum cross-section of a sphere rather than the much smaller area of the 'tip' of a sphere (which, with a soft solder sphere or a gold bump, flattens somewhat under even modest pressure). As illustrated in FIG. 14A, component contact 1412" initially projects further from component 1411 than the other component contacts 1412' initially do, and the component contact 1412''' initially projects less far, but after planarization all component contacts 1412 project equally far from component 1411.

If the area between the contacts is filled for strength during planarization, at least the top micron of that fill should be removed afterward to allow the contacts to protrude somewhat, which is useful in ensuring that they will make good contact with the substrate.

While planarization markedly increases the flatness of the contacts and increases their contact area on a flat surface, the area increase is not as large as that achieved during permanent attachment. In embodiments of the present invention where the substrate contact density is high enough relative to the component contact spacing and size that at least one substrate contact will overlap each component contact anyway, this extra increase in area is not necessary to achieve overlap. It can, however, be useful in cases where a number of small substrate contacts will cooperate in driving a large component contact that needs a lot of current, such as a power contact, because a larger area allows more substrate contacts to participate. Although the component and substrate contact sizes discussed in the previous examples do not require this, if needed increasing both flatness and area could be achieved by flattening the contacts against a surface such as a Teflon-coated plate that has been machined flat, with the temperature set to where the solder will melt or the conductive adhesive will cure (and then, in the case of solder, lowered to where it again solidifies). In this way a component can have its contacts pre-shaped to match the shape that they would have if permanently affixed. Stand-offs can be used to prevent the component and the plate from approaching too closely, which would flatten the contacts so much that they would short together or have insufficient space between them; this also leaves the contacts projecting from the non-contact regions around them, which is useful in ensuring that good contact is made with the substrate.

Even with components and substrate planar to a fraction of a micron, minute gaps can still exist, or can open up as components heat up during use. Modest pressure applied to the back of a component is usually enough to force the contacts to make sufficient contact, however numerous enhancements to aid this are possible. Either the component contacts or more preferably the substrate contacts (or both) can have fine (1-micron) gold particles affixed; the particles under the tightest contacts will deform under even modest pressure to allow less-tight contacts to become tight. Tiny springs can also be formed on the substrate contacts as is done for wafer-probe cards; these are less practical for contacts in the tens of microns range, but for larger component contacts they can bridge significant gaps.

MEMS contacts are also possible, but these would be preferred only when MEMS are used within the programmable circuit board itself as otherwise this would require using additional types of technology, increasing manufacturing complexity. Passive NEMS can also be used to bridge any gaps; for example, with the low-temperature growth of carbon nanotubes having recently been developed, the substrate contacts could be coated with grains of a suitable catalyst (usually nickel or iron) and a springy field of nanotubes grown. Of the these embodiments, the gold-particle coated contacts are currently preferred because they are currently less expensive than nanotubes (although the cost of nanotubes might fall far enough to make this preferential in the future), and they are more robust relative to the moving around of components on the surface during system construction or modification than the other embodiments.

There is a trade-off between the pressure required and the robustness of the coating. If a dendrite coating is used, such as is described in the article "A Review of Electronic Packaging Research", then only little pressure need be applied; however the coating will be fragile and care must be taken to keep it clean and to carefully place and lift components, and the coating may periodically need to be replaced. If moderate pressure can be applied, then gold bumps roughly a micron in diameter can be used, and the surface will be less fragile.

Figure 14B:
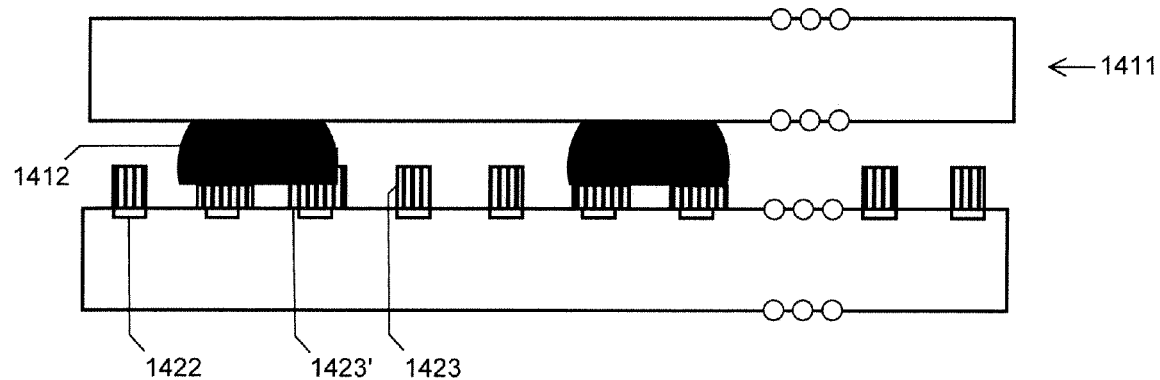
FIG. 14B is a depiction of abraded planar component contacts being pressed onto substrate contacts coated with a malleable conductor.
Figure 14C:
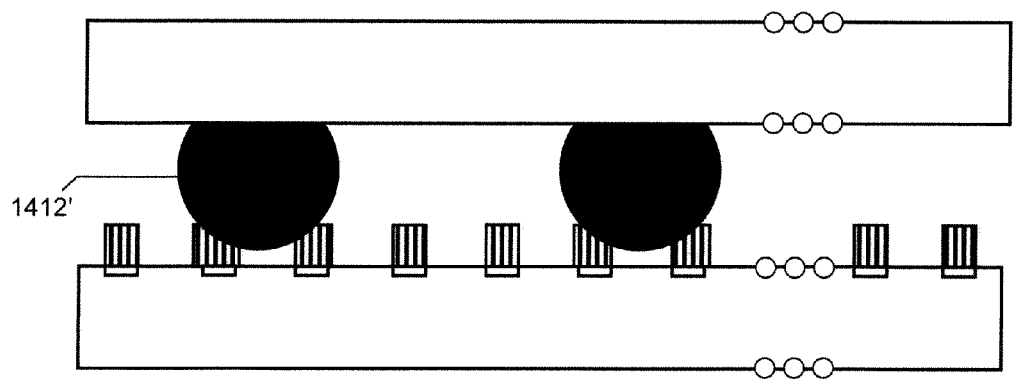
FIG. 14C is a depiction of un-abraded planar component contacts being pressed onto substrate contacts coated with a malleable conductor.

As illustrated in FIG. 14B, if high pressure can be applied, then the whole surfaces of substrate contacts 1422 can be coated with a few microns of gold 1423 and if the component contacts 1412 of component 1411 also project at least a few microns from the area surrounding them, then pressure will deform the gold 1423' under each component contact 1412 enough to establish a good connection. As illustrated in FIG. 14C, gold is malleable enough that good contact can be achieved even with round component contacts 1412'. Because this requires no modification of bumped component contacts other than ensuring that they are substantially coplanar, this is an especially preferred embodiment.

Embodiments can also use bridging means that are applied to the whole surface, rather than just to the contacts. Prime among these are z-axis conductors that conduct electricity only along the Z (vertical) axis, perpendicular to the flat surfaces; these conductors can thus bridge vertical gaps while not shorting adjacent contacts together. Perhaps the simplest Z-axis conductor is a nonconductive grease filled with silver particles. When pressure is applied, the grease flows from between the silver particles, allowing the particles to be pressed together to create a conductor. In such cases while it is desirable to have the component contacts be substantially flat, they should protrude significantly beyond the areas between the contacts so that that when the component is pressed onto the 'greased' surface, the contacts apply pressure first and most, creating the conductive regions only under the contacts. Thus while such a grease is not a true z-axis conductor on the scale of the conductive particles, in that it is either nonconductive or conducts in all directions, it is a z-axis conductor on the scale of the contacts because it is nonconductive except right under the contacts, and hence does not short contacts together. Other z-axis conductive 'greases' use a thinner grease with large particles so that individual particle bridge the gap; however these do not conform as well to difference in gap size, and hence are not preferable.

Z-axis conductors also come in films rather than greases; these consist of thin sheets with wires (or other conductors) embedded in them perpendicular to the plane of the sheet. The wires do not touch each other, and so a sheet does not conduct horizontally. Typically either the wires protrude slightly or the sheet is compressible so that when conductors are pressed to both side of a sheet, the wires make good contact to both conductors, thus electrically connecting them. With sufficiently compressible Z-axis films (compressible to approximate half the component contact diameter), sufficient contact can be made without component contact planarization because the contact tip will indent the film, allowing z-axis conductors beyond the tip to make contact.

Z-axis films are operationally preferential to greases when the component contacts are bigger than the Z-axis wire spacing because they do not have to be removed from between component contacts and reapplied when moving or replacing components. However z-axis greases can support finer contacts than films that the applicant is aware of being currently in production, and they are also currently less expensive; these are non-technical advantages that could be negated by advances in Z-axis film production, as Z-axis films produced by rolling and slicing lithographed sheets could produce films with a conductor density high enough for even the smallest contact sizes discussed in the above embodiments (and with consistent growth of vertical nanotubes having recently become practical, one could add a polymer matrix around these to produce a nanotube-based z-axes film with a conductor spacing on a few-nanometer scale). Z-axis greases and z-axis films are both readily replaceable, with z-axis films also providing a high degree of protection for the substrate surface. Compressible z-axis films are another especially preferred embodiment for used with spherical component contacts because no modification of the component contacts is required.

An alternative method for bridging the gaps is also possible. If a slightly compressible layer is provided behind a thinned wafer substrate, the substrate itself can flex enough to accommodate a few microns of deviation from flatness among component contacts. However to be flexible enough the wafer must be thinned to where it runs the danger of being mechanically compromised if it has a different thermal coefficient of expansion from its backing, thus requiring the use of a silicon or other thermal-coefficient-of-expansion-matched flat backing with a thin, slightly-flexible interposer such as a few microns of stiff foam. While this could provide excellent electrical contact to flat component contacts, it would be susceptible to being injured if a component were slid across it while being pressed down. Hence it is not preferred except where the excellence of the electrical contact is an overriding factor.

All of the above embodiments either require or work best with the component contacts being pressed firmly against either the substrate or an intervening conductive layer, which can be accomplished by using releasable means to apply pressure to the backs of the components. Such means can include clamps or springs that press on individual components, however these become impractical when numerous small components are used and also complicate the placing of additional components. In alignment-insensitive embodiments it is also not necessary to affix one component to prevent it from being disturbed while other components are being placed.

Preferred embodiments therefore use means that apply pressure to all components simultaneously. This can be accomplished by having a lid that presses on all components applied after all components are in place. Small thickness differences in component height can be accommodated with a foam lining in the lid; while most foams are of low thermal conductivity, which would interfere with cooling the components, for low-power components sufficient heat can be extracted through the substrate itself. Springs can also be used to apply pressure to thermally conductive 'pistons', as was done for chips in a 'thermal conduction module", or TCM, in IBM mainframes in the 1980s; this provides great thermal conduction and can accommodate significant differences in component height. Thermally conductive shims, such as rectangles of flat copper sheet, can also be used to even out component height, although this becomes impractical if huge numbers of small components differ in height.

Figure 15:
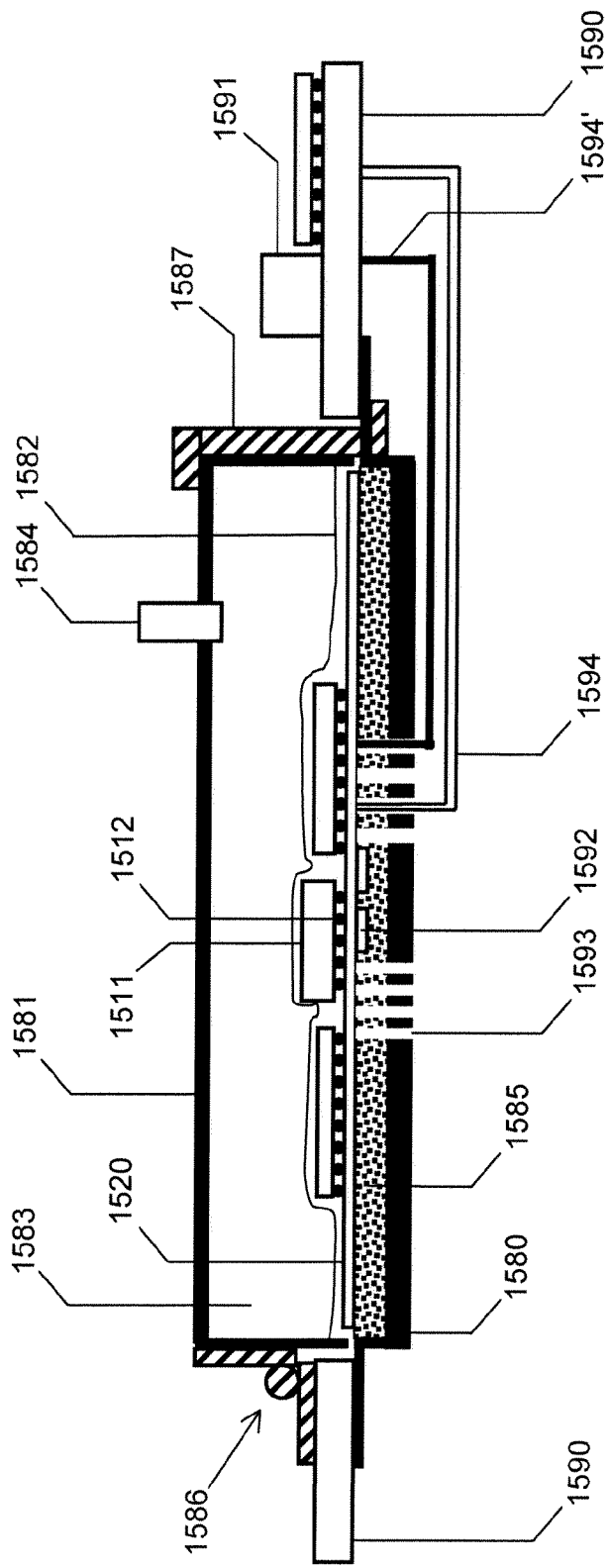
FIG. 15 is a depiction of a mechanical housing chamber and surrounding circuit board for a reprogrammable circuit board.

An especially preferred method, as illustrated in FIG. 15, is to have the programmable circuit board substrate wafer 1520 in a sturdy chamber base 1580 with a lid 1581 that contains a flat pouch 1582 of thermally conductive fluid 1583, such as a silicone oil or a thermal grease; this accommodates significant variations in the height of components 1511 while allowing adjustable downward pressure to be applied evenly (per component area) to all components 1511 simply by increasing the pressure in the pouch 1582. If a real-time overlap map or a real-time contact map is provided from the substrate, a user could even watch the map change, while increasing the pressure, until all contacts 1512 were secure. If the surface of the pouch 1582 has a thermal coefficient of expansion (TCE) lower than that of the substrate 1520 (which is unlikely as s the TCE silicon is very low at roughly three parts per million per degree Celsius, which is 20 to 50 times lower than most plastics), then the pouch 1582 can be made at least slightly stretchy so it can accommodate the thermal expansion of the silicon of the substrate 1520; if as is more likely its thermal expansion is higher than that of the substrate 1520, then the flexibility of the pouch 1582 should already be sufficient to accommodate any slack created through expansion during heating.

The tensile strength of silicon is high enough that considerable pressure can be applied while still allowing an unthinned silicon wafer substrate 1520 to slide against a flat backing 1585; a 500-micron thick 300-millimeter wafer has a cross-sectional area of 1.5 square centimeters, which at the 7000 newtons/cm$^2$ tensile strength of single-crystal silicon is over one ton. A lubricant with a coefficient of friction of 20% (a fairly good lubricant) between the backing 1585 and the substrate 1520 would thus accommodate a downward force of up to 5 tons on each half wafer, or over 10 atmospheres, while still allowing a non-TCE-matched backing 1585 for the substrate 1520 to be used. The backing can be an integral part of the chamber base, or it can be a separate material that carefully machined to the requisite flatness or that is TCE-matched to the substrate 1520.

Such high pressures can easily be applied even by hand because a plunger 1584 with an area of one square centimeter pushed with 100 Newtons (22 pounds) of force will supply that much pressure. With an essentially non-compressible fluid filling the pouch, a larger-diameter piston can be pushed or screwed onto/into the pouch first to quickly take up any 'slack' and establish a modicum of pressure, and a smaller plunger 1584 can be pushed or screwed in afterward to raise the pressure to level necessary.

Of course equal forces are also exerted against the lid 1581 and against the chamber base 1580 through the substrate 1520 and the backing 1585, so these need to be made strong enough to support significant force. Numerous suitable arrangements will occur to one familiar with mold-making. Preferred embodiments use means that are convenient to secure and release; ideally the lid is attached to the substrate backing with a sturdy hinge 1586 on one side and a sturdy releasable clamping mechanism 1587 on the at least the opposite side, much like a waffle iron. If really high (multi-atmosphere) pressures are used, such as for non-planarized components 1511, then clamps 1587 can be provided on all four sides (with or without a lighter-duty hinge on one side), or on three sides with a sturdy hinge 1586 on the fourth side. If more compactness is needed at high pressures, then bolts can be used. Of course higher polygons with more sides more closely approximate the shape of a circular wafer, so if a complete wafer is used, hexagonal or octagonal shapes for the chamber base 1580 are also preferential.

Power and ground must be supplied to the substrate inside its chamber, along with connectivity for signals. These can be done through components pressed against the substrate; however fundamental services like these can also be provided by components permanently affixed to the substrate near its periphery, eliminating the need to apply pressure to them and to have them have to be able to slide under pressure as the wafer expands and contracts due to heating and cooling (pressure will be applied only directly under the pressurized pouch, and permanently affixed components can be outside this area). In preferred embodiments basic services are provided through permanently affixed components, and if additional services are needed they can be supplied through additional components affixed through pressure. To keep the central region free for the system being prototyped or assembled, embodiments can use permanently affixed components that are near the edge of the substrate so that they can connect outside the housing without passing through a pressurized region. If the gap between the substrate 1520 and the lid 1581 at the edge of the pouch 1582 is held even to a relaxed one millimeter and the force applied is 10 atmospheres, the pressure per centimeter of circumference of the pouch 1582 is only 10 Newtons.

While power, ground and signals can all be passed into the housing and to the substrate through any number of means, today's most common signal types can all be carried through a circuit board. Therefore in preferred embodiments the permanently-affixed service components are connected to a circuit board that surrounds the programmable circuit board and extends beyond its housing. This surrounding PCB 1590 lets large standard service components such as power supplies 1591 to feed the power planes be placed on the surrounding PCB 1590 rather than inside the programmable circuit board chamber 1580. Ideally the surrounding PCB 1590 is firmly affixed to the chamber 1580 so that they can be handled as a single unit.

Connections between the programmable circuit board substrate 1520 and this surrounding PCB 1590 need to able to tolerate the difference in expansion between the two; typically the substrate 1520 will be hotter (since it and the affixed components 1511 are producers of heat and can only lose heat to the housing), and the surrounding PCB 1590 will have a higher TCE (since most PCB materials have TCEs much higher than silicon, and closer to that of copper or aluminum). Thus the effective difference in TCE will be somewhere between that of silicon and that of a PCB, and at a pessimistic 20 parts-per-million per degree and a 50 degree temperature rise, a 300-millimeter substrate 1520 will have its gap to the surrounding PCB 1590 change by ⅓ of one millimeter. Compressible standoffs would keep the substrate 1520 substantially centered relative to the surround PCB 1590, which would reduce this gap variance to less than 200 microns (⅕ of a millimeter) on each edge of the substrate 1520. While even this is too large for the loops of wire from a standard wire-bonder to accommodate, it is trivial for a flexible cable or a flexible PCB to accommodate, or even for a looped optical fiber to accommodate. Examples of how large numbers of such connections can be attached to a wafer without introducing their own TCE mismatch problems are taught by the present applicant in U.S. Pat. No. 6,879,170. Power connections can be through power planes of on the back of the programmable circuit board substrate that extended a few millimeters beyond the active areas.

If differential signaling and especially SerDes transceivers are used for data connections between the substrate wafer and the surrounding PCB, then the distance from the center of the wafer to the surrounding PCB can easily be traversed by high-speed signals; power and ground connections can also be conveyed over such distances merely by using thick conductors. If instead of placing added communication circuitry 1592 to drive a flexible PCB connection to the surrounding PCB 1590 on the edge of the front of the substrate 1520, it is concentrated in center of the back of the substrate 1520, then the entire front surface 1510 of the substrate can be free for system components 1511.

Centralization simplifies placing the communication circuitry 1592 on the back of the substrate 1520 because the effects of thermal expansion differences are proportional to the distance from the center of the substrate 1520. Thus a point 7 millimeters from the center will move only 5 microns relative to a copper backing 1585 under a 50 degrees Celsius temperature change, and a point even 15 millimeters away will move only 10 microns. Similar centralization is disclosed by the present applicant in U.S. patent application Ser. No. 10/330,234, which is hereby incorporated in its entirety by reference.

Bare-die communication circuitry components 1592 for driving high-speed signals can be permanently affixed near the center of the back of the substrate 1520, with corresponding sites of the appropriate thickness machined into the backing 1585, because even without sliding against the backing 1585 at all, a component adjacent to the center will experience no more thermal expansion mismatch than it would if affixed to a circuit board (which has roughly twice the coefficient mismatch compared to silicon that copper does).

Also near the center the backing 1580 can have numerous small holes 1593 for wire pairs 1594; a hole 1593 one millimeter in diameter can easily accommodate a differential pair 1593 that can carry a multi-gigabit-per-second SerDes signal with tens of microns left over to allow its contact on the substrate 1520 to move with the substrate 1520. With small holes 1593 in the backing 1585, the force of the applied pressure on the substrate 1520 bridging a hole 1593 is small and the substrate 1520 is closely supported on two sides by a very stiff wafer (substrate 1520) almost as thick as the diameter of the hole 1593 itself. Thus the pressure over the holes 1593 will not create any noticeable deviation from flatness in the programmable circuit board substrate 1520. The other ends of the differential pairs 1594 are preferably affixed to the surrounding PCB 1590 through releasable connectors to allow the pressure chamber 1580, the substrate wafer 1520 and the surrounding PCB 1590 all to be separable from one another for maintenance.

In addition to the numerous small holes 1593 for signal wire pairs 1594, the backing 1585 can have additional small holes for connections for power and ground. With a 700 micron copper power wire 1594' surrounded by 100 microns of insulation and a 50-micron gap in a one-millimeter hole 1593, each power wire 1594 can carry at least 10 Amperes without overheating. Thus a few dozen power wires 1594' wires could carry 50 Amperes for each of six power and ground planes.

FIG. 15 is an illustration; the horizontal dimension of the substrate has been greatly reduced to fit on a page; a 300-millimeter wafer for substrate 1520 would be around 500 times as wide as it is thick. Also, only one pair of signal wires 1594 and one power wire 1594' have been shown, and the holes 1593 on the right of the center of the substrate have been enlarged so that it can be seen that the wires 1594 and 1594' pass through them.

A plane like analog ground is unlikely to need more that a few amperes and the digital ground will almost certainly carry the most current, and the voltage that each power plane carries will not be predefined. Therefore a distribution like 95 Amperes for the first (expected to be digital) ground plane, 80, 60, 40 and 20 Amperes respectively for the power planes, and 5 Amperes for the second (analog) ground plane would offer more flexibility that having all panes be 50 Amperes.

If an embodiment needs much more connectivity through the backing, then radial slots in the backing can allows strips, such as flexible PCBs, to pass through the backing. As the expansion and contraction of the substrate relative to the backing will itself be largely radial, the slots can be as narrow as the holes in the examples above, which minimizes the deflection of the substrate due to the applied pressure across the slot, and can provide hundreds of microns of extra slot length to accommodate the differential expansion even at the substrate periphery.

In preferred embodiments signal communication between the substrate and the surrounding PCB is through high-speed serial signals as this minimizes the number of connections needed. The drivers on the substrate side can be SerDes-enabled FPGAs for flexibility, or fixed-function SerDes components can be used for more compactness. When a standard SerDes protocol (such as PCI-express or XAUI) is used, the signals can be routed through the flexible PCB to the surrounding PCB and through the surrounding PCB to a standard connector; this lets the system be connected to the world outside the surrounding PCB with as few components as possible via those standard connectors. Alternatively the surrounding PCB can have components for receiving the signals from the programmable circuit board; for maximum flexibility in system prototyping these would include typically useful chips like memory and a CPLD for assisting with powering up the surrounding PCB and through it the system, and FPGAs which would be connected to a variety of standard connectors; however connections could be made to the standard connectors through non-programmable components as well. In the surrounding PCB, these connectors can even be through-hole mounted for mechanical strength.

In exceptionally preferred embodiments, a variety of standard connectors, such as PCI-express, 10-gigabit Ethernet or Snap-12 parallel optics for high-speed data transfers and USB, FireWire, or memory card interfaces (or even wireless interfaces such as WiFi) for connection convenience (to a configuration device, for example) are included on the surrounding PCB, along with connectors specific to debugging, such as logic analyzer connectors (with releasable attachment means these are now best moved from the programmable substrate to the surrounding PCB because they are much thicker in use than most components and because on the surrounding PCB a logic analyzer can be hooked up or unhooked without open the pressurized housing).

Using more than one circuit board for the surrounding PCB is especially preferred because it provides increased modularity; all such surrounding PCBs would preferably be securely but releasably attached to the substrate backing, such as with bolts, to allow the whole complex to be moved as a single unit. As shown in FIG. 16B, even further preferred embodiments have the high-speed connectors mateable between multiple surrounding PCB cards to allow rows or even two-dimensional or three-dimensional arrays of these programmable circuit boards units to be conveniently assembled and interlinked by high-performance data paths.

While in general a full-wafer substrate will provide the most flexibility for prototyping a system, smaller substrates can provide sufficient flexibility for many uses as well as a more convenient form factor for some uses. For example, if the whole surrounding PCB is implemented on a card that fits in a full-length PCI-express slot, there is room for the service components on that card plus a reprogrammable circuit board region. Optimal region sizes would be convenient from both wafer-use efficiency and for matching a standard form-factor PCB; for example, an approximately 3"×7" rectangle cut from the central section of an 8-inch wafer, giving 13,550 square millimeters of programmable circuit board area, or one of multiple similar-sized regions cut from a 12-inch wafer, and fitting on a card in the PCI-express slot form factor. These small rectangular regions can be connected to the surrounding PCB through a peripheral "trim" of flex-PCB driven directly by the programmable circuit board substrate's signal contacts (to minimize the signal distance for parallel signals), or through a centralized signal and power region on the back of the substrate.

Figure 16A:
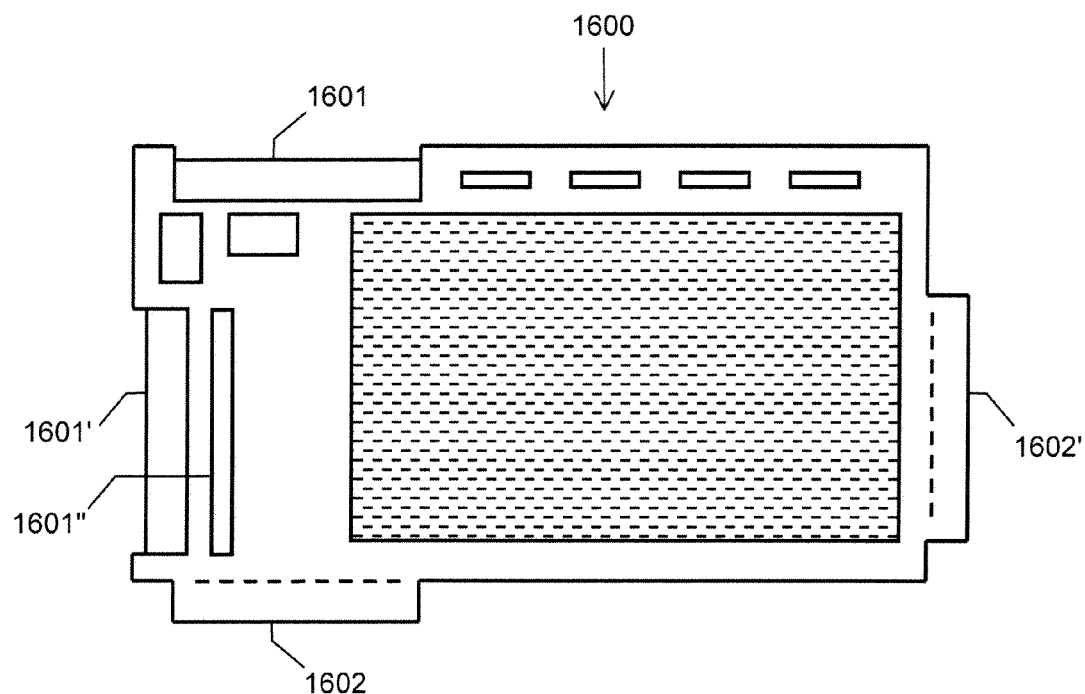
FIG. 16A is a depiction of a reprogrammable circuit board with a surrounding PCB that can fit in a standard PCI-express slot in a computer, or can mate with other surrounding PCBs.
Figure 16B:
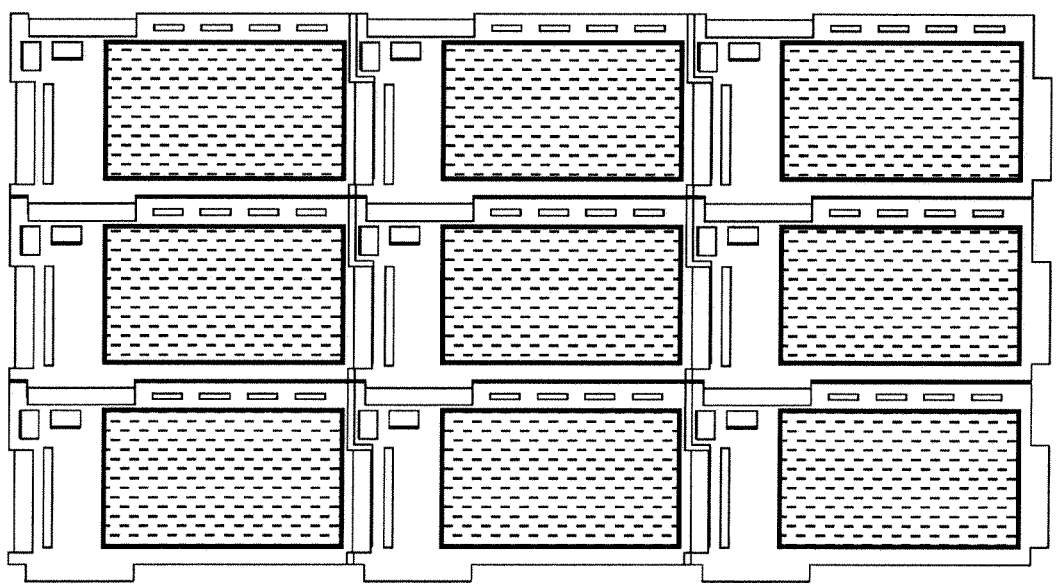
FIG. 16B is a depiction of reprogrammable circuit boards with surrounding PCBs mated into a two-dimensional array.

As shown in FIG. 16A, with this smaller area the unit, including the surrounding PCB and the programmable circuit board housing, fits in a PCI-express card form factor. The unit can be made thin enough to fit in a PCI-express slot, allowing a newly assembled test system to be placed inside a PCI-express-based computer for convenient testing or use. PCI-express card 1600 has two female PCI-express connectors 1601 and 1601' and two male PCI-express connectors 1602 and 1602'; as shown in FIG. 16B careful design of the connector placement allows a PCI-express card form factor to be compatible with linking multiple such cards together outside of a PCI-express-based computer.

Figure 16C:
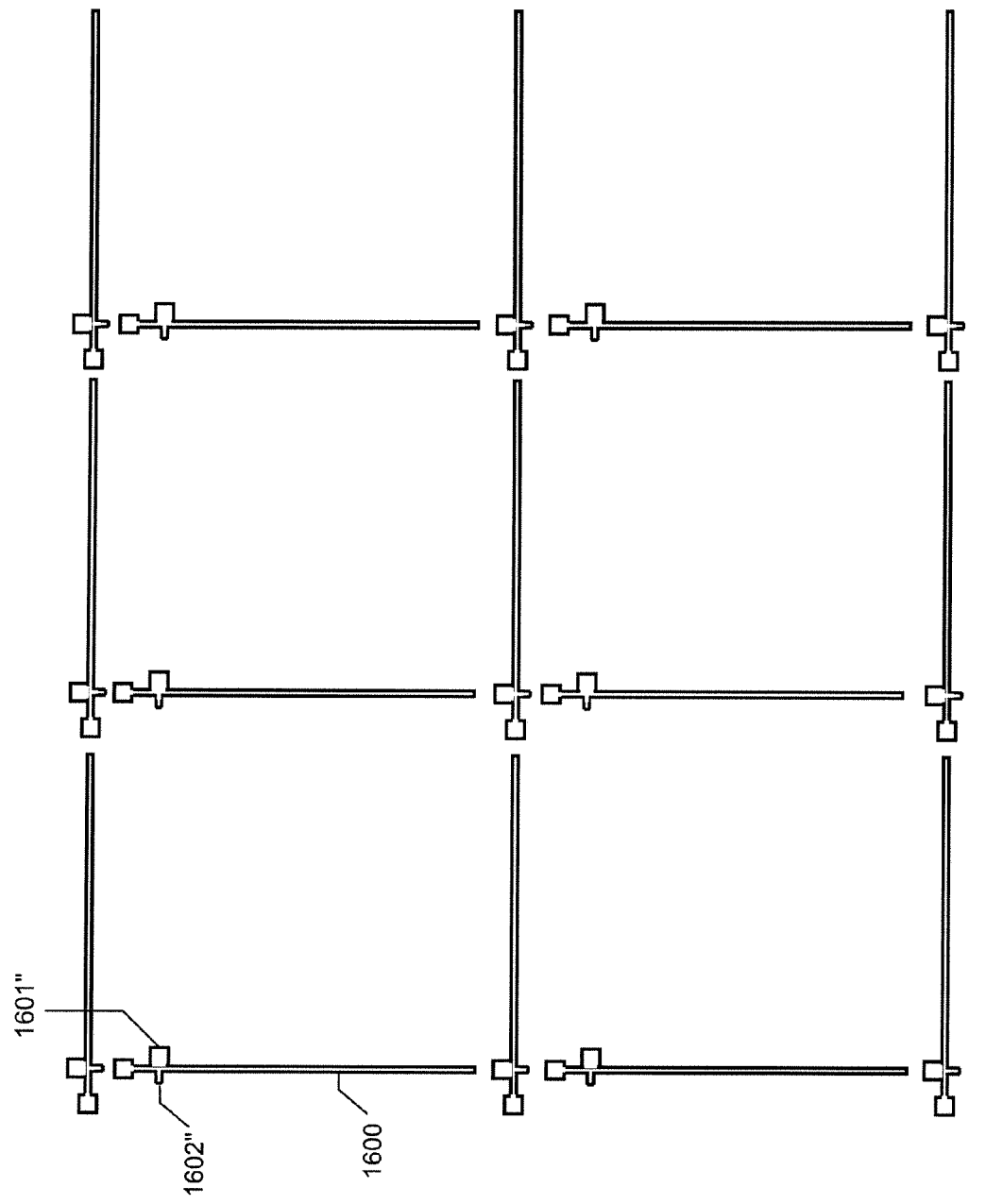
FIG. 16C is a depiction of reprogrammable circuit boards with surrounding PCBs mated into a three-dimensional array.

A third female PCI-express connector 1601" on the top face of the surrounding PCB (shown narrower in FIG. 16A and FIG. 16B because it is seen edge-on) and a third male PCI-express connector on the bottom face of the surrounding PCB (not shown in FIG. 16A or FIG. 16B) will, as shown in end-view in FIG. 16C, allow such PCI-express cards 1600 to also act as vertical bridges between multiple layer of PCI-express cards 1600 by plugging into the female PCI-express connectors 1601" on the layer below them and having male PCI-express connectors 1602" from the layer above plug into their female PCI-express connectors. This allows three-dimensional arrays to be created that have sufficient spacing for forced-air cooling. For clarity the PCBs 1600 in FIG. 16C are shown slightly spaced apart with connectors lined up rather than mated.

A programmable circuit board that can establish connections between contacts of hand-placed components affixed with hand-operated attachment means, and that can use a surrounding PCB that has a standard computer peripheral card format such as PCI-express, is an exemplary embodiment because it allows a system designer to assemble a system by hand and insert it into a standard workstation or even a personal computer that can extract the overlap map, run the contact mapping, component recognition and circuit-board routing programs, download the internal configuration to the programmable circuit board, and then download information (including programs) to the prototype system to test it, exporting test results to the workstation. If the programmable circuit board is reprogrammable and uses releasable attachment means, the system designer can copy signals sent between components and export the copy to debug software running on the workstation, and can repeatedly modify and re-test the prototype. This speeds up the development cycle many fold, especially for complex systems.

Ninth Family of Preferred Embodiments

Test Probe Cards

Because of the possibility of defects within a component and the cost of detecting and locating a defect once a component is installed in a system, and the further cost of replacing defective components if they are non-releasably attached in a system, components are generally tested before they are used. With releasable attachment means, components powered up and connected to on the programmable circuit board of the present invention can be tested, removed, and those components passing the tests can then be used elsewhere. Releasable attachment therefore lets the programmable circuit board of the present invention be used for testing components that are to be used on other substrates.

For experimental components, such as those produced on multi-project wafers where typically a few to a few dozen samples of a component are produced, using the programmable circuit board for testing is advantageous even with packaged components to be used in other systems because allows testing without incurring the cost of a dedicated test board with releasable sockets for the components to be tested. For testing components it is best not to have to alter the components at all, but the alterations taught above for packaged components are not insurmountable. When the components contacts are solder balls that have been flattened, the components will be useable without further modification, as using stand-offs during flattening can ensure that sufficient solder thickness is maintained. Cured conductive adhesive contacts cannot be 'uncured', but even here it will be possible to add an additional blob of uncured adhesive on the bottom of each cured, flattened contact; these can then bond permanently to their final substrate while being raised only slightly more from the substrate than they otherwise would have been, which will be acceptable in most uses, and sanding down the cured blobs before adding more adhesive would recreate the original height.

However for large-volume parts, testing is preferentially done on bare dies to avoid packaging costs for defective components and to be able to provide known-good dies for high-density systems. Here the components are unaltered in being releasably affixed to the programmable circuit board of the present invention, so subsequently using them in a final system is straightforward.

Testing is also increasingly being done at the wafer level to avoid handling the dies individually during testing. Components typically include test circuitry that allows testing for common speed-independent defects, such as when a shorted contact or missing metalization creates a logic gate or a memory cell or that is stuck on or off. This information is usually gathered by a 'scan chain' and exported to the external tester through a narrow JTAG port to allow initial testing to be performed before dicing a wafer, so that packaging of components with easily detectable defects can be avoided.

However other defects do not manifest themselves until during or after a prolonged burn-in period where the features of the component are thoroughly exercised. These includes defects such as thin spots in wiring that get hotter and thinner over time until they blow like a fuse, or the opposite defects where current leaking through an insulator breaks down that insulator, allowing more and more current to flow. In addition, at the leading edge where the packing of internal features pushes the limits, subtle interactions between signals can produce signal integrity problems that only manifest themselves under extremely specific sets of circumstances, typically including running the circuit at its maximum speed.

With a 300-millimeter wafer having up to several hundred thousand contacts, with these typically in a unique pattern of power, ground and signal contacts for each type of component, full-speed burn-in on a full wafer has required an extremely complex custom adapter for each type of component to be tested. There is thus a need for a wafer-sized programmable adapter that can adapt to the unique contact patterns of a wide variety of component types, and preferentially a reprogrammable adapter that can be used for a wafer of a given component type and then reprogrammed for a wafer of another component type.

For testing 200-millimeter wafers, the above reprogrammable embodiments of the programmable circuit board of the present invention can fill this need for wafer-level testing of typical wafers of typical components with either peripheral signals or centralized signals from the substrate wafer because a 300-millimeter wafer-based programmable circuit board can have the central 200-millimeter region reserved for receiving a wafer to be tested while leaving the periphery, with over half of the total area, free for releasably and/or permanently affixed components. The affixed peripheral components can include a tester channel interface and a processor and memory operable to run configuration software to program the reprogrammable circuit board to connect first one component or set of components on the test wafer to the tester channel, and then to connect another component or set of components on the test wafer to the tester channel. Preferentially the union of the sets of components includes all components on the test wafer, so that all components on the test wafer can be tested without moving the test wafer. Alternatively, the peripheral components affixed to the programmable circuit board can simply connect the programmable circuit board to a surrounding PCB that either has the requisite processor, memory and tester channel connector or that in turn connects to one or more of these resources through its standard connectors. For testing 300-millimeter wafers, the centralized services on the back of the wafer is clearly preferred because it leaves the entire front surface free, matching the size of the wafer to be tested.

There is a trade-off between putting circuitry on the programmable circuit board substrate wafer to handle functions locally and thereby reduce the connectivity needed to the tester, which creates a more-specific wafer (and, when this circuitry is on the back of the wafer, a more complex machined backing), and putting more of the these functions on the surrounding PCB, which requires more connections between the programmable circuit board and the surrounding PCB. However the substrate itself is capable of containing circuitry, and by adding suitable simple repetitive circuitry to the substrate, the benefits of local circuitry can be obtained with little or no added circuitry on the backside of the substrate. In fact the simplest useful type of circuitry to have, signal integrity enhancement circuitry close to each component contact, is already provided for in previously described embodiments of the present invention.

The most important additional circuitry to incorporate can be discovered by studying the shortcomings of today's probe cards that use custom adapters. These can include attached circuitry capable of handling simple tests such as power integrity and reading scan chains that need few contacts (see U.S. Patent Application Document Number 2005/0237073). However more complex at-speed testing, which would require connecting to all of the wide address, data and other signal busses of all the chips on a wafer, would exceed the capacity of circuitry attached to a probe card even with arranging such circuitry out of the plane of the card (as taught in U.S. Pat. No. 6,853,206). Thus such tests have been typically run on one chip at a time, and at most a few chips at a time, per tester channel, which monopolizes time on an expensive channel on an even more expensive tester.

While providing identical signal inputs to multiple chips can already be handled by configuring multiple cross-points in each cell to include a given input of each test component into a multicast group (as is well known in the art of network equipment using cross-bar switch fabrics), the outputs must be individually checked because variances may occur and these variances are important to detect if they do occur (or there would be no point in testing the chips). Especially preferred embodiments of the present invention for complex at-speed testing of many components in parallel therefore include circuitry to perform tests on the output signals that allow the output data to the tester to be reduced without reducing the ability to detect defective components.

Because the vast majority of components pass the vast majority of tests, comparing the results of a given test to an expected value and only reporting comparison failures is sufficient to greatly reduce the volume of data reported to the tester. If the tester is not capable of handling exception-only data, then the reduced volume of data can be exported to the surrounding PCB, which can translate the data to the most efficient format that the tester understands, or may accumulate the data and provide a pass/fail summary directly to the subsequent component processing steps. In particular, the tester may send test data for one test component or one set of test components, and the programmable circuit board and/or a surrounding PCB may replicate that data across multiple components or sets of components, and may then compare the results to known-good results to identify defects independently of the tester.

Since the test results from most components will be identical and identical results will essentially always be correct results (because different defects will be extremely unlikely to produce identical results), the correct results can be inferred even when the tester is not operable to share the expected results across its tester channel. The surrounding PCB can simply receive each test once and send it each of the test components or sets of components, and establish identical results received from the majority of these test components as the correct answer, with any component not answering all tests identically with the majority being flagged as defective. Having the surrounding PCB send each received test multiple times frees up the expensive tester and its test channel, and would even allow the tester functionality to be incorporated onto the surrounding PCB.

Massive amounts of data must still cross the connection between the programmable circuit board and the surrounding PCB. However each substrate contact that receives data from a test component also has the ability to receive data from elsewhere in the programmable circuit board (the data that it would send to the test component contact if were sending data to the test component rather than receive data from it), and each substrate unit cell can be provided with a simple comparison circuit that compares a datum received from a component contact with one received from the internal interconnection network. Whether a 'correct answer' is known before the start of a test or it is inferred from sending a test to a few components, the 'correct answer' for a given component output can be multicast to the set of cells that receive that output for all of the components under test. Since this can be done in parallel for all cells that receive component output, and can be done as fast as tests can be run, testing can be performed at full speed and each cell can perform its own comparison and report back only when its component has failed a test. Reporting only failures will greatly reduce traffic on the connection between the programmable circuit board and the surrounding PCB.

Each cell can also accumulate its testing result across a number of bits received and when queried report whether or not a failure has occurred. This allows extensive sets of tests to be run on all components with only one copy of the tests and one copy of the results sent into the programmable circuit board substrate, and only failures for sets of tests (rather than for each individual test) reported back. The speed that this allows is especially useful in running tests multiple times for speed binning, where a set of tests is run several times at increasing speeds, with the maximum speed at which a given component passes all tests determining into which speed bin it belongs. This efficiency in testing is also useful when test components that do not pass all standard tests have multiple other tests run against them to see if they are useful for other purposes, such as is done with some FPGAs to provide for specific uses parts that might not pass for general use.

An alternative to sending in a set of answers for each test is to have the cells locally infer the answers by comparisons with their neighbors. Since each input from a component contact is routable to anywhere within the programmable circuit board, the configuration software can establish an interconnection from each cell receiving a component input from a plurality of other cells that receive a comparable input from a different component. Preferably at least three neighbors are used so that for any given bit, the match can be made against a majority consensus of the neighbors. Comparison circuitry is very small, so several neighbors can be compared per square micron of circuitry added (per cell) in the 90-nanometer process used in previous examples.

Exemplary embodiments of the present invention for complex at-speed testing of many components in parallel therefore include circuitry within the wafer probe card substrate to perform tests on the output signals that allow the output data to the tester to be reduced without reducing the ability to detect defective components.

A variation of testing and packaging called wafer-scale or wafer-level packaging has also been introduced in the industry, and is gaining favor for compact components that require chip-scale packages. In wafer-level packaging, an entire wafer of components is encased in a protective shell, usually of a glass-like material, with metallic conductive regions embedded to allow electrical contacts to be made through the protective package. Components encapsulated through wafer-level packaging are singulated into components in 'chip-scale packages' after testing, and testing can be done either before or after wafer encapsulation. Before-encapsulation testing is handled just as with other wafers; after-encapsulation testing can be handled just as if it were a bumped flip-chip wafer, preferably using a Z-axis film to preserve its contacts unaltered as previously described.

Numerous other variations will be obvious to one familiar in the relevant art. While 90-nanometer silicon semiconductor CMOS lithography with conductive connections has been used in the examples, other semiconductors such as Gallium Arsenide or Indium Phosphide could be used (it would be obvious, for example, that as these are more fragile substrates, variations that involve lower pressure and/or TCE-matched backings would become more preferable); other circuit styles such as bipolar could be used (although most of these consume more power, which would make cooling a dominant issue); other lithographic nodes could be used (for example a much coarser lithography could still support packaged components with various contacts spacings, at a significantly lower cost than 90-nanometer lithography, and the techniques taught will be likely to be applicable for many more-advanced process nodes to come) and variations for capacitive or inductively coupled connections or even optical connections are possible.

Also, while the embodiments use wafer-based crystalline silicon as a substrate, micro-crystalline, polycrystalline or amorphous silicon or even organic semiconductors could be used, trading the high density and speed achievable with crystalline silicon for the large area and low cost per area achievable with these other substrates. Such large-area substrates could also have circuitry lithographed or printed in a continuous process for exceptionally low cost, as is described in a pending U.S. application, publication number 2004/0255096, by the present applicant.

The physical form factors presented are also meant to be illustrative rather than limiting examples; for example while a PCI-express card format and connectors are used, Advanced-Mezzanine Card (AMC) connectors would also provide great interoperability with a 4× higher signal speed than PCI-express and standards such as compact PCI and VME would provide not-unreasonable alternatives. Similarly the surrounding PCB or PCBs, the connections to them and the connectors on them are non-limiting examples, and innumerable combinations of components and connectors permanently and releasably affixed to the programmable circuit board are possible.

The means for powering the programmable circuit board and the components from it are also illustrative; for example power could be provided to contacts spread around the top surface or the bottom surface through flexible means such as in the aforementioned U.S. Pat. No. 6,879,170 by the present applicant. Also, the numbers of power and ground planes are a representative example; clearly more planes could be added or fewer provided with little effect on the system architecture and only a modest effect on the density achievable at any given process node.

The pressures used are also examples; in most case 10 atmospheres for pressing components to a substrate would be far more than necessary; however if more pressure were needed for some unusual contact type, a TCE-matched backing would allow many times that pressure to be applied. Also the pressurizing method used is a non-limiting example; there are other ways to apply high pressure to a substantially non-elastic cavity filled with a substantially non-compressible fluid by hand, such as is used in a hydraulic car jack, and numerous non-manual means are also contemplated. Heat-sink configurations that provide high mechanical strength and high heat removal in a small space have also not been discussed in detail, however a heat sink with a thick top and bottom plates with rows of fins or posts welded, soldered or brazed to both plates will combine very high strength and rigidity while allowing high cooling from a fan directing air across this configuration, as would be supplied in a PCI-express or other similar slot.

The examples of internal functions of the programmable circuit board are also meant to be non-limiting. For example, other signal integrity enhancements, other clocking distributions, and other interconnect architectures are all possible. For adapting to fixed contact spacings, the examples of spacing used are also meant top be illustrative rather than limiting, and for adapting to unknown contact spacings, it is considered obvious that a finer lithography will allow adapting to finer component contact spacings.

The combinations of examples and embodiments discussed are also meant to be non-limiting, as there are more useful combinations than it is practical to cover. For example, some features used in examples and embodiments for reprogrammable circuit boards are applicable to one-time programmable circuit boards, and even to fixed-function PCBs.

Even these examples of examples is meant to be illustrative rather than limiting, and numerous minor variations, especially in trading generality for features for specific purposes, will suggest themselves to those familiar with the relevant art. Also, any unused space on the substrate can be absorbed by any number of potentially useful features, especially in embodiments that do not press the limits of the circuit area for each cell; for example, if only 50% of the cell area were used in a 90 nanometer process for a subset of the features described above, then filling the remainder of the area with 6-transistor SRAM would provide multiple gigabytes of fast memory SRAM memory to any system built on a whole such wafer. However since there are enormous number of variations on what could be added to soak up space, no attempt to illustrate examples has been made, other than the SRAM example above that illustrates the magnitude of the resources that could be provided.

Figure 17:
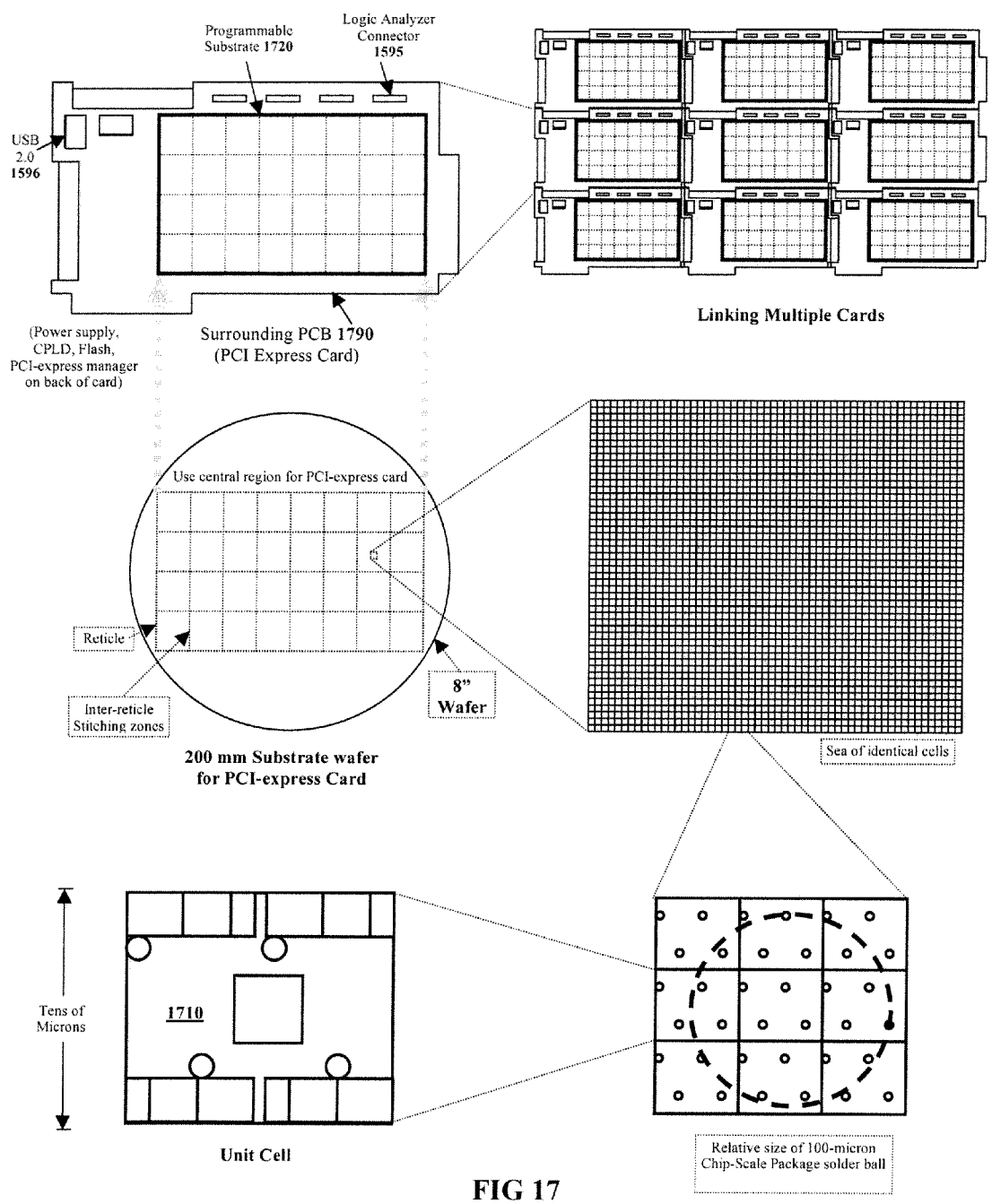
FIG. 17 is an illustration of the relative scale of a single unit cell to a system with multiple programmable circuit boards.

FIG. 17 is a high-level visual guide to the nesting of features described in the present application, using an example unit cell 1710 repeated to form the wafer-based substrate 1720 of a programmable circuit board. The programmable circuit board in this example uses a surrounding PCB 1790 in a PCI-express card format with extra PCI-express connectors for linking multiple such programmable PCBs when not used in a PCI-express slot. Examples of connectors useful for standalone use are also shown, including Logic Analyzer connector 1795 for assisting in debugging, and USB 2.0 connector 1796 for convenient configuration and other communication with the outside world. Other features that are shown in more detail in other drawings are not discussed here.

What is claimed is:

1. A substrate on which a plurality of components can be affixed, wherein the substrate can be electronically programmed to establish signal-conducting interconnections between specified component contacts without having those interconnections pass through programmable interconnection components affixed to said substrate, wherein said substrate has signal amplifiers or signal repeaters embedded in it and wherein said substrate can also be electronically programmed to establish power-conducting paths to specified component contacts, capable of delivering a current of greater than 100 milliamperes to each such power contact.

2. A substrate as claimed in claim 1, where the maximum signal-conducting path length between a signal contact of an affixed component and the nearest amplifier or repeater on the signal-conducting path within said substrate is at most one centimeter.

3. A substrate as claimed in claim 2, where the maximum signal-conducting path length between a signal contact of an affixed component and the nearest amplifier or repeater on the signal-conducting path within said substrate is at most one millimeter.

4. A substrate as claimed in claim 1, where said substrate also has retiming circuitry embedded in it.

5. A substrate as claimed in claim 4, where the maximum signal-conducting path length between a signal contact of an affixed component and the nearest retiming circuitry on the signal-conducting path within said substrate is at most one centimeter.

6. A substrate as claimed in claim 5, where the maximum signal-conducting path length between a signal contact of an affixed component and the nearest retiming circuitry on the signal-conducting path within said substrate is at most one millimeter.

7. A substrate as claimed in claim 1, wherein said signal conducting interconnections are programmed through a series of cross points in a network of cross bars.

8. A substrate as claimed in claim 7, wherein said network of cross bars is arranged in a continuous mesh of interconnections of at least two physical dimensions and at least 6 logical dimensions projected onto said at least two physical dimensions.

9. A substrate as claimed in claim 8, wherein said continuous mesh of interconnections comprises at least 14 logical dimensions, and wherein the cross-bar to cross-bar distance spanned by a given connection in each successively higher logical dimension projected onto a given physical dimension is twice the cross-bar to cross-bar distance spanned by the next highest dimension projected onto said given physical dimension.

10. A substrate as claimed in claim 9, wherein some of the cross-bar to cross-bar connections in the highest logical dimension projected onto a given physical dimension are replaced by a connection to a nearest neighbor in that physical dimension.

11. A substrate as claimed in claim 7, wherein said network of cross bars is arranged in a Beneš network wherein the central stage of the Beneš network has a lower fan-out than the leaf stages of said Beneš network.

12. A substrate as claimed in claim 11, wherein at least the three most central stages of the Beneš network have a fan-out of 2.

13. A substrate as claimed in claim 12, wherein the leaf stages of the Beneš network have a fan-out of at least 8.

14. A substrate on which a plurality of components can be affixed, wherein the substrate has signal-conducting interconnections establish between specified component contacts without having those interconnections pass through other components affixed to said substrate, wherein said substrate has signal amplifiers or signal repeaters embedded in it.

15. A substrate as claimed in claim 14, where the maximum signal-conducting path length between a signal contact of an affixed component and the nearest amplifier or repeater on the signal-conducting path within said substrate is at most one centimeter.

16. A substrate as claimed in claim 15, where the maximum signal-conducting path length between a signal contact of an affixed component and the nearest amplifier or repeater on the signal-conducting path within said substrate is at most one millimeter.

17. A substrate as claimed in claim 14, where said substrate also has retiming circuitry embedded in it.

18. A substrate as claimed in claim 17, where the maximum signal-conducting path length between a signal contact of an affixed component and the nearest retiming circuitry on the signal-conducting path within said substrate is at most one centimeter.

19. A substrate as claimed in claim 18, where the maximum signal-conducting path length between a signal contact of an affixed component and the nearest retiming circuitry on the signal-conducting path within said substrate is at most one millimeter.

* * * * *